(12) United States Patent
Kubota et al.

(10) Patent No.: US 12,727,362 B2
(45) Date of Patent: Sep. 1, 2026

(54) LIGHT-EMITTING DISPLAY APPARATUS WITH SENSORS

(71) Applicant: Semiconductor Energy Laboratory Co., Ltd., Atsugi (JP)

(72) Inventors: Daisuke Kubota, Atsugi (JP); Ryo Hatsumi, Hadano (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 360 days.

(21) Appl. No.: 18/273,079

(22) PCT Filed: Jan. 17, 2022

(86) PCT No.: PCT/IB2022/050336
§ 371 (c)(1),
(2) Date: Jul. 19, 2023

(87) PCT Pub. No.: WO2022/162492
PCT Pub. Date: Aug. 4, 2022

(65) Prior Publication Data

US 2024/0090248 A1 Mar. 14, 2024

(30) Foreign Application Priority Data

Jan. 28, 2021 (JP) ................................ 2021-012188

(51) Int. Cl.
*H10K 59/65* (2023.01)
*H10K 39/34* (2023.01)
(Continued)

(52) U.S. Cl.
CPC ............. *H10K 59/65* (2023.02); *H10K 39/34* (2023.02); *H10K 59/122* (2023.02); *H10K 59/353* (2023.02)

(58) Field of Classification Search
CPC ...... H10K 59/353; H10K 59/65; H10K 39/34; H10K 59/122
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 107785400 A 3/2018
CN 108494909 A 9/2018
(Continued)

OTHER PUBLICATIONS

International Search Report (Application No. PCT/IB2022/050336) Dated Apr. 5, 2022.
(Continued)

*Primary Examiner* — Suberr L Chi
(74) *Attorney, Agent, or Firm* — Eric J. Robinson; Robinson Intellectual Property Law Office, P.C.

(57) ABSTRACT

A display apparatus having both a personal authentication function and a high resolution is provided. The display apparatus includes a display portion and a sensor portion. The display portion includes a first light-emitting element and a second light-emitting element. The first light-emitting element includes a first EL layer. The second light-emitting element includes a second EL layer. The sensor portion includes a light-receiving element. The first light-emitting element has a function of emitting infrared light. The light-receiving element has a function of detecting infrared light. A distance between the first EL layer and the second EL layer is less than or equal to 6 μm.

7 Claims, 23 Drawing Sheets

(51) Int. Cl.
*H10K 59/122* (2023.01)
*H10K 59/35* (2023.01)

(56) References Cited

U.S. PATENT DOCUMENTS

| | | | | |
|---|---|---|---|---|
| 6,617,186 | B2 | 9/2003 | Kashiwabara | |
| 7,220,998 | B2 | 5/2007 | Kashiwabara | |
| 7,399,991 | B2 | 7/2008 | Seo et al. | |
| 7,615,388 | B2 | 11/2009 | Kashiwabara | |
| 7,663,149 | B2 | 2/2010 | Seo et al. | |
| 8,021,203 | B2 | 9/2011 | Kashiwabara | |
| 9,058,511 | B2 | 6/2015 | Chou | |
| 9,298,317 | B2 | 3/2016 | Chou | |
| 9,322,862 | B2 | 4/2016 | Chou et al. | |
| 10,388,706 | B2 | 8/2019 | Lee et al. | |
| 10,978,523 | B2 | 4/2021 | Park et al. | |
| 10,985,220 | B2 | 4/2021 | Lee et al. | |
| 2002/0072139 | A1 | 6/2002 | Kashiwabara | |
| 2008/0074401 | A1* | 3/2008 | Chung | G02F 1/1368 345/175 |
| 2011/0148290 | A1 | 6/2011 | Oota | |
| 2012/0105341 | A1 | 5/2012 | Park et al. | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2014/0056493 | A1 | 2/2014 | Gozzini | |
| 2014/0168121 | A1 | 6/2014 | Chou | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2015/0233989 | A1 | 8/2015 | Chou | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2018/0277033 | A1 | 9/2018 | Jia et al. | |
| 2019/0280058 | A1 | 9/2019 | Li | |
| 2020/0111851 | A1 | 4/2020 | Park et al. | |
| 2020/0203662 | A1 | 6/2020 | Mollard et al. | |
| 2020/0387686 | A1 | 12/2020 | Jhang et al. | |
| 2021/0232796 | A1 | 7/2021 | Liu | |
| 2021/0257420 | A1 | 8/2021 | Park et al. | |
| 2022/0059619 | A1* | 2/2022 | Kubota | G06V 40/1318 |

FOREIGN PATENT DOCUMENTS

| | | | |
|---|---|---|---|
| CN | 109409269 | A | 3/2019 |
| CN | 111009556 | A | 4/2020 |
| CN | 112015295 | A | 12/2020 |
| EP | 1261044 | A | 11/2002 |
| EP | 3373355 | A | 9/2018 |
| EP | 3537255 | A | 9/2019 |
| EP | 3637472 | A | 4/2020 |
| EP | 3869386 | A | 8/2021 |
| JP | 2000-036385 | A | 2/2000 |
| JP | 2002-324673 | A | 11/2002 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-147877 | A | 9/2018 |
| JP | 2019-179696 | A | 10/2019 |
| JP | 2020-092080 | A | 6/2020 |
| JP | 2020-160305 | A | 10/2020 |
| KR | 2012-0045285 | A | 5/2012 |
| KR | 2020-0040196 | A | 4/2020 |
| TW | 555830 | | 10/2003 |
| TW | 201426563 | | 7/2014 |
| WO | WO-2019/169917 | | 9/2019 |
| WO | WO-2022/153145 | | 7/2022 |
| WO | WO-2022/162492 | | 8/2022 |
| WO | WO-2022/162494 | | 8/2022 |

OTHER PUBLICATIONS

Written Opinion (Application No. PCT/IB2022/050336) Dated Apr. 5, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Taiwanese Office Action (Application No. 111102078) Dated Sep. 19, 2025.

Taiwanese Office Action (Application No. 111102078) dated Apr. 27, 2026.

* cited by examiner

R
G
B
109
IR
102
105
100
110R
110G
110B
110IR
104
101
103

R
G
B
108
IR
105
102
100
110R
110G
110B
110IR
101
104
103

R
G
B
108
IR
105
102
100
110R
110G
110B
110IR
101
104
103

FIG. 2A
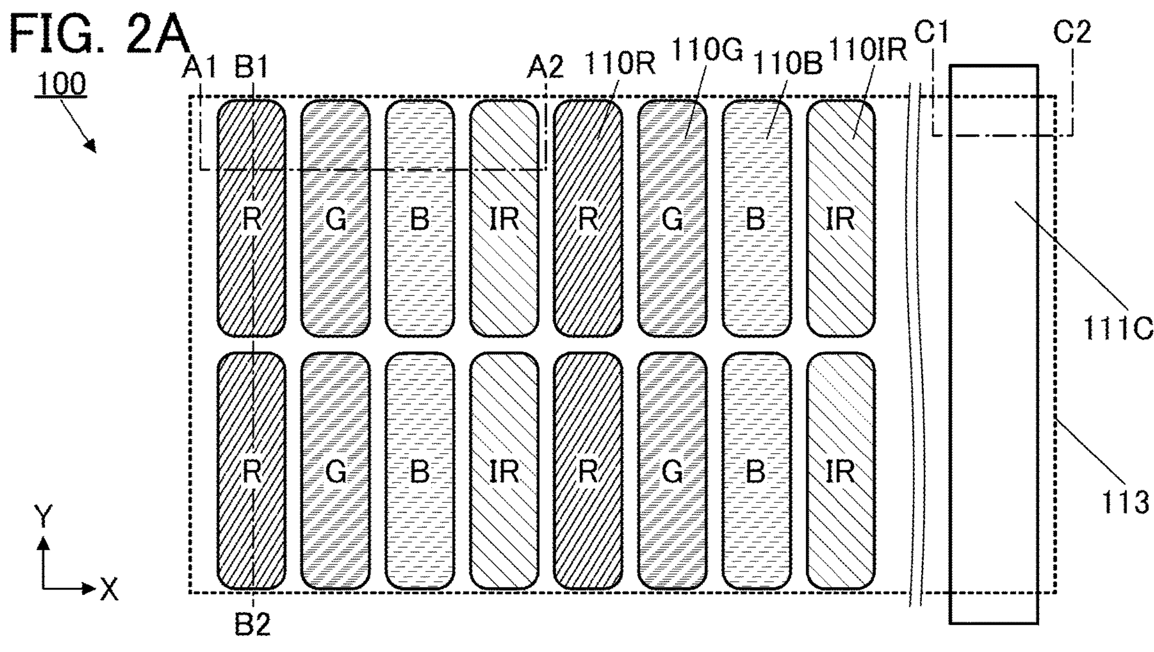
FIG. 2B
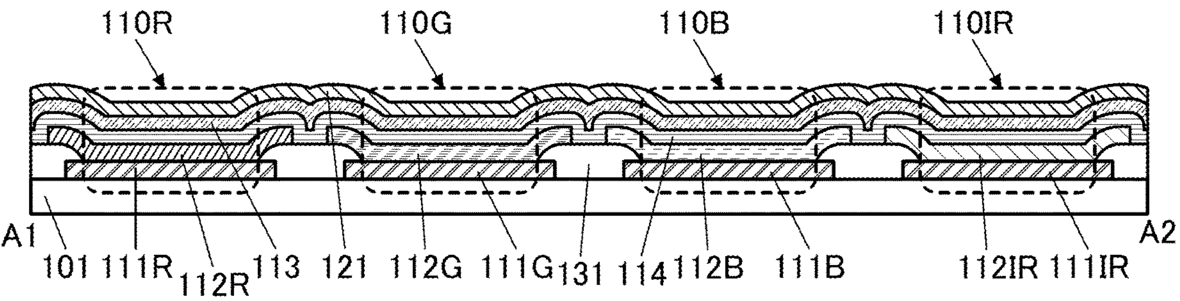
FIG. 2C
FIG. 2D
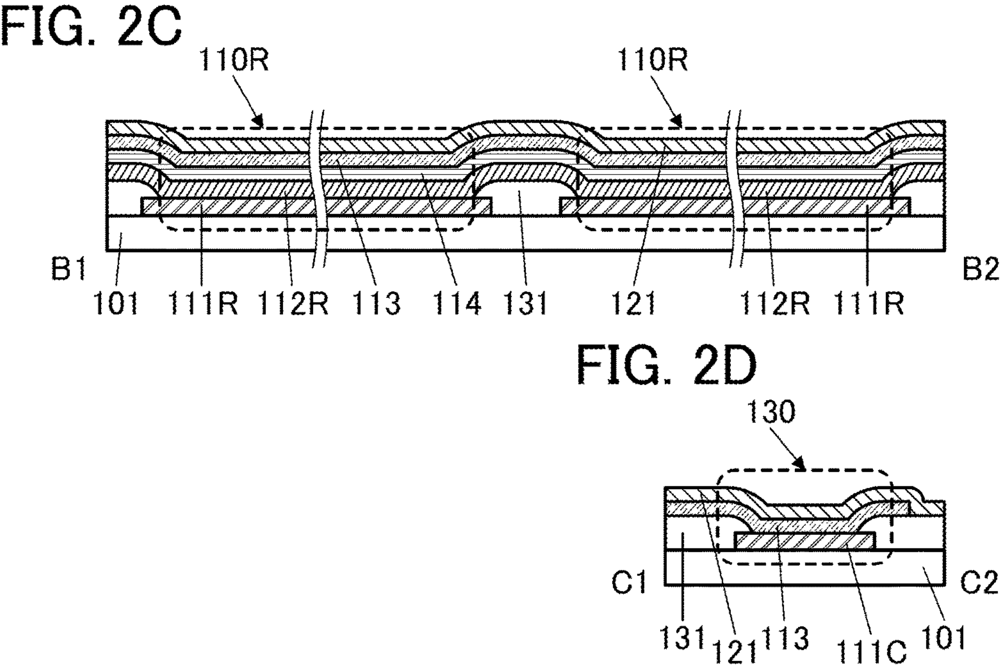

FIG. 6A
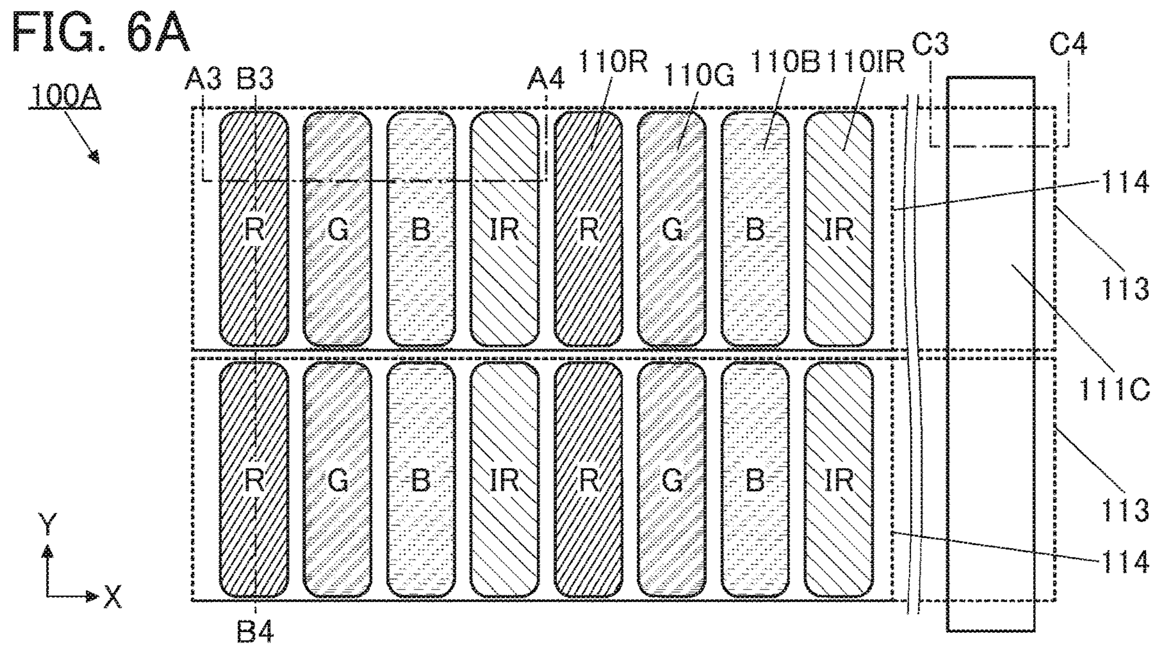
FIG. 6B
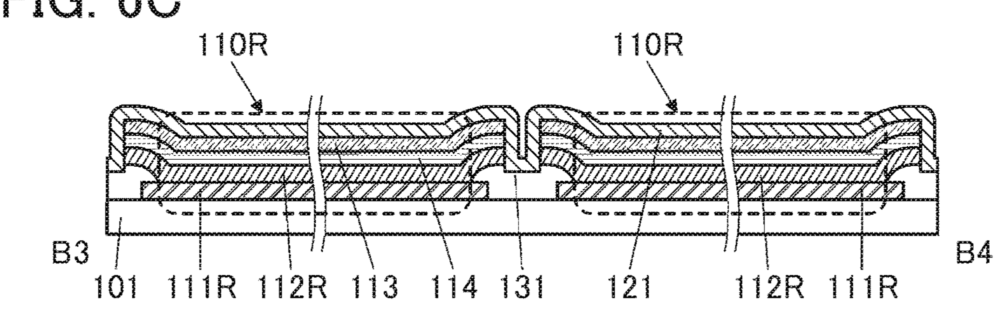
FIG. 6C
FIG. 6D
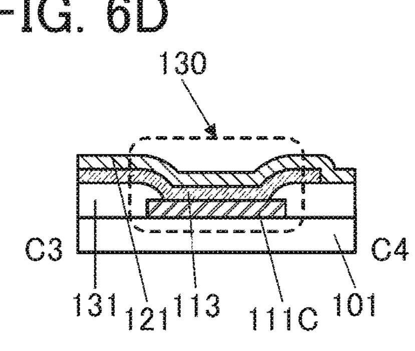

FIG. 9A
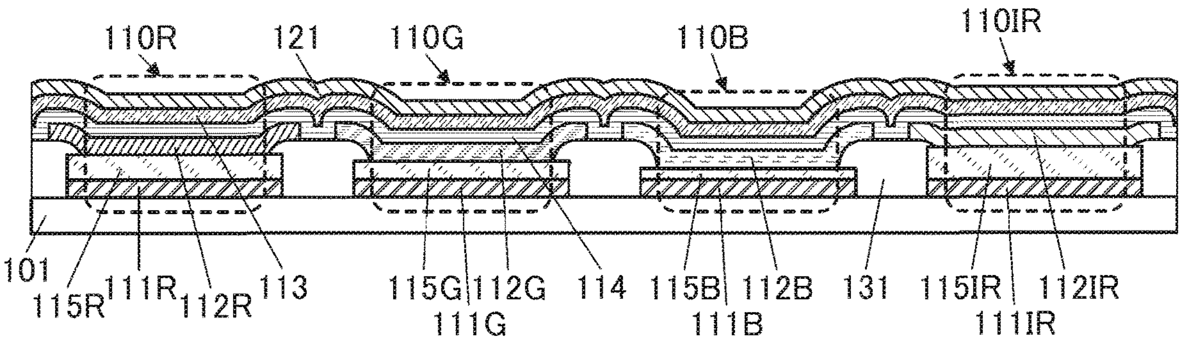
FIG. 9B
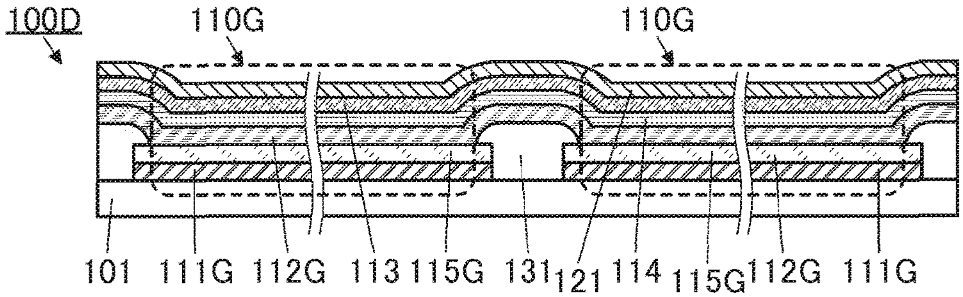
FIG. 9C
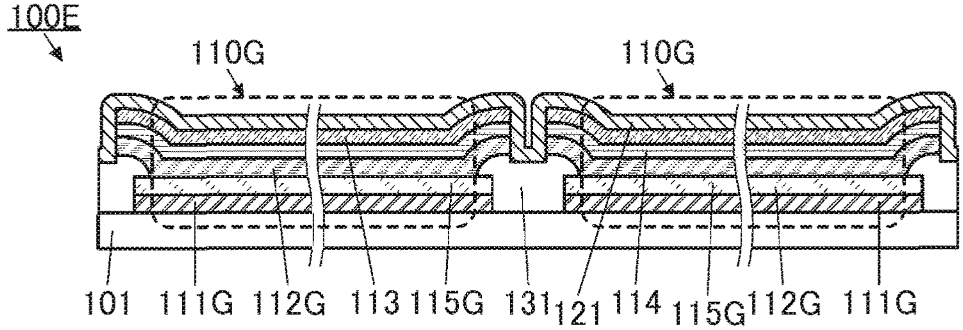

400A 462
464
442
228
443
215
213
211
222b
223
205
231
221
222a
430d
IR
426d
411d
452
416
430b
G
426b
411b
421
430a
R
426a
411a
417
201
465
242
466
472
204
214
451
416c
416a
416b
430d 400B
454
228
442
215
225
211
462
464
IR 430d
G 430b
421
416
417
222b
210
231i
221
223
231n
222a
212
202
465
242
466
472
214
204
453
455

218
215
222b
225
223
231n
231i
231
221
209
222a 280
292
291
281
290
400C

FIG. 19A1
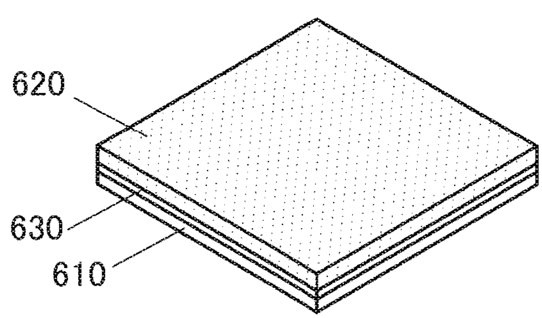
FIG. 19B1
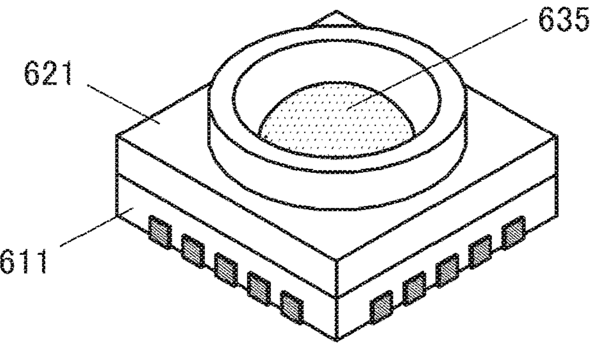
FIG. 19A2
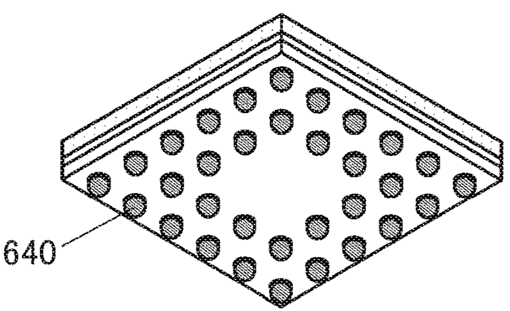
FIG. 19B2
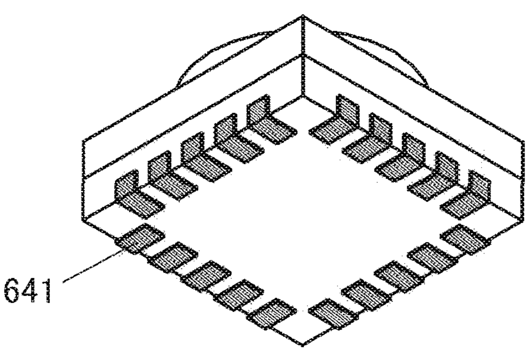
FIG. 19A3
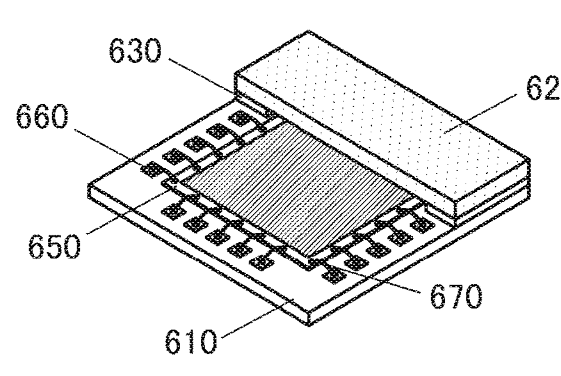
FIG. 19B3
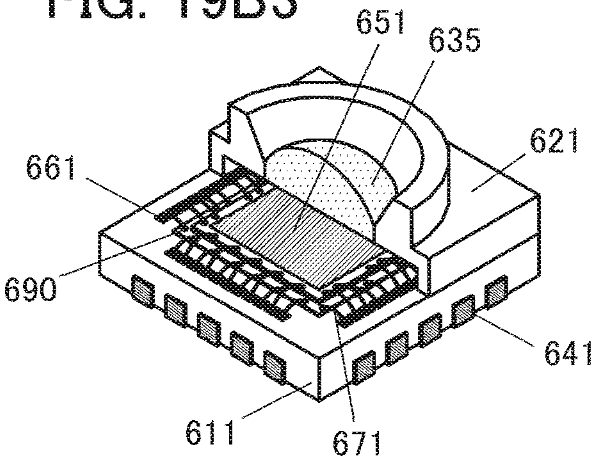

7100
7101
7000
7103
7111

7200
7211
7000
7212
7213
7214

FIG. 23A
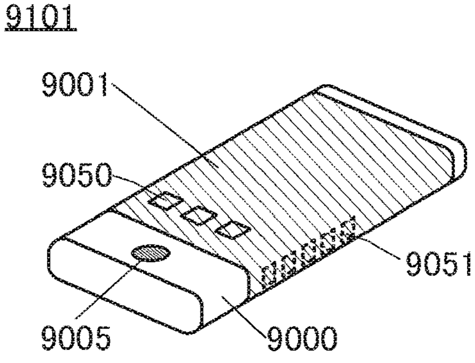
FIG. 23C
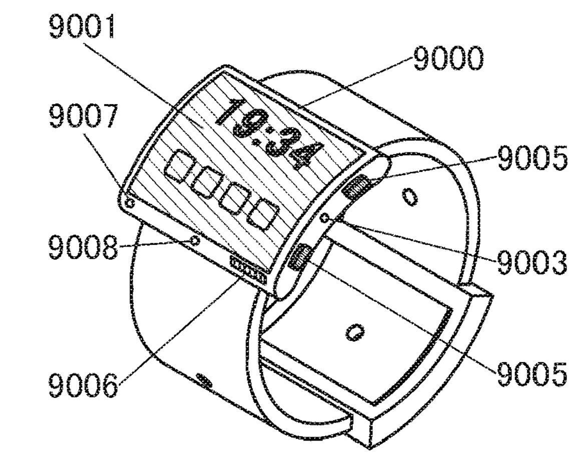
FIG. 23B
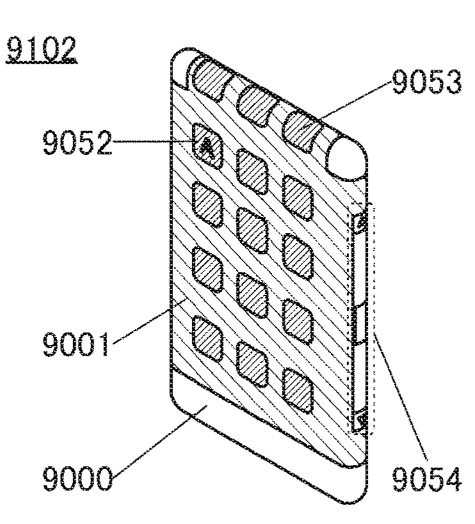
FIG. 23D
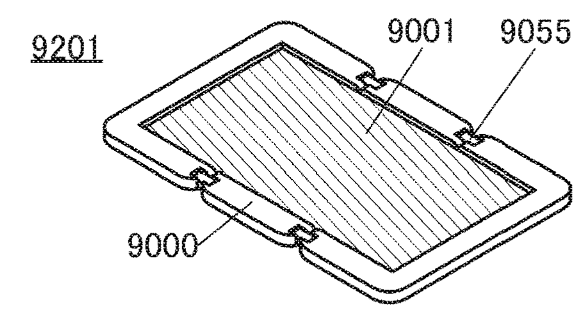
FIG. 23E
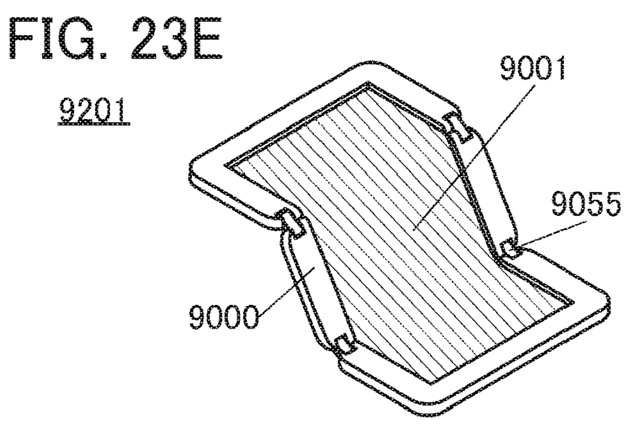
FIG. 23F
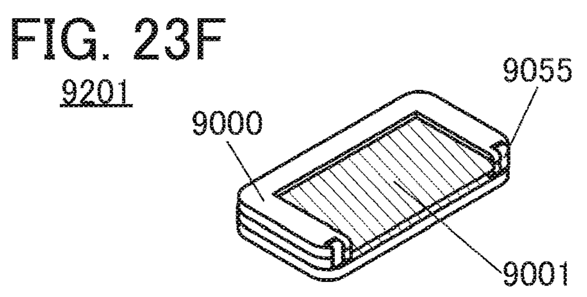

LIGHT-EMITTING DISPLAY APPARATUS WITH SENSORS

TECHNICAL FIELD

One embodiment of the present invention relates to a display apparatus. One embodiment of the present invention relates to a method for fabricating a display apparatus.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a notebook computer. Furthermore, higher resolution has been required for a stationary display apparatus such as a television device or a monitor device along with an increase in definition. An example of a device required to have the highest resolution is a device for virtual reality (VR) or augmented reality (AR).

Examples of a display apparatus that can be used for a display panel include, typically, a liquid crystal display apparatus, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure where a layer containing a light-emitting organic compound is provided between a pair of electrodes. By applying a voltage to this element, light emission can be obtained from the light-emitting organic compound. A display apparatus using such an organic EL element does not need a backlight that is necessary for a liquid crystal display apparatus and the like; thus, a thin, lightweight, high-contrast, and low-power display apparatus can be achieved. For example, Patent Document 1 discloses an example of a display apparatus that includes an organic EL element.

In addition, information terminals such as smartphones, tablet terminals, and notebook computers given above often contain personal information and thus various authentication techniques to prevent an abuse have been developed.

For example, Patent Document 2 discloses an electronic device including a fingerprint sensor in a push button switch portion.

REFERENCES

Patent Documents

[Patent Document 1] Japanese Published Patent Application No. 2002-324673

[Patent Document 2] United States Published Patent Application No. 2014/0056493

SUMMARY OF THE INVENTION

Problems to be Solved by the Invention

An object of one embodiment of the present invention is to provide a display apparatus having both a personal authentication function and a high resolution. An object of one embodiment of the present invention is to provide a display apparatus that can easily achieve a higher resolution and a fabrication method thereof. An object of one embodiment of the present invention is to provide a display apparatus with high contrast. An object of one embodiment of the present invention is to provide a highly reliable display apparatus.

An object of one embodiment of the present invention is to provide a display apparatus having a novel structure or a fabrication method of the display apparatus. An object of one embodiment of the present invention is to provide a method for fabricating the above display apparatus with a high yield. An object of one embodiment of the present invention is to at least reduce at least one of problems of the conventional technique.

Note that the description of these objects does not preclude the existence of other objects. One embodiment of the present invention does not need to achieve all these objects. Note that objects other than these can be derived from the description of the specification, the drawings, the claims, and the like.

Means for Solving the Problems

One embodiment of the present invention is a display apparatus including a display portion and a sensor portion. The display portion includes a first light-emitting element and a second light-emitting element. The first light-emitting element includes a first EL layer. The second light-emitting element includes a second EL layer. The sensor portion includes a light-receiving element. The first light-emitting element has a function of emitting infrared light. The light-receiving element has a function of detecting infrared light. A distance between the first EL layer and the second EL layer is less than or equal to 6 μm.

In the above, the display apparatus may have a structure where a protective member and a housing are further included, the display portion and the sensor portion are placed in a region surrounded by the protective member and the housing, and the display portion and the sensor portion are arranged side by side over the housing. In the above, it is preferable that the display portion include a first substrate and a second substrate, the first substrate be placed between the housing and each of the first light-emitting element and the second light-emitting element, the second substrate be placed between the protective member and each of the first light-emitting element and the second light-emitting element, and the second substrate and the protective member each have a light-transmitting property.

In the above, the display apparatus may have a structure where a protective member and a housing are further included, the display portion and the sensor portion are placed in a region surrounded by the protective member and the housing, the sensor portion is placed over the housing, and the display portion is placed over the sensor portion. In the above, it is preferable that the display portion include a first substrate and a second substrate, the first substrate be placed between the sensor portion and each of the first light-emitting element and the second light-emitting element, the second substrate be placed between the protective member and each of the first light-emitting element and the second light-emitting element, and the first substrate, the second substrate, and the protective member each have a light-transmitting property.

In the above, the second light-emitting element preferably has a function of emitting light of red, green, or blue. In the above, an organic film is preferably used for each of the first EL layer and the second EL layer. In the above, a distance between the first EL layer and the second EL layer may be less than or equal to 3 μm. In the above, the light-receiving element is preferably formed on a silicon substrate.

Effect of the Invention

According to one embodiment of the present invention, a display apparatus having both a personal authentication function and a high resolution can be provided. According to another embodiment of the present invention, a display apparatus that can easily achieve a higher resolution and a fabrication method thereof can be provided. According to another embodiment of the present invention, a display apparatus with high contrast can be provided. According to another embodiment of the present invention, a highly reliable display apparatus can be provided.

According to another embodiment of the present invention, a display apparatus having a novel structure or a fabrication method of the display apparatus can be provided. Alternatively, a method for manufacturing the above display apparatus with a high yield can be provided. According to one embodiment of the present invention, at least one of problems of the conventional technique can be at least reduced.

Note that the description of these effects does not preclude the existence of other effects. One embodiment of the present invention does not need to have all these effects. Effects other than these can be derived from the description of the specification, the drawings, the claims, and the like.

BRIEF DESCRIPTION OF THE DRAWINGS

FIG. 2A to FIG. 2D are diagrams illustrating structure examples of a display apparatus.

FIG. 3A to FIG. 3F are diagrams illustrating an example of a method for fabricating a display apparatus.

FIG. 6A to FIG. 6D are diagrams illustrating structure examples of a display apparatus.

FIG. 9A to FIG. 9C are diagrams illustrating structure examples of display apparatuses.

FIG. 19A1 to FIG. 19B3 are cross-sectional views illustrating examples of sensor modules.

FIG. 23A to FIG. 23F are diagrams illustrating examples of an electronic device.

MODE FOR CARRYING OUT THE INVENTION

Figure 1A:
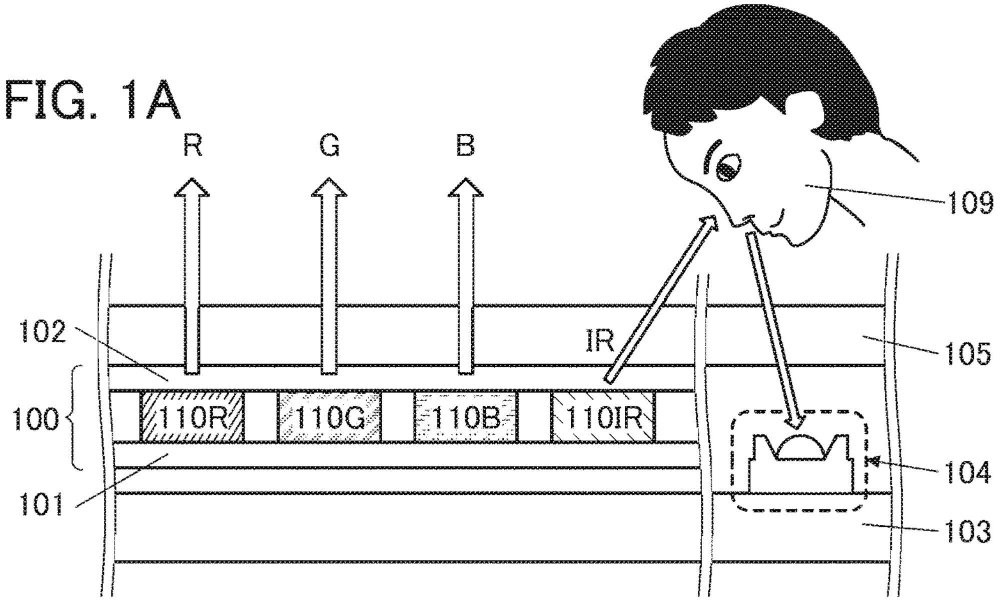
FIG. 1A to FIG. 1C are diagrams illustrating structure examples of a display apparatus.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

In each drawing described in this specification, the size, the layer thickness, or the region of each component is exaggerated for clarity in some cases. Therefore, they are not limited to the illustrated scale.

In this specification and the like, the ordinal numbers such as “first” and “second” are used in order to avoid confusion among components and do not limit the number.

In this specification and the like, the term “film” and the term “layer” can be interchanged with each other. For example, in some cases, the term “conductive layer” or the term “insulating layer” can be interchanged with the term “conductive film” or the term “insulating film”.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display apparatus has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, structure examples of a display apparatus of one embodiment of the present invention and examples of a method for fabricating the display apparatus will be described.

One embodiment of the present invention is a display apparatus including a light-emitting element (it can also be referred to as a light-emitting device) and a light-receiving element (it can also be referred to as a light-receiving device or a photoelectric conversion device). The display apparatus includes two or more light-emitting elements emitting light of different colors, and includes at least a light-emitting element emitting infrared light. Note that infrared light is invisible light, but is sometimes expressed as a "color" in this specification and the like. The light-emitting elements each include a pair of electrodes including an EL layer therebetween. The light-emitting elements are preferably organic EL elements (organic electroluminescent elements). The two or more light-emitting elements emitting different colors include respective EL layers containing different materials. For example, four kinds of light-emitting elements emitting visible light of red (R), green (G), and blue (B) and infrared light (IR) are included, whereby a full-color display apparatus having a personal authentication function can be achieved.

Here, one embodiment of the present invention includes a light-emitting element having a function of emitting infrared light and a light-receiving element having a function of detecting the infrared light. Thus, one embodiment of the present invention can achieve a personal authentication function utilizing infrared light. That is, a target is irradiated with infrared light emitted from the light-emitting element, and the infrared light reflected by the target is detected by the light-receiving element, whereby personal authentication of the target can be performed. For example, face authentication can be performed when the target is a human face, fingerprint authentication can be performed when the target is a human finger, and palm authentication can be performed when the target is a human hand.

In this case, one embodiment of the present invention performs personal authentication using invisible infrared light, and thus can perform the personal authentication without hindering display by the display apparatus. In particular, in the case where face authentication is performed, unintended light is not recognized by a user, offering a stress-free use of the display apparatus.

Furthermore, the light-emitting element of infrared light is provided in a manner similar to those of light-emitting elements for display (R, G, B, and the like), which eliminates the need for providing a light-emitting apparatus of infrared light for personal authentication. This can contribute to space saving of the display apparatus, leading to a reduction in the weight of the display apparatus or an increase in the size of a battery.

It is known that in the case where EL layers are separately formed for light-emitting elements of different colors, the EL layers are formed by an evaporation method using a shadow mask such as a metal mask or an FMM (a fine metal mask or a high-resolution metal mask). Note that in this specification and the like, a device formed in such a manner is sometimes referred to as a device having an MM (metal mask) structure. However, the MM structure causes a deviation from the designed shape and position of an island-shaped organic film due to various influences such as the low accuracy of the metal mask position, the positional deviation between the metal mask and a substrate, a warp of the metal mask, and the vapor-scattering-induced expansion of outline of the formed film; accordingly, it is difficult to achieve a high resolution and a high aperture ratio. Thus, a measure has been taken for pseudo improvement in resolution (also referred to pixel density) by employing a unique pixel arrangement such as a PenTile arrangement, for example.

In one embodiment of the present invention, an EL layer is processed into a fine pattern without a shadow mask such as a metal mask or an FMM. For example, an EL layer is processed into a fine pattern by a photolithography method. Note that in this specification and the like, a device formed in the above manner is sometimes referred to as a device having an MML (metal mask less) structure. With the use of the device having an MML structure, a display apparatus with a high resolution and a high aperture ratio, which has been difficult to achieve, can be achieved. Moreover, EL layers can be formed separately, enabling the display apparatus to perform extremely clear display with high contrast and high display quality.

A distance between EL layers for different colors, which is hard to set to less than 10 μm in the MM structure, for example, can be decreased to less than or equal to 6 μm, less than or equal to 4 μm, less than or equal to 3 μm, less than or equal to 2 μm, or less than or equal to 1 μm in the MML structure. Furthermore, for example, with the use of an exposure apparatus for LSI, the distance can be decreased to less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the EL layer itself can be made extremely smaller than that in the case of using a metal mask. For example, in the case of using a metal mask for separate formation of EL layers, a variation in the thickness of the pattern occurs between the center and the edge of the pattern. This causes a reduction in an effective area that can be used as a light-emitting region with respect to the entire pattern area. In contrast, in the above fabrication method, a pattern is formed by processing a film formed to have a uniform thickness, which enables a uniform thickness in the pattern; thus, even with a fine pattern, almost the entire area can be used as a light-emitting region. Therefore, the above fabrication method makes it possible to achieve both a high resolution and a high aperture ratio.

As described above, with the above fabrication method, a display apparatus in which minute light-emitting elements are integrated can be obtained, and it is not necessary to conduct a pseudo improvement in resolution with a unique pixel arrangement such as a PenTile arrangement; therefore, the display apparatus can achieve a resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction.

As described above, with the use of the MML structure, a display apparatus having both a personal authentication function and a high resolution can be provided.

Structures of a display apparatus of one embodiment of the present invention will be described below with reference to FIG. 1A to FIG. 1C.

[Structure Example of Display Apparatus Including Display Portion and Sensor Portion]

FIG. 1A is a schematic view of a display apparatus of one embodiment of the present invention. The display apparatus illustrated in FIG. 1A includes a display portion 100, a sensor portion 104, a housing 103, and a protective member 105. The display portion 100 and the sensor portion 104 are placed in a region interposed between the housing 103 and the protective member 105 or a region surrounded by the housing 103 and the protective member 105. Here, the display portion 100 and the sensor portion 104 are placed side by side over the housing 103. Note that the details of the components will be described later.

The display portion 100 includes a substrate 101, a substrate 102, and a plurality of light-emitting elements. For example, a structure may be employed where a light-emitting element 110R exhibiting red, a light-emitting element 110G exhibiting green, a light-emitting element 110B exhibiting blue, and a light-emitting element 110IR emitting infrared light are used as the plurality of light-emitting elements. Hereinafter, the light-emitting element 110R, the light-emitting element 110G, the light-emitting element 110B, and the light-emitting element 110IR are collectively referred to as a light-emitting element 110 in some cases. The light-emitting element 110 is placed in a region interposed between the substrate 101 and the substrate 102. In other words, the substrate 101 is placed between the housing 103 and the light-emitting element 110, and the substrate 102 is placed between the light-emitting element 110 and the protective member 105.

Light emitted from the light-emitting element 110IR preferably includes infrared light, further preferably includes near-infrared light. For example, near-infrared light having one or more peaks in the range of a wavelength greater than or equal to 700 nm and less than or equal to 2500 nm can be favorably used.

The sensor portion 104 includes a light-receiving element having a function of detecting infrared light. The light-receiving element preferably has light sensitivity with respect to infrared light, preferably near-infrared light emitted from the light-emitting element 110IR.

As illustrated in FIG. 1A, an image is displayed using light emitted by the light-emitting element 110R, the light-emitting element 110G, and the light-emitting element 110B in the display portion 100. In addition, the infrared light emitted from the light-emitting element 110IR in the display portion 100 is reflected by a face 109 of a user and the reflected light is detected by the light-receiving element in the sensor portion 104, whereby personal authentication is performed. Thus, the substrate 102 and the protective member 105 need to transmit both the visible light emitted from the light-emitting element 110R, the light-emitting element 110G, and the light-emitting element 110B, and the infrared light emitted from the light-emitting element 110IR and reflected by the face 109. It is thus preferable that the substrate 102 and the protective member 105 each have a light-transmitting property with respect to visible light and infrared light.

As described above, in the display apparatus illustrated in FIG. 1A, the display portion 100 and the sensor portion 104 are placed side by side over the housing 103. Thus, a distance between the light-emitting element 110IR and the light-receiving element in the sensor portion 104 in a direction parallel to the substrate surface is relatively large. It is thus difficult for the display apparatus illustrated in FIG. 1A to sense a target that is close to the protective member 105. Therefore, the display apparatus illustrated in FIG. 1A is preferably used for face authentication in which a distance between a sensing target (the face 109) and the protective member 105 is relatively large.

Figure 1B:
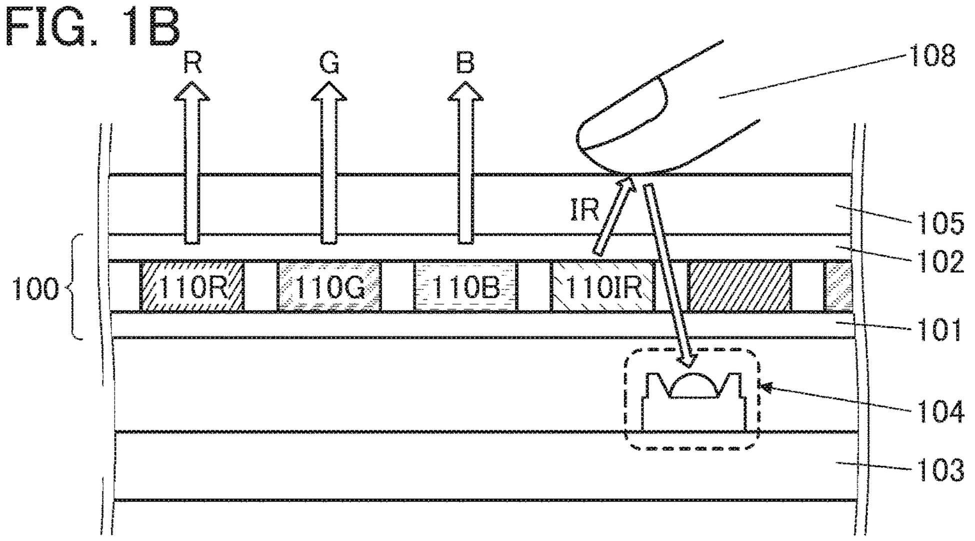

Alternatively, one embodiment of the present invention may have a structure illustrated in FIG. 1B. A display apparatus illustrated in FIG. 1B is different from the display apparatus illustrated in FIG. 1A in that the sensor portion 104 is provided below the display portion 100. In the display apparatus illustrated in FIG. 1B, the sensor portion 104 is provided over the housing 103, the display portion 100 is provided over the sensor portion 104, and the protective member 105 is provided over the display portion 100. Note that the other components are similar to those of the display apparatus illustrated in FIG. 1A and thus, for their details, the above description relating to FIG. 1A or the like can be referred to.

As illustrated in FIG. 1B, an image is displayed by light emission by the light-emitting element 110R, the light-emitting element 110G, and the light-emitting element 110B in the display portion 100. In addition, the infrared light emitted from the light-emitting element 110IR in the display portion 100 is reflected by a finger 108 of a user and the reflected light is detected by the light-receiving element in the sensor portion 104, so that personal authentication is performed. Thus, the substrate 102 and the protective member 105 need to transmit both the visible light from the light-emitting element 110R, the light-emitting element 110G, and the light-emitting element 110B, and the infrared light reflected by the light-emitting element 110IR and the finger 108. It is thus preferable that the substrate 102 and the protective member 105 have a light-transmitting property with respect to visible light and infrared light. Moreover, the infrared light reflected by the finger 108 needs to pass through the substrate 101. It is thus preferable that the substrate 101 have a light-transmitting property with respect to at least infrared light.

As described above, in the display apparatus illustrated in FIG. 1, the display portion 100 is placed to overlap with the sensor portion 104. Thus, a distance between the light-emitting element 110IR and the light-receiving element in the sensor portion 104 in a direction parallel to the substrate surface is relatively small. It is thus easy for the display apparatus illustrated in FIG. 1B to sense a target that is close to the protective member 105. Therefore, the display apparatus illustrated in FIG. 1B is preferably used for fingerprint authentication in which a sensing target (the finger 108) and the protective member 105 are in contact with each other.

Although FIG. 1B illustrates an example of the display apparatus where the finger 108 is in contact with the protective member 105, the finger 108 is not necessarily in contact with the protective member 105. For example, as illustrated in FIG. 1C, sensing can be performed while the finger 108 is at a distance from the protective member 105, in some cases. In a preferred mode, the distance between the finger 108 and the protective member 105 is relatively short, and the mode is referred to as near touch or hover touch in some cases.

In this specification and the like, near touch or hover touch means that a target (the finger 108) can be sensed while the target (the finger 108) is not in contact with the display apparatus, for example. For example, the display apparatus is preferably capable of sensing the target (the finger 108) when the distance between the display apparatus and the target (the finger 108) is within the range greater than or equal to 0.1 mm and less than or equal to 300 mm, further preferably greater than or equal to 3 mm and less than or equal to 50 mm. This structure enables the display apparatus to be operated without direct contact of the target (the finger 108), that is, enables the display apparatus to be operated in a contactless (touchless) manner. This structure can reduce the risk of the display apparatus being dirty or damaged or enables the target (the finger 108) to operate the display apparatus without directly touching a dirt (e.g., dust, bacteria, or a virus) attached to the display apparatus.

Note that FIG. 1A illustrates a structure where the sensor portion 104 is placed next to the display portion 100, and FIG. 1B and FIG. 1C each illustrate a structure where the sensor portion 104 is placed below the display portion 100; however, these structures may be employed in combination. That is, a structure may be employed where a first sensor portion is provided next to the display portion and a second sensor portion is provided below the display portion. With such a structure, face authentication and finger authentication can be used in combination in accordance with the security level. For example, face authentication can be performed for processing with a normal security level like unlocking a screen, and finger authentication can be further performed for processing that requires a higher security level like purchasing a thing.

Although the example where a sensing target is a face or a fingerprint is described above, the present invention is not limited thereto. For example, the display apparatus may perform personal authentication using a palm print, the shape of a blood vessel (including the shape of a vein and the shape of an artery), the iris, or the like as a sensing target.

In addition, although the function of performing personal authentication using the display apparatus of the present invention is described above, the present invention is not limited thereto. For example, a function of imaging a gesture by a sensor portion and performing processing in accordance with the gesture may be given to the display apparatus. Alternatively, a function of acquiring biological data such as a pulse, a respiration rate, a pulse wave, oxygen saturation, a blood sugar level, a neutral fat concentration, or the like may be given to the display apparatus from the imaging data of the sensor portion.

Although a pixel is formed using four kinds of light-emitting elements of the light-emitting element 110R emitting red light, the light-emitting element 110G emitting green light, the light-emitting element 110B emitting blue light, and the light-emitting element 110IR emitting infrared light in the structure described above, the present invention is not limited to this structure. For example, the light-emitting element 110R may emit light having a peak in both the red wavelength range and the infrared wavelength range and a pixel may be formed using three kinds of light-emitting elements of the light-emitting element 110R, the light-emitting element 110G, and the light-emitting element 110B.

Next, more specific examples of the structure and fabrication method of the display portion 100 provided in the display apparatus of one embodiment of the present invention are described with reference to drawings.

[Structure Example 1 of Display Portion]

FIG. 2A is a schematic top view of the display portion 100 of one embodiment of the present invention. The display portion 100 includes a plurality of light-emitting elements 110R exhibiting red, a plurality of light-emitting elements 110G exhibiting green, a plurality of light-emitting elements 110B exhibiting blue, and a plurality of light-emitting elements 110IR emitting infrared light. In FIG. 2A, light-emitting regions of the light-emitting elements are denoted by R, G, B, and IR to easily differentiate the light-emitting elements.

The light-emitting elements 110R, the light-emitting elements 110G, the light-emitting elements 110B, and the light-emitting elements 110IR are arranged in a matrix. FIG. 2A illustrates what is called a stripe arrangement, in which the light-emitting elements of the same color are arranged in one direction. Note that the arrangement method of the light-emitting elements is not limited thereto; another arrangement method such as a delta arrangement or a zigzag arrangement may be employed, or a PenTile arrangement can also be used.

The light-emitting element 110R, the light-emitting element 110G, the light-emitting element 110B, and the light-emitting element 110IR are arranged in the X direction. The light-emitting elements of the same color are arranged in the Y direction intersecting with the X direction.

Although FIG. 1A illustrates an example where one light-emitting element 110R, one light-emitting element 110G, one light-emitting element 110B, and one light-emitting element 110IR are provided to form one pixel, the present invention is not limited thereto. For example, a basic pixel may be composed of the light-emitting element 110R, the light-emitting element 110G, and the light-emitting element 110B, and a pixel further including the light-emitting element 110IR may be partly provided.

As the light-emitting element 110R, the light-emitting element 110G, the light-emitting element 110B, and the light-emitting element 11IR, an EL element such as an OLED (Organic Light Emitting Diode) or a QLED (Quantum-dot Light Emitting Diode) is preferably used. Examples of a light-emitting substance contained in the EL element include a substance that emits fluorescent light (a fluorescent material), a substance that emits phosphorescent light (a phosphorescent material), an inorganic compound (e.g., a quantum dot material), and a substance that exhibits thermally activated delayed fluorescence (a thermally activated delayed fluorescent (TADF) material).

FIG. 2B is a schematic cross-sectional view taken along the dashed-dotted line A1-A2 in FIG. 2A, and FIG. 2C is a schematic cross-sectional view taken along the dashed-dotted line B1-B2.

FIG. 2B illustrates cross sections of the light-emitting element 110R, the light-emitting element 110G, the light-emitting element 110B, and the light-emitting element 110IR. The light-emitting element 110R includes a pixel electrode 111R, an EL layer 112R, an EL layer 114, and a common electrode 113. The light-emitting element 110G includes a pixel electrode 111G, an EL layer 112G, the EL layer 114, and the common electrode 113. The light-emitting element 110B includes a pixel electrode 111B, an EL layer 112B, the EL layer 114, and the common electrode 113. The light-emitting element 11IR includes a pixel electrode 111IR, an EL layer 112IR, the EL layer 114, and the common electrode 113. The EL layer 114 and the common electrode 113 are provided to be shared by the light-emitting element 110R, the light-emitting element 110G, the light-emitting element 110B, and the light-emitting element 110IR. The EL layer 114 can also be referred to as a common layer.

The EL layer 112R included in the light-emitting element 110R contains at least a light-emitting organic compound that emits light with intensity in the red wavelength range. The EL layer 112G included in the light-emitting element 110G contains at least a light-emitting organic compound that emits light with intensity in the green wavelength range. The EL layer 112B included in the light-emitting element 110B contains at least a light-emitting organic compound that emits light with intensity in the blue wavelength range.

The EL layer 112R, the EL layer 112G, the EL layer 112B, and the EL layer 112IR may each include one or more of an electron-injection layer, an electron-transport layer, a hole-injection layer, and a hole-transport layer in addition to the layer containing a light-emitting organic compound (a light-emitting layer). The EL layer 114 can have a structure without the light-emitting layer. For example, the EL layer 114 includes one or more of an electron-injection layer, an electron-transport layer, a hole-injection layer, and a hole-transport layer.

The pixel electrode 111R, the pixel electrode 111G, the pixel electrode 111B, and the pixel electrode 111IR are provided for the respective light-emitting elements. In addition, the common electrode 113 and the EL layer 114 are each provided as a continuous layer shared by the light-emitting elements. A conductive film having a light-transmitting property with respect to visible light is used for either the respective pixel electrodes or the common electrode 113, and a reflective conductive film is used for the other. When the pixel electrodes are light-transmitting electrodes and the common electrode 113 is a reflective electrode, a bottom-emission display apparatus can be obtained; in contrast, when the pixel electrodes are reflective electrodes and the common electrode 113 is a light-transmitting electrode, a top-emission display apparatus can be obtained. Note that when both the pixel electrodes and the common electrode 113 are light-transmitting electrodes, a dual-emission display apparatus can be obtained.

An insulating layer 131 is provided to cover end portions of the pixel electrode 111R, the pixel electrode 111G, the pixel electrode 111B, and the pixel electrode 111IR. An end portion of the insulating layer 131 is preferably tapered. Note that the insulating layer 131 is not necessarily provided when not needed.

The EL layer 112R, the EL layer 112G, the EL layer 112B, and the EL layer 112IR each include a region in contact with the top surface of the pixel electrode and a region in contact with a surface of the insulating layer 131. End portions of the EL layer 112R, the EL layer 112G, the EL layer 112B, and the EL layer 112IR are positioned over the insulating layer 131.

As illustrated in FIG. 2B, there is a gap between the EL layers of two light-emitting elements with different colors. In this manner, the EL layer 112R, the EL layer 112G, the EL layer 112B, and the EL layer 112IR are preferably provided so as not to be in contact with each other. This can suitably prevent unintentional light emission from being caused by a current flowing through two adjacent EL layers. As a result, the contrast can be increased to achieve a display apparatus with high display quality.

As illustrated in FIG. 2C, the EL layer 112R is formed in a band-like shape so as to be continuous in the Y direction. When the EL layer 112R and the like are formed into a band-like shape, a space for dividing the layers is not needed and thus the area of a non-light-emitting region between the light-emitting elements can be reduced, resulting in a higher aperture ratio. Note that FIG. 2C illustrates the cross section of the light-emitting element 110R as an example; the light-emitting element 110G, the light-emitting element 110B, and the light-emitting element 110IR can also have a similar shape.

A protective layer 121 is provided over the common electrode 113 to cover the light-emitting element 110R, the light-emitting element 110G, the light-emitting element 110B, and the light-emitting element 110IR. The protective layer 121 has a function of preventing diffusion of impurities such as water into the light-emitting elements from above.

The protective layer 121 can have, for example, a single-layer structure or a stacked-layer structure including at least an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide may be used for the protective layer 121.

As the protective layer 121, a stacked-layer film of an inorganic insulating film and an organic insulating film can be used. For example, a structure where an organic insulating film is interposed between a pair of inorganic insulating films is preferable. Furthermore, the organic insulating film preferably functions as a planarization film. This can make the top surface of the organic insulating film flat, and accordingly can improve the coverage with the inorganic insulating film thereover, leading to an improvement in barrier property. Moreover, the flat top surface of the protective layer 121 is preferable because, when a component (e.g., a color filter, an electrode of a touch sensor, a lens array, or the like) is provided above the protective layer 121, the component is less affected by an uneven shape caused by the lower structure.

FIG. 2A also illustrates a connection electrode 111C electrically connected to the common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged. In FIG. 2A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface shape, the top surface of the connection electrode 111C can have a band-like shape, an L-shape, a U-shape (square bracket shape), a quadrangular shape, or the like.

FIG. 2D is a cross-sectional schematic view taken along the dashed-dotted line C1-C2 in FIG. 2A. FIG. 2D illustrates a connection portion 130 in which the connection electrode 111C and the common electrode 113 are electrically connected to each other. In the connection portion 130, the common electrode 113 is provided over and in contact with the connection electrode 111C and the protective layer 121 is provided to cover the common electrode 113. In addition, the insulating layer 131 is provided to cover end portions of the connection electrode 111C.

[Fabrication Method Example 1]

Figures 3A, 3B, 3C, 3D, 3E, 3F:
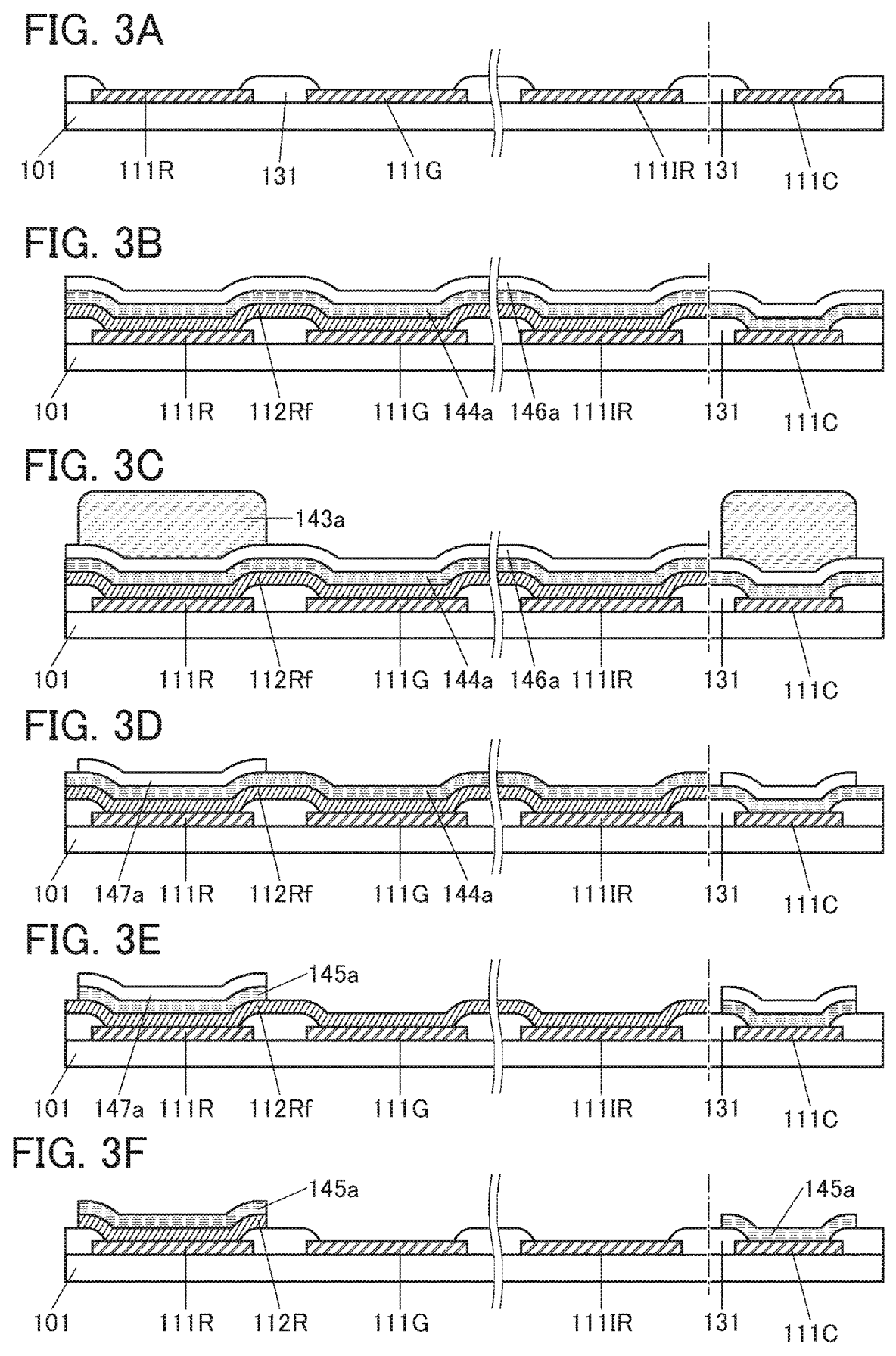

An example of a fabrication method of the display apparatus of one embodiment of the present invention will be described below with reference to drawings. Here, description is made using the display portion 100 described in the above structure example. FIG. 3A to FIG. 4F are schematic cross-sectional views in steps of the fabrication method of the display apparatus described below. In FIG. 3A and the like, the cross-sectional schematic views of the connection portion 130 and the vicinity thereof are also illustrated on the right side. Note that the light-emitting element 110B is omitted in FIG. 3A to FIG. 4F for clarity of the drawings;

however, the light-emitting element 110B can be fabricated in a manner similar to those of the light-emitting element 110R, the light-emitting element 110G, and the light-emitting element 110IR.

Note that thin films that form the display apparatus (insulating films, semiconductor films, conductive films, or the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. An example of the thermal CVD method is a metal organic chemical vapor deposition (MOCVD) method.

Alternatively, thin films that form the display apparatus (insulating films, semiconductor films, conductive films, or the like) can be formed by a method such as spin coating, dipping, spray coating, ink-jetting, dispensing, screen printing, offset printing, a doctor knife method, a slit coating, a roll coating, a curtain coating, and a knife coating.

The thin films that form the display apparatus can be processed by a photolithography method or the like. Besides, a nanoimprinting method, a sandblasting method, a lift-off method, or the like may be used for the processing of the thin films. Island-shaped thin films may be directly formed by a deposition method using a blocking mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is formed, exposure and development are performed, so that the thin film is processed into a desired shape.

As the light used for exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. As the light used for the exposure, extreme ultraviolet (EUV) light, X-rays, or the like may be used. Furthermore, instead of the light used for the exposure, an electron beam can also be used. It is preferable to use extreme ultraviolet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblasting method, or the like can be used.

[Preparation for Substrate 101]

As the substrate 101, a substrate having at least heat resistance high enough to withstand later heat treatment can be used. In the case where an insulating substrate is used as the substrate 101, a glass substrate, a quartz substrate, a sapphire substrate, a ceramic substrate, an organic resin substrate, or the like can be used. Alternatively, a single crystal semiconductor substrate using silicon, silicon carbide, or the like, a polycrystalline semiconductor substrate, a compound semiconductor substrate of silicon germanium or the like, or a semiconductor substrate such as an SOI substrate can be used. Note that when used for the display apparatus illustrated in FIG. 1B or the like, the substrate 101 is preferably formed using a material having a light-transmitting property, like a glass substrate.

As the substrate 101, it is particularly preferable to use a semiconductor substrate or an insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of Pixel Electrodes 111R, 111G, 111B, and 111IR and Connection Electrode 111C]

Next, over the substrate 101, the pixel electrode 111R, the pixel electrode 111G, the pixel electrode 111B (not illustrated), the pixel electrode 111IR, and the connection electrode 111C are formed. First, a conductive film to be the pixel electrodes is formed, a resist mask is formed by a photolithography method, and an unnecessary portion of the conductive film is removed by etching. After that, the resist mask is removed to form the pixel electrode 111R, the pixel electrode 111G, the pixel electrode 111B, and the pixel electrode 111IR.

In the case where a conductive film having a reflective property with respect to visible light is used as each pixel electrode, it is preferable to use a material (e.g., silver or aluminum) having reflectance as high as possible in the whole wavelength range of visible light. This can increase color reproducibility as well as light extraction efficiency of the light-emitting elements.

[Formation of Insulating Layer 131]

Then, the insulating layer 131 is formed to cover the end portions of the pixel electrode 111R, the pixel electrode 111G, the pixel electrode 111B, and the pixel electrode 111IR (FIG. 3A). An organic insulating film or an inorganic insulating film can be used for the insulating layer 131. The end portion of the insulating layer 131 is preferably tapered to improve step coverage with an EL film to be formed later. In particular, when an organic insulating film is used, a photosensitive material is preferably used so that the shape of the end portions can be easily controlled by the conditions of light exposure and development.

[Formation of EL Film 112Rf]

Subsequently, an EL film 112Rf to be the EL layer 112R is formed over the pixel electrode 111R, the pixel electrode 111G, the pixel electrode 111B, the pixel electrode 111IR, and the insulating layer 131.

The EL film 112Rf includes at least a film containing a light-emitting compound. A structure may be employed where one or more of films functioning as an electron-injection layer, an electron-transport layer, a charge-generation layer, a hole-transport layer, and a hole-injection layer are stacked in addition to the above. The EL film 112Rf can be formed by, for example, as an evaporation method, a sputtering method, or an inkjet method. Without limitation to this, the above-described deposition method can be used as appropriate.

For example, the EL film 112Rf is preferably a stacked film in which a hole-injection layer, a hole-transport layer, a light-emitting layer, and an electron-transport layer are stacked in this order. In this case, a film including the electron-injection layer can be used as the EL layer 114 to be formed later. In particular, when the electron-transport layer is provided to cover the light-emitting layer, the light-emitting layer can be inhibited from being damaged by a subsequent photolithography step or the like, so that a highly reliable light-emitting element can be fabricated. Furthermore, when layers containing the same organic compound are used as the electron-transport layer used for the EL film 112Rf or the like and the electron-injection layer used for the EL layer 114 to be formed later, bonding between them can be favorable and a highly reliable light-emitting element with high emission efficiency can be achieved. For example, an electron-transport organic compound can be used for the electron-transport layer, and a material containing the organic compound and a metal can be used for the electron-injection layer.

The EL film 112Rf is preferably formed so as not to be provided over the connection electrode 111C. For example, in the case where the EL film 112Rf is formed by an evaporation method (or a sputtering method), the EL film 112Rf is preferably formed using a shielding mask so as not to be formed over the connection electrode 111C.

[Formation of Sacrificial Film 144*a*]

Next, a sacrificial film 144*a* is formed to cover the EL film 112Rf. The sacrificial film 144*a* is provided in contact with the top surface of the connection electrode 111C. Note that the sacrificial film can also be referred to as a mask film.

As the sacrificial film 144*a*, it is possible to use a film highly resistant to etching treatment performed on various EL films such as the EL film 112Rf, i.e., a film having high etching selectivity. Furthermore, as the sacrificial film 144*a*, it is possible to use a film having high etching selectivity with respect to a protective film such as a protective film 146*a* described later. Moreover, as the sacrificial film 144*a*, it is possible to use a film that can be removed by a wet etching method that is less likely to cause damage to the EL film.

The sacrificial film 144*a* can be formed using an inorganic film such as a metal film, an alloy film, a metal oxide film, a semiconductor film, or an inorganic insulating film, for example. The sacrificial film 144*a* can be formed by any of a variety of deposition methods such as a sputtering method, an evaporation method, a CVD method, and an ALD method.

For the sacrificial film 144*a*, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, the sacrificial film 144*a* can be formed using a metal oxide such as an indium gallium zinc oxide (In—Ga—Zn oxide, also referred to as IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), or indium gallium tin zinc oxide (In—Ga—Sn—Zn oxide). Alternatively, indium tin oxide containing silicon can also be used, for example.

Note that an element M (M is one or more selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more selected from gallium, aluminum, and yttrium.

Furthermore, an inorganic insulating material such as aluminum oxide, hafnium oxide, or silicon oxide can be used for the sacrificial film 144*a*.

The sacrificial film 144*a* is preferably formed using a material that can be dissolved in a solvent chemically stable with respect to a film positioned in the uppermost portion of the EL film 112Rf. Specifically, a material that will be dissolved in water or alcohol can be suitably used for the sacrificial film 144*a*. In formation of the sacrificial film 144*a*, it is preferable that application of such a material dissolved in a solvent such as water or alcohol be performed by the aforementioned wet process and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

Examples of the wet process that can be employed for the formation of the sacrificial film 144*a* include spin coating, dipping, spray coating, ink-jetting, dispensing, screen printing, offset printing, a doctor knife method, a slit coating, a roll coating, a curtain coating, and a knife coating.

For the sacrificial film 144*a*, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

[Formation of Protective Film 146*a*]

Next, the protective film 146*a* is formed over the sacrificial film 144*a* (FIG. 3B).

The protective film 146*a* is a film used as a hard mask when the sacrificial film 144*a* is etched later. In a later step of processing the protective film 146*a*, the sacrificial film 144*a* is exposed. Thus, the combination of films having high etching selectivity therebetween is selected for the sacrificial film 144*a* and the protective film 146*a*. It is thus possible to select a film that can be used for the protective film 146*a* depending on an etching condition of the sacrificial film 144*a* and an etching condition of the protective film 146*a*.

For example, in the case where dry etching using a gas containing fluorine (also referred to as a fluorine-based gas) is employed as the etching of the protective film 146*a*, silicon, silicon nitride, silicon oxide, tungsten, titanium, molybdenum, tantalum, tantalum nitride, an alloy containing molybdenum and niobium, or an alloy containing molybdenum and tungsten can be used for the protective film 146*a*. Here, a metal oxide film such as IGZO or ITO is given as an example of a film having high etching selectivity (that is, enabling low etching rate) in dry etching using the fluorine-based gas, and such a film can be used as the sacrificial film 144*a*.

Without being limited to the above, a material for the protective film 146*a* can be selected from a variety of materials depending on the etching condition of the sacrificial film 144*a* and the etching condition of the protective film 146*a*. For example, any of the films selected from those usable as the sacrificial film 144*a* can be used. For example, a metal oxide such as IGZO or ITO can be used for the protective film 146*a*. For example, aluminum oxide deposited by an ALD method can be used for the sacrificial film 144*a*, and IGZO deposited by a sputtering method can be used for the protective film 146*a*. Note that it is particularly preferable to use aluminum oxide for the sacrificial film 144*a*, in which case the manufacturing cost can be reduced. Compared with a sputtering method, an ALD method enables formation with little deposition damage to a base.

Alternatively, the sacrificial film 144*a* may have a single-layer structure or a stacked-layer structure of two or more layers. Typical examples of the stacked-layer structure include a two-layer structure of an In—Ga—Zn oxide formed by a sputtering method and a silicon nitride film formed by a sputtering method; a two-layer structure of an In—Ga—Zn oxide formed by a sputtering method and aluminum oxide formed by an ALD method; and a two-layer structure of aluminum oxide formed by an ALD method and an In—Ga—Zn oxide formed by a sputtering method.

Note that in formation of the sacrificial film 144*a* by an ALD method or a sputtering method, heating deposition may be performed. In the case of this structure, the heating is preferably performed within a range where a base material (the EL film 112Rf here) does not deteriorate, and the substrate temperature in formation of the sacrificial film 144*a* is higher than or equal to room temperature and lower than or equal to 200° C., preferably higher than or equal to 50° C. and lower than or equal to 150° C., further preferably higher than or equal to 70° C. and lower than or equal to 100° C., typically around 80° C. The above structure can improve adhesion between the base material and the sacrificial film 144*a*.

As the protective film 146*a*, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

As the protective film 146*a*, an oxide film can be used, for example. Typically, an oxide film or an oxynitride film of silicon oxide, silicon oxynitride, aluminum oxide, aluminum oxynitride, hafnium oxide, hafnium oxynitride, or the like can also be used.

Alternatively, as the protective film 146*a*, an organic film that can be used as the EL film 112Rf or the like may be used. For example, the organic film that is used as the EL film 112Rf, an EL film 112Gf, or an EL film 112Bf can be used as the protective film 146*a*. The use of such an organic film is preferable, in which case the deposition apparatus for the EL film 112Rf or the like can be used in common.

[Formation of Resist Mask 143*a*]

Then, a resist mask 143*a* is formed at each of a position that is over the protective film 146*a* and overlaps with the pixel electrode 111R and a position that is over the protective film 146*a* and overlaps with the connection electrode 111C (FIG. 3C).

For the resist mask 143*a*, a resist material containing a photosensitive resin, such as a positive type resist material or a negative type resist material, can be used.

Here, in the case where the protective film 146*a* is not provided and the resist mask 143*a* is formed over the sacrificial film 144*a*, if a defect such as a pinhole exists in the sacrificial film 144*a*, the EL film 112Rf might be dissolved in a solvent of the resist material. The use of the protective film 146*a* can prevent such a defect from being generated.

In the case where a film in which a defect such as a pinhole is less likely to be generated is used as the sacrificial film 144*a*, the resist mask 143*a* may be formed directly over the sacrificial film 144*a* without the use of the protective film 146*a* therebetween.

[Etching of Protective Film 146*a*]

Next, part of the protective film 146*a* that is not covered with the resist mask 143*a* is removed by etching, so that a band-shaped protective layer 147*a* is formed. At this time, the protective layer 147*a* is formed also over the connection electrode 111C.

In the etching of the protective film 146*a*, an etching condition with high selectively is preferably employed so that the sacrificial film 144*a* is not removed by the etching. Either wet etching or dry etching can be performed for the etching of the protective film 146*a*; with use of dry etching, shrinkage in a processing pattern of the protective film 146*a* can be inhibited.

[Removal of Resist Mask 143*a*]

Next, the resist mask 143*a* is removed (FIG. 3D).

The removal of the resist mask 143*a* can be performed by wet etching or dry etching. It is particularly preferable to perform dry etching (also referred to as plasma ashing) using an oxygen gas as an etching gas to remove the resist mask 143*a*.

At this time, the removal of the resist mask 143*a* is performed in a state where the EL film 112Rf is covered with the sacrificial film 144*a*; thus, an influence on the EL film 112Rf is reduced. In particular, when the EL film 112Rf is exposed to oxygen, the electrical characteristics are adversely affected in some cases; therefore, the EL film 112Rf is preferably covered with the sacrificial film 144*a* when etching using an oxygen gas, such as plasma ashing, is performed.

[Etching of Sacrificial Film 144*a*]

Next, part of the sacrificial film 144*a* that is not covered with the protective layer 147*a* is removed by etching with use of the protective layer 147*a* as a mask, so that a band-shaped sacrificial layer 145*a* is formed (FIG. 3E). At this time, the sacrificial layer 145*a* is formed also over the connection electrode 111C. Note that the sacrificial layer can also be referred to as a mask layer.

Either wet etching or dry etching can be performed for the etching of the sacrificial film 144*a*; the use of dry etching is preferable, in which case a shrinkage of the pattern can be inhibited.

[Etching of EL Film 112Rf and Protective Layer 147*a*]

Next, part of the EL film 112Rf that is not covered with the sacrificial layer 145*a* is removed by etching at the same time as etching of the protective layer 147*a*, whereby the EL layer 112R having a band-like shape is formed (FIG. 3F). At this time, the protective layer 147*a* over the connection electrode 111C is also removed.

The EL film 112Rf and the protective layer 147*a* are preferably etched by the same treatment, in which case the process can be simplified to reduce the fabrication cost of the display apparatus.

In particular, as the etching of the EL film 112Rf, it is preferable to employ dry etching using an etching gas that does not contain oxygen as its main component. This can inhibit the alteration of the EL film 112Rf to achieve a highly reliable display apparatus. Examples of the etching gas that does not contain oxygen as its main component include $CF_4$, $C_4F_8$, $SF_6$, $CHF_3$, $Cl_2$, $H_2O$, $BCl_3$, and a noble gas such as $H_2$ or He. Alternatively, a mixed gas of the above gas and a dilute gas that does not contain oxygen can be used as the etching gas.

Note that the etching of the EL film 112Rf and the etching of the protective layer 147*a* may be performed separately. In this case, either the etching of the EL film 112Rf or the etching of the protective layer 147*a* may be performed first.

At this step, the EL layer 112R and the connection electrode 111C are covered with the sacrificial layer 145*a*.

[Formation of EL Film 112Gf]

Subsequently, the EL film 112Gf to be the EL layer 112G later is formed over the sacrificial layer 145*a*, the insulating layer 131, the pixel electrode 111G, the pixel electrode 111B, and the pixel electrode 111IR. In this case, similarly to the EL film 112Rf, the EL film 112Gf is preferably not provided over the connection electrode 111C.

The description of the EL film 112Rf can be referred to for the formation method of the EL film 112Gf.

[Formation of Sacrificial Film 144*b*]

Subsequently, a sacrificial film 144*b* is formed over the EL film 112Gf. The sacrificial film 144*b* can be formed in a manner similar to that of the sacrificial film 144*a*. In particular, the sacrificial film 144*b* is preferably formed using the same material as the sacrificial film 144*a*.

At this time, the sacrificial film 144*a* is formed also over the connection electrode 111C to cover the sacrificial layer 145*a*.

[Formation of Protective Film 146*b*]

Next, a protective film 146*b* is formed over the sacrificial film 144*b*. The protective film 146*b* can be formed in a manner similar to that of the protective film 146*a*. In particular, the protective film 146*b* and the protective film 146*a* are preferably formed using the same material.

[Formation of Resist Mask 143*b*]

Figure 4A:
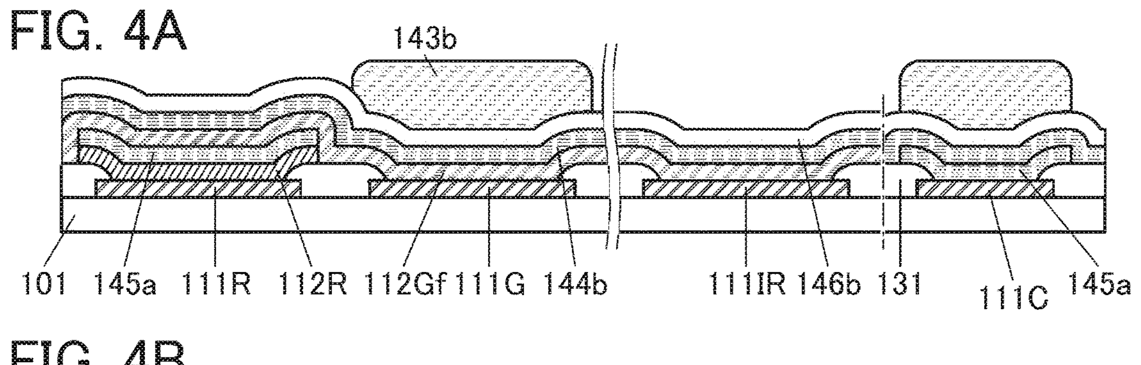
FIG. 4A to FIG. 4F are diagrams illustrating the example of a method for fabricating a display apparatus.

Then, the resist mask 143*b* is formed in a region that is over the protective film 146*b* and overlaps with the pixel electrode 111G and a region that overlaps with the connection electrode 111C (FIG. 4A).

The resist mask 143*b* can be formed in a manner similar to that of the resist mask 143*a*.

[Etching of Protective Film 146*b*]

Figure 4B:
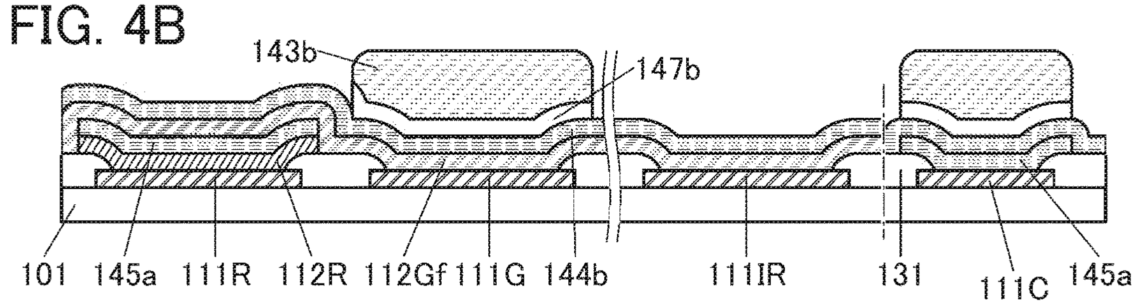

Next, part of the protective film 146*b* that is not covered with the resist mask 143*b* is removed by etching, so that a band-shaped protective layer 147*b* is formed (FIG. 4B). At this time, the protective layer 147*b* is formed also over the connection electrode 111C.

The description of the protective film 146*a* can be referred to for the etching of the protective film 146*b*.

[Removal of Resist Mask 143*b*]

Next, the resist mask 143*b* is removed. The description of the resist mask 143*a* can be referred to for the removal of the resist mask 143*b*.

[Etching of Sacrificial Film 144*b*]

Next, part of the sacrificial film 144*b* that is not covered with the protective layer 147*b* is removed by etching with use of the protective layer 147*b* as a mask, so that a band-shaped sacrificial layer 145*b* is formed. At this time, the sacrificial layer 145*b* is formed also over the connection electrode 111C. The sacrificial layer 145*a* and the sacrificial layer 145*b* are stacked over the connection electrode 111C.

The description of the sacrificial film 144*a* can be referred to for the etching of the sacrificial film 144*b*.

[Etching of EL Film 112Gf and Protective Layer 147*b*]

Figure 4C:
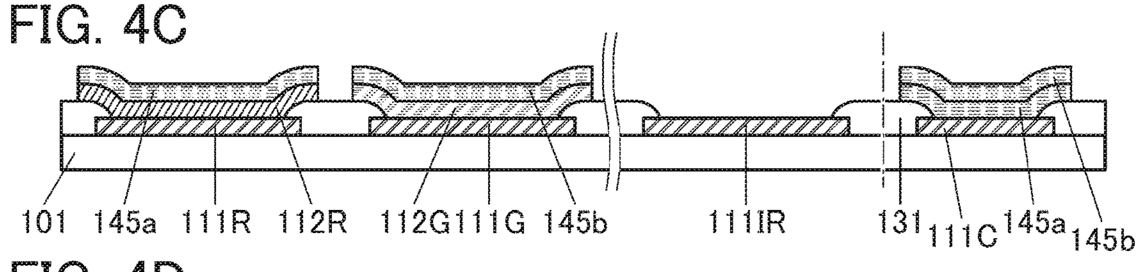

Next, part of the EL film 112Gf that is not covered with the sacrificial layer 145*b* is removed by etching at the same time as etching of the protective layer 147*b*, whereby the EL layer 112G having a band-like shape is formed (FIG. 4C). At this time, the protective layer 147*b* over the connection electrode 111C is also removed.

The above description of the EL film 112Rf and the protective layer 147*a* can be referred to for the etching of the EL film 112Gf and the protective layer 147*b*.

At this time, the EL layer 112R is protected by the sacrificial layer 145*a*, and thus can be prevented from being damaged in the etching step of the EL film 112Gf.

In the above manner, the band-shaped EL layer 112R and the band-shaped EL layer 112G can be separately formed with high alignment accuracy. Here, a distance between the band-shaped EL layer 112R and the band-shaped EL layer 112G can be decreased to less than or equal to 6 μm, less than or equal to 4 μm, less than or equal to 3 μm, less than or equal to 2 μm, or less than or equal to 1 m. Furthermore, for example, with use of an exposure apparatus for LSI, the distance can be decreased to less than or equal to 500 nm, less than or equal to 200 nm, less than or equal to 100 nm, or less than or equal to 50 nm.

[Formation of EL Layer 112B and EL Layer 112IR]

The above steps are performed on the EL film 112Bf (not illustrated), whereby the island-shaped EL layer 112B (not illustrated) and an island-shaped sacrificial layer 145*c* (not illustrated) can be formed.

Figure 4D:
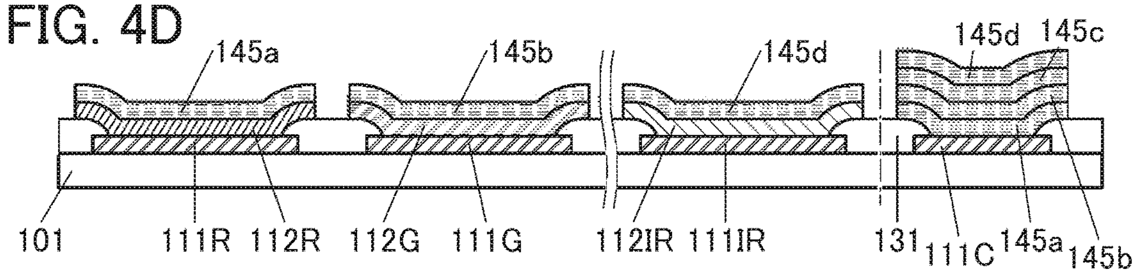

Furthermore, the above steps are performed on an EL film 112IRf (not illustrated), whereby the island-shaped EL layer 112IR and an island-shaped sacrificial layer 145*d* can be formed (FIG. 4D).

The EL layer 112IR is formed in the following manner. After the EL layer 112B is formed, the EL film 112IRf, a sacrificial film 144*d*, a protective film 146*d*, and a resist mask 143*d* (each of which is not illustrated) are sequentially formed. Subsequently, the protective film 146*d* is etched to form a protective layer 147*d* (not illustrated), and then the resist mask 143*d* is removed. After that, the sacrificial film 144*d* is etched to form the sacrificial layer 145*d*. Then, the protective layer 147*d* and the EL film 112IRf are etched to form the EL layer 112IR having a band-like shape. Note that the EL layer 112B can also be formed through a process similar to that of the EL layer 112IR.

After the formation of the EL layer 112B, the sacrificial layer 145*c* is concurrently formed also over the connection electrode 111C, and after the formation of the EL layer 112IR, the sacrificial layer 145*d* is formed over the sacrificial layer 145*c*. That is, the sacrificial layer 145*a*, the sacrificial layer 145*b*, the sacrificial layer 145*c*, and the sacrificial layer 145*d* are stacked over the connection electrode 111C.

[Removal of Sacrificial Layers]

Figure 4E:
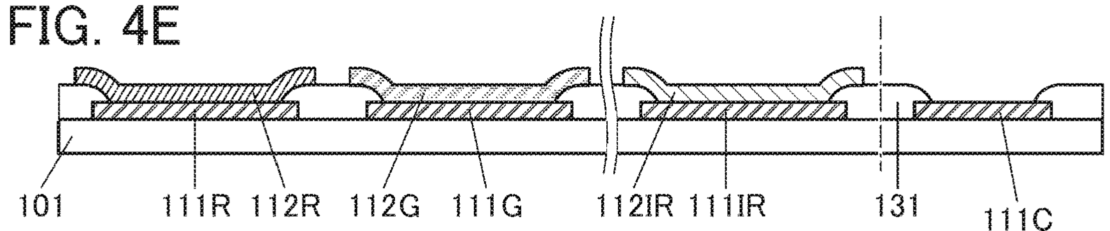

Next, the sacrificial layer 145*a*, the sacrificial layer 145*b*, the sacrificial layer 145*c*, and the sacrificial layer 145*d* are removed to expose the top surfaces of the EL layer 112R, the EL layer 112G, the EL layer 112B, and the EL layer 112IR (FIG. 4E). At this time, the top surface of the connection electrode 111C is also exposed.

The sacrificial layer 145*a*, the sacrificial layer 145*b*, the sacrificial layer 145*c*, and the sacrificial layer 145*d* can be removed by wet etching or dry etching. At this time, it is preferable to employ a method that causes damage to the EL layer 112R, the EL layer 112G, the EL layer 112B, and the EL layer 112IR as little as possible. In particular, a wet etching method is preferably used. For example, wet etching using a tetramethyl ammonium hydroxide (TMAH) aqueous solution, diluted hydrofluoric acid, oxalic acid, phosphoric acid, acetic acid, nitric acid, or a mixed solution thereof is preferably employed.

Alternatively, the sacrificial layer 145*a*, the sacrificial layer 145*b*, the sacrificial layer 145*c*, and the sacrificial layer 145*d* are preferably removed by being dissolved in a solvent such as water or alcohol. As the alcohol in which the sacrificial layer 145*a*, the sacrificial layer 145*b*, the sacrificial layer 145*c*, and the sacrificial layer 145*d* can be dissolved, any of various alcohols such as ethyl alcohol, methyl alcohol, isopropyl alcohol (IPA), and glycerin can be used.

After the sacrificial layer 145*a*, the sacrificial layer 145*b*, the sacrificial layer 145*c*, and the sacrificial layer 145*d* are removed, drying treatment is preferably performed in order to remove water contained in the EL layer 112R, the EL layer 112G, the EL layer 112B, and the EL layer 112IR and water adsorbed on the surfaces of the EL layer 112R, the EL layer 112G, the EL layer 112B, and the EL layer 112IR. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment in a reduced-pressure atmosphere is preferable, in which case drying at a lower temperature is possible.

In this manner, the EL layer 112R, the EL layer 112G, the EL layer 112B, and the EL layer 112IR can be formed separately.

[Formation of EL Layer 114]

Then, the EL layer 114 is formed to cover the EL layer 112R, the EL layer 112G, the EL layer 112B, and the EL layer 112IR.

The EL layer 114 can be formed in a manner similar to that of the EL film 112Rf or the like. In the case where the EL layer 114 is formed by an evaporation method, the EL layer 114 is preferably formed using a shielding mask so as not to be formed over the connection electrode 111C.

[Formation of Common Electrode 113]

Figure 4F:
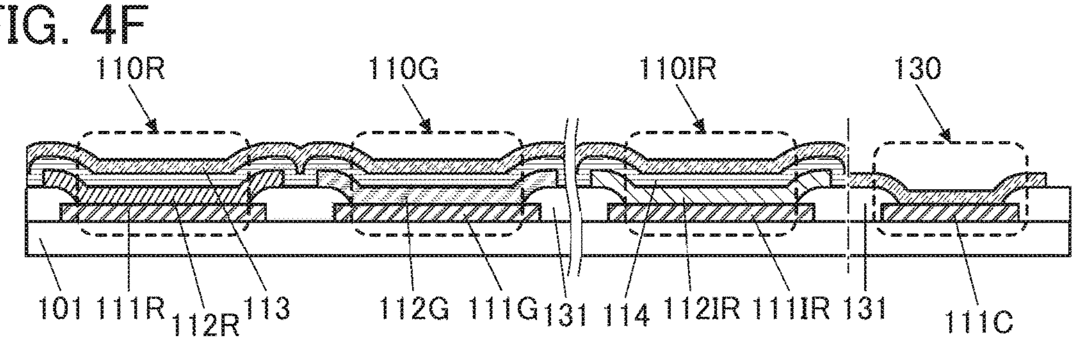

Then, the common electrode 113 is formed to cover the EL layer 114 and the connection electrode 111C (FIG. 4F).

The common electrode 113 can be formed by a deposition method such as an evaporation method or a sputtering method. Alternatively, a film formed by an evaporation method and a film formed by a sputtering method may be stacked. In this case, the common electrode 113 is preferably formed to cover a region where the EL layer 114 is formed. That is, a structure where end portions of the EL layer 114 and the common electrode 113 overlap with each other can be obtained. The common electrode 113 is preferably formed using a shielding mask.

The common electrode 113 is electrically connected to the connection electrode 111C outside the display region.

[Formation of Protective Layer]

Next, the protective layer 121 is formed over the common electrode 113. An inorganic insulating film used for the protective layer 121 is preferably formed by a sputtering method, a PECVD method, or an ALD method. In particular, an ALD method is preferable because it provides excellent step coverage and is less likely to cause a defect such as a pinhole. An organic insulating film is preferably formed by an inkjet method because a uniform film can be formed in a desired area.

In the above manner, the display portion 100 illustrated in FIG. 2A to FIG. 2D can be fabricated.

Although the case where the common electrode 113 and the EL layer 114 are formed so as to have different top surface shapes is described, they may be formed in the same region.

Figures 5A, 5B, 5C:
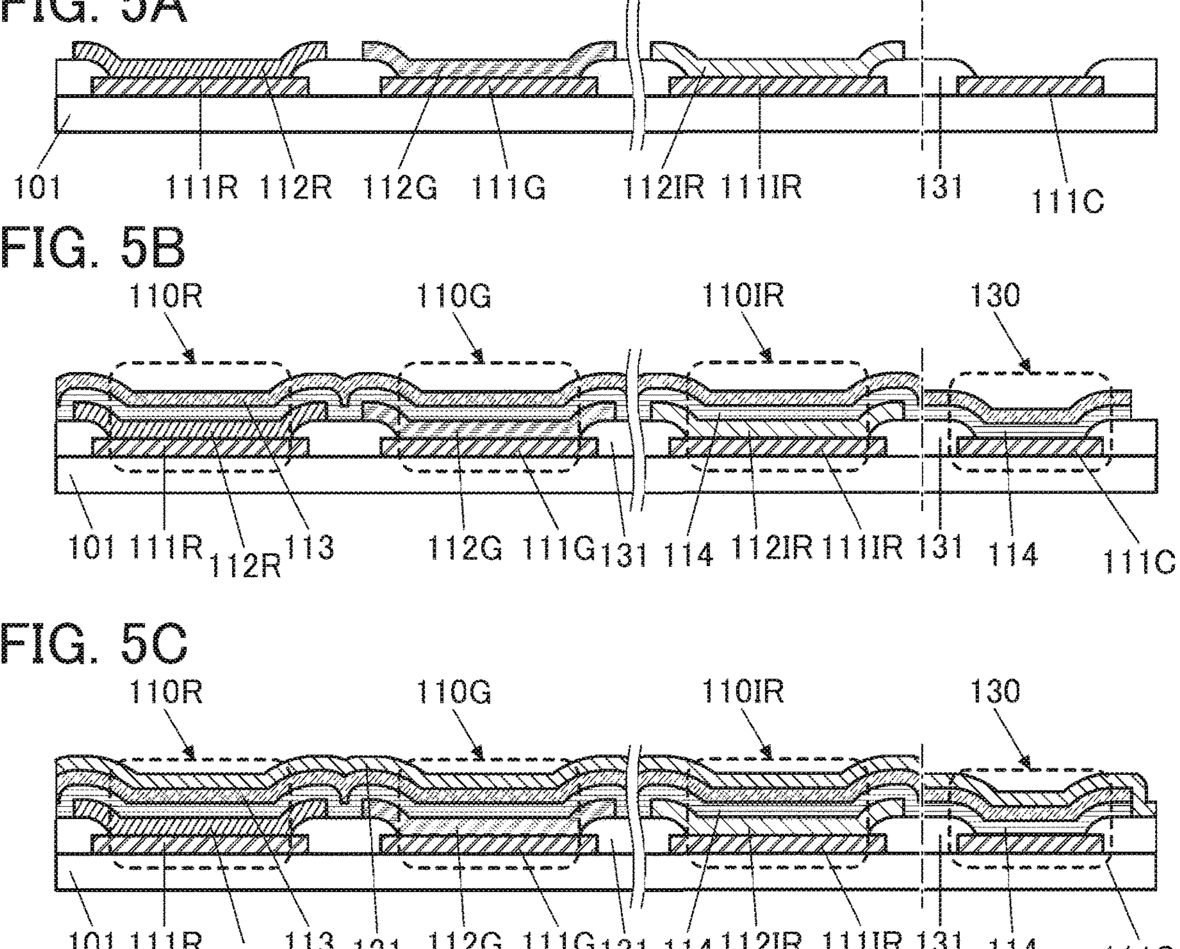
FIG. 5A to FIG. 5C are diagrams illustrating the example of the method for fabricating the display apparatus.

FIG. 5A is a schematic cross-sectional view after the sacrificial layers are removed in the above manner. Sequentially, as illustrated in FIG. 5B, the EL layer 114 and the common electrode 113 are formed using the same shielding mask or without using a shielding mask. This can reduce the manufacturing cost as compared with the case where different shielding masks are used.

The structure at this time is such that the EL layer 114 is interposed between the connection electrode 111C and the common electrode 113 in the connection portion 130, as illustrated in FIG. 5B. Here, the EL layer 114 is preferably formed using a material with as low electric resistance as possible. Alternatively, the EL layer 114 is preferably formed as thin as possible to reduce the electric resistance of the EL layer 114 in the thickness direction. For example, when an electron-injection or hole-injection material with a thickness greater than or equal to 1 nm and less than or equal to 5 nm, preferably greater than or equal to 1 nm and less than or equal to 3 nm is used for the EL layer 114, the electric resistance between the connection electrode 111C and the common electrode 113 can be negligibly small in some cases.

Subsequently, the protective layer 121 is formed as illustrated in FIG. 5C. At this time, the protective layer 121 is preferably provided to cover the end portion of the common electrode 113 and the end portion of the EL layer 114, as illustrated in FIG. 5C. This can effectively prevent diffusion of impurities such as water or oxygen from the outside to the EL layer 114 and an interface between the EL layer 114 and the common electrode 113.

The above is the description of the example of the fabrication method of a display apparatus.

[Structure Example 2 of Display Portion]

A structure example of a display portion whose structure is partly different from that of the structure example 1 is described below. Portions similar to those described above are not described below in some cases.

A display portion 100A illustrated in FIG. 6A to FIG. 6D is different from the display portion 100 mainly in the shapes of the EL layer 114 and the common electrode 113.

As illustrated in FIG. 6C, in a cross section in the Y direction, the EL layer 112R, the EL layer 114, and the common electrode 113 are separated from each other between two light-emitting elements 110R. In other words, the EL layer 112R, the EL layer 114, and the common electrode 113 have end portions in portions overlapping with the insulating layer 131.

The protective layer 121 is provided to cover side surfaces of the EL layer 112R, the EL layer 114, and the common electrode 113 in a region overlapping with the insulating layer 131.

In addition, as illustrated in FIG. 6C, a depressed portion may be formed in part of the top surface of the insulating layer 131. In this case, the protective layer 121 is preferably provided along and in contact with a surface of the depressed portion of the insulating layer 131. This is preferable because a contact area between the insulating layer 131 and the protective layer 121 is increased and the adhesion therebetween is improved.

In FIG. 6A, the outlines of the common electrode 113 and the EL layer 114 are denoted by dashed lines. As illustrated in FIG. 6A, the common electrode 113 and the EL layer 114 each have a band-like top surface shape whose longitudinal direction is parallel to the X direction. Meanwhile, as illustrated in FIG. 6B and FIG. 6C, the EL layer 112R has an island-like shape.

Note that the light-emitting element 110G, the light-emitting element 110B, and the light-emitting element 110IR can each have a structure similar to the above, which is not described here.

[Fabrication Method Example 2]

An example of a fabrication method of the display portion 100A will be described below. Note that for the portions similar to those in the fabrication method example 1, the above description is referred to and the description of the portions is omitted. The fabrication method example described here is different from the fabrication method example 1 in the steps after formation of the common electrode 113.

FIG. 7A to FIG. 7D are schematic cross-sectional views of steps described below. Here, a cross section taken along the dashed-dotted line B3-B4 and a cross section taken along the dashed-dotted line C3-C4 in FIG. 6A are illustrated side by side.

Figure 7A:
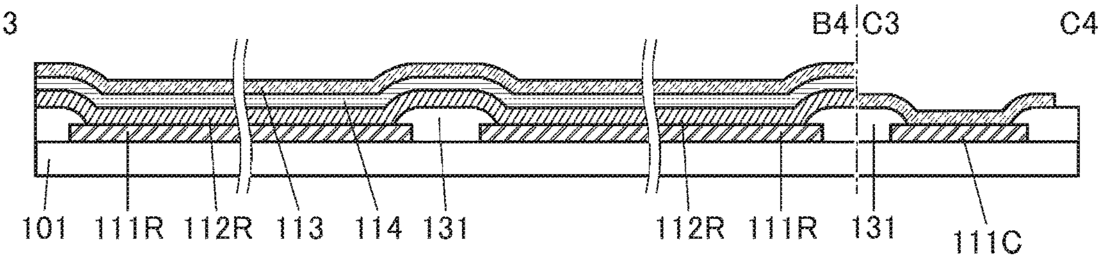
FIG. 7A to FIG. 7E are diagrams illustrating an example of a method for fabricating a display apparatus.
Figure 7B:
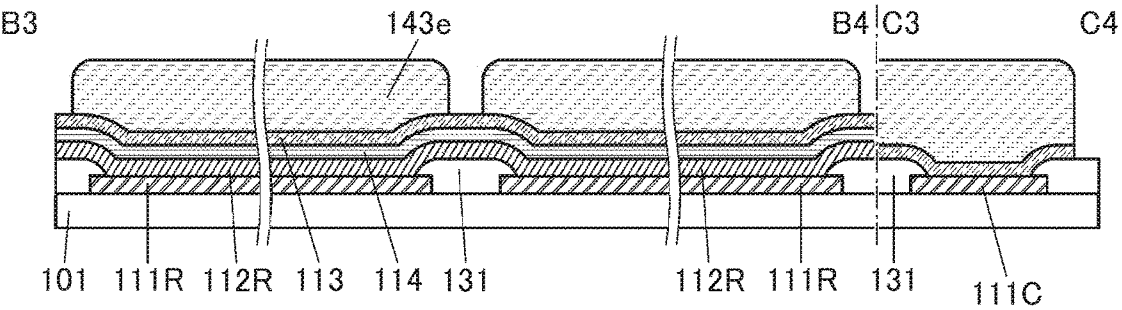

As in the fabrication method example 1, the steps up to and including formation of the common electrode 113 are sequentially performed (FIG. 7A).

Then, a plurality of resist masks 143*e* are formed over the common electrode 113. The resist mask 143*e* is formed to have a band-like top surface shape extending in the X direction. The resist mask 143*e* overlaps with the pixel electrode 111R. In addition, the resist mask 143*e* is provided such that its end portion is positioned over the insulating layer 131.

Figure 7C:
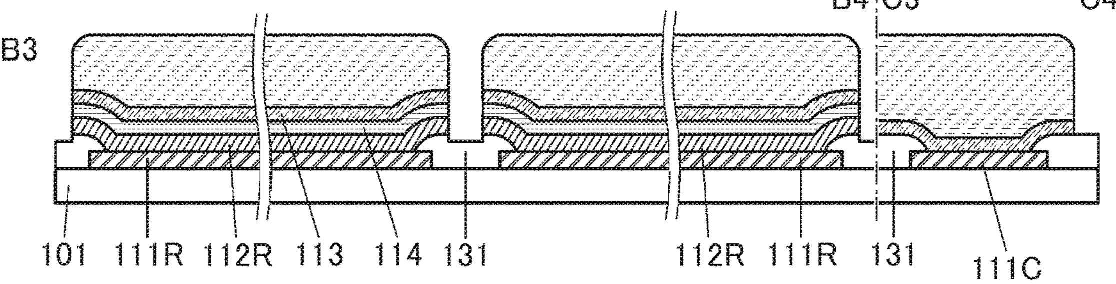

Then, portions of the common electrode 113, the EL layer 114, the EL layer 112R, the EL layer 112G (not illustrated), the EL layer 112B (not illustrated), and the EL layer 112IR (not illustrated) which are not covered with the resist mask 143*e* are removed by etching (FIG. 7C). Accordingly, the common electrode 113 and the EL layer 114 that are provided continuously to cover all the pixel electrodes are divided by slits formed by the etching, so that a plurality of band-shaped common electrodes 113 and EL layers 114 are formed.

The etching is preferably performed by dry etching. For example, it is preferable that the common electrode 113, the EL layer 114, the EL layer 112R, and the like be successively etched in this order without being exposed to the air, by switching etching gases. Furthermore, a gas not containing oxygen as a main component is preferably used as the etching gas.

In etching of the common electrode 113, the EL layer 114, the EL layer 112R, and the like, part of the insulating layer 131 may be etched to form a depressed portion in an upper portion of the insulating layer 131, as illustrated in FIG. 7C. Alternatively, a portion of the insulating layer 131 which is not covered with the resist mask 143*e* is sometimes etched and the insulating layer 131 is divided into two.

Next, the resist mask 143*e* is removed. The removal of the resist masks 143*e* can be performed by wet etching or dry etching.

Figure 7D:
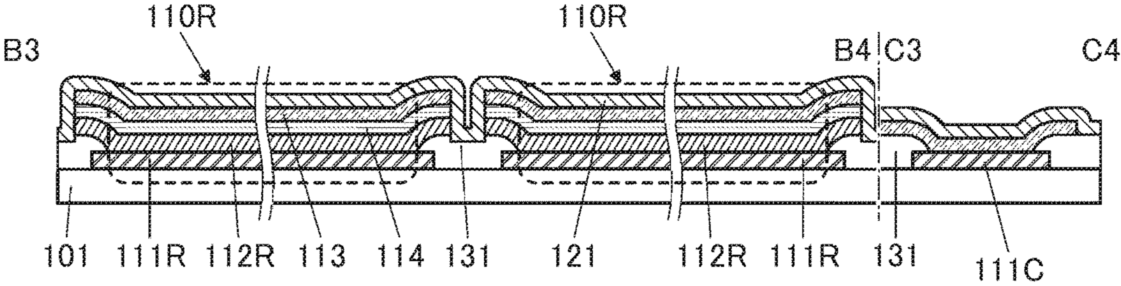

Next, the protective layer 121 is formed (FIG. 7D). The protective layer 121 is provided to cover the side surface of the common electrode 113, the side surface of the EL layer 114, and the side surface of the EL layer 112R. In addition, the protective layer 121 is preferably provided to be in contact with the top surface of the insulating layer 131.

Figure 7E:
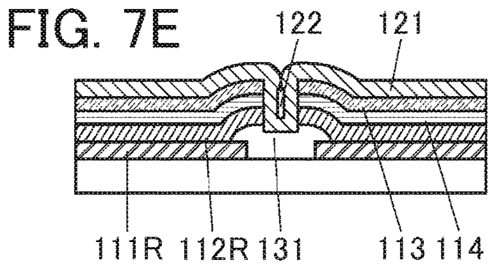

As illustrated in FIG. 7E, a gap (also referred to as an interval, a space, or the like) 122 is sometimes formed above the insulating layer 131 in formation of the protective layer 121. The gap 122 may be in a reduced-pressure state or under atmospheric pressure. In addition, the gap 122 may contain air, nitrogen, a gas such as a noble gas, a deposition gas used for formation of the protective layer 121, or the like.

The above is the description of the example of the fabrication method of the display portion 100A.

Although the resist mask 143*e* is directly formed over the common electrode 113, a film functioning as a hard mask may be provided over the common electrode 113. In this case, the hard mask is formed using the resist mask 143*e* as a mask, the resist mask is removed, and the common electrode 113, the EL layer 114, the EL layer 112R, and the like can be etched using the hard mask as a mask. Note that the hard mask may be removed or left at this time.

Variation Example

A structure example that is partly different from the above is described below. Note that the above description can be referred to for portions similar to those described above, and the description of the portions is omitted below in some cases.

Variation Example 1

Figure 8A:
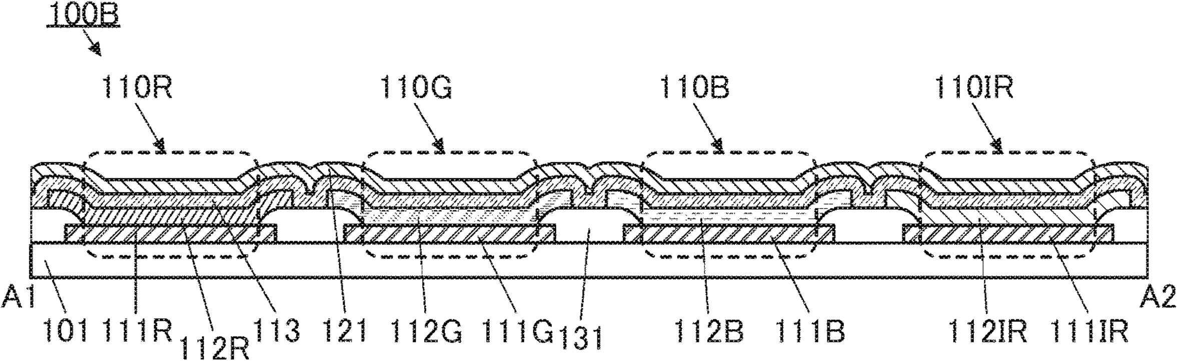
FIG. 8A to FIG. 8C are diagrams illustrating structure examples of display apparatuses.
Figure 8B:
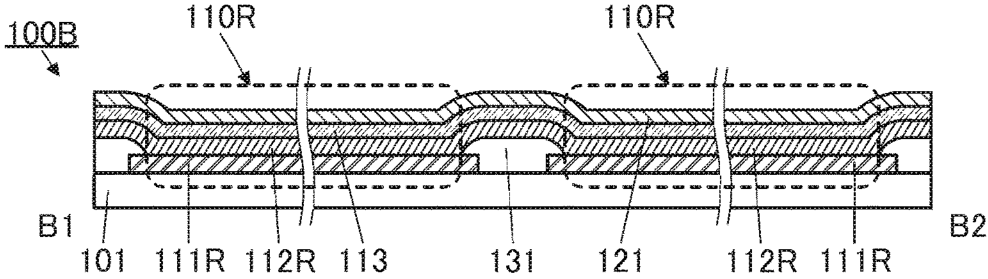

FIG. 8A and FIG. 8B are schematic cross-sectional views of a display portion 100*n*. The top view of the display portion 100B is similar to that in FIG. 2A. FIG. 8A corresponds to a cross section in the X direction, and FIG. 8B corresponds to a cross section in the Y direction.

The display portion 100B is different from the display portion 100 mainly in that the EL layer 114 that is a common layer is not included.

The common electrode 113 is provided to be in contact with the top surfaces of the EL layer 112R, the EL layer 112G, the EL layer 112B, and the EL layer 112IR. When the EL layer 114 is not provided, the light-emitting element 110R, the light-emitting element 110G, the light-emitting element 110B, and the light-emitting element 110IR can have completely different stacked-layer structures, which can increase the number of choices for a material and improve the design flexibility.

Figure 8C:
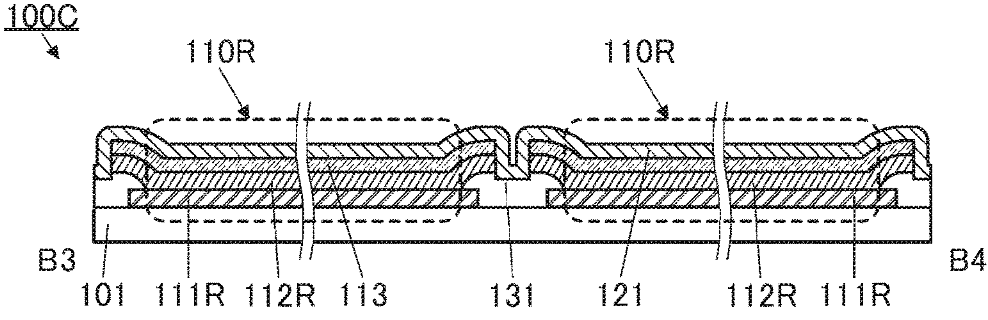

A display portion 100C illustrated in FIG. 8C is an example of a case where a slit extending in the X direction is formed in a region of the common electrode 113 overlapping with the insulating layer 131, as in the display portion 100A. In the display portion 100C, the protective layer 121 is provided to be in contact with the side surface of the common electrode 113, the side surface of the EL layer 112R, and the top surface of the insulating layer 131.

Variation Example 2

A display portion 100D illustrated in FIG. 9A and FIG. 9B is different from the display portion 100 mainly in the structures of the light-emitting elements.

The light-emitting element 110R includes an optical adjustment layer 115R between the pixel electrode 111R and the EL layer 112R. The light-emitting element 110G includes an optical adjustment layer 115G between the pixel electrode 111G and the EL layer 112G. The light-emitting element 110B includes an optical adjustment layer 115B between the pixel electrode 111B and the EL layer 112B. The light-emitting element 110IR includes an optical adjustment layer 115IR between the pixel electrode 111IR and the EL layer 112IR.

Furthermore, the optical adjustment layer 115R, the optical adjustment layer 115G, the optical adjustment layer 115B, and the optical adjustment layer 115IR each have a light-transmitting property with respect to visible light. The optical adjustment layer 115R, the optical adjustment layer 115G, the optical adjustment layer 115B, and the optical adjustment layer 115IR have different thicknesses. Thus, the optical path lengths of the light-emitting elements can differ from one another.

Here, a conductive film having a reflective property with respect to visible light is used for the pixel electrode 111R, the pixel electrode 111G, the pixel electrode 111B, and the pixel electrode 111IR, and a conductive film having a reflective property and a light-transmitting property with respect to visible light and infrared light is used for the common electrode 113. This achieves the light-emitting elements each having what is called a microcavity structure where light with a specific wavelength is intensified. Accordingly, a display apparatus having higher color purity can be achieved.

A conductive material having a light-transmitting property with respect to visible light or infrared light can be used for each of the optical adjustment layers. For example, a conductive oxide such as indium oxide, indium tin oxide, indium zinc oxide, zinc oxide, zinc oxide containing gallium, indium-tin oxide containing silicon, or an indium zinc oxide containing silicon can be used.

The optical adjustment layers can be formed after the formation of the pixel electrode 111R, the pixel electrode 111G, the pixel electrode 111B, and the pixel electrode 111IR and before the formation of the EL film 112Rf or the like. The optical adjustment layers may be formed using conductive films with different thicknesses from each other or may have a single-layer structure, a two-layer structure, or a three-layer structure, in the order of thin thickness.

A display portion 100E illustrated in FIG. 9C is an example of a case where the optical adjustment layers are employed for the display portion 100A. FIG. 9C illustrates cross sections of two light-emitting elements 110G arranged in the Y direction.

Variation Example 3

Figure 10A:
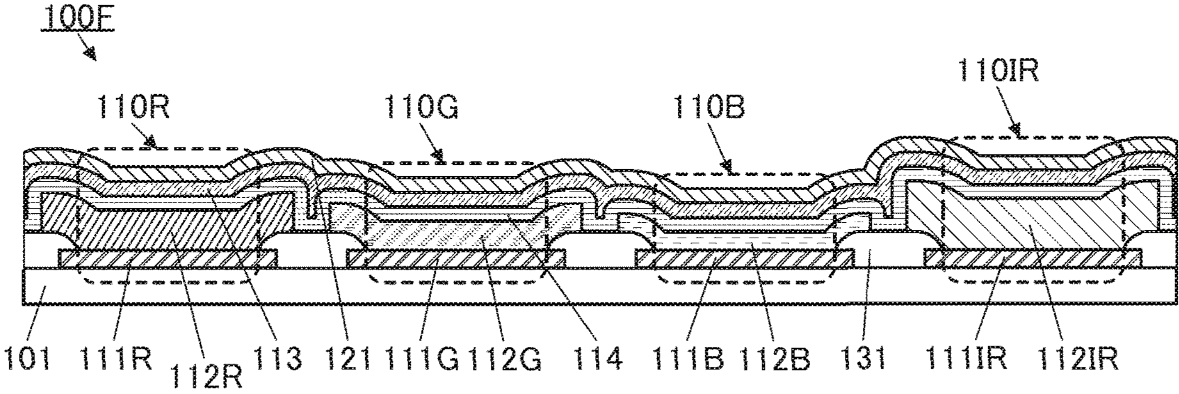
FIG. 10A to FIG. 10C are diagrams illustrating structure examples of display apparatuses.
Figure 10B:
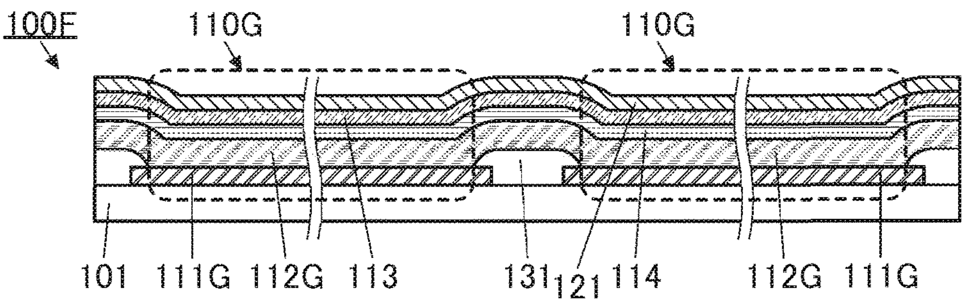

A display portion 100F illustrated in FIG. 10A and FIG. 10B is different from the display portion 100D mainly in that the optical adjustment layer is not included.

The display portion 100F is an example where a microcavity structure is achieved with the thicknesses of the EL layer 112R, the EL layer 112G, the EL layer 112B, and the EL layer 112IR Such a structure does not require an optical adjustment layer provided additionally, thereby simplifying the process.

For example, in the display portion 100F, the EL layer 112IR of the light-emitting element 110IR emitting light whose wavelength is longest has the largest thickness, and the EL layer 112B of the light-emitting element 110B emitting light whose wavelength is shortest has the smallest thickness. Without limitation to this, the thickness of the EL layer can be adjusted in consideration of the wavelength of light emitted by the light-emitting element, the optical characteristics of the layer included in the light-emitting element, the electrical characteristics of the light-emitting element, and the like.

Figure 10C:
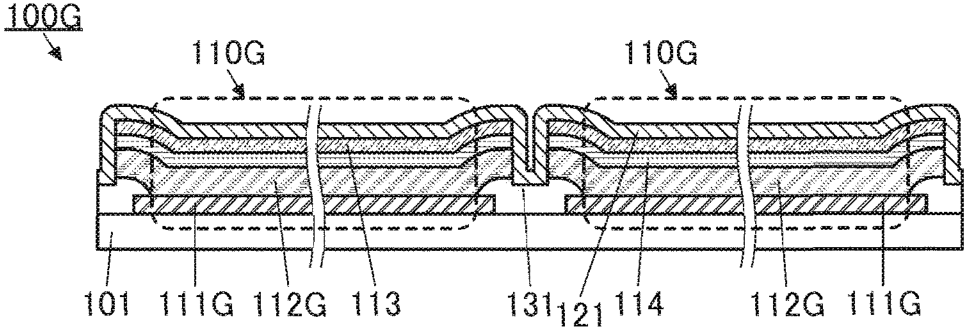

A display portion 100G illustrated in FIG. 10C is an example where a microcavity structure is achieved with different thicknesses of the EL layers of the display portion 100A. FIG. 10C illustrates cross sections of two light-emitting elements 110G arranged in the Y direction.

The above is the description of the variation examples.

Although the Variation example 2 and the Variation example 3 each describe an example where the EL layer 114 is used, the EL layer 114 is not necessarily provided.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 2

In this embodiment, structure examples of the liquid crystal display apparatus according to one embodiment of the present invention will be described.

[Display Apparatus 400A]

Figure 11A:
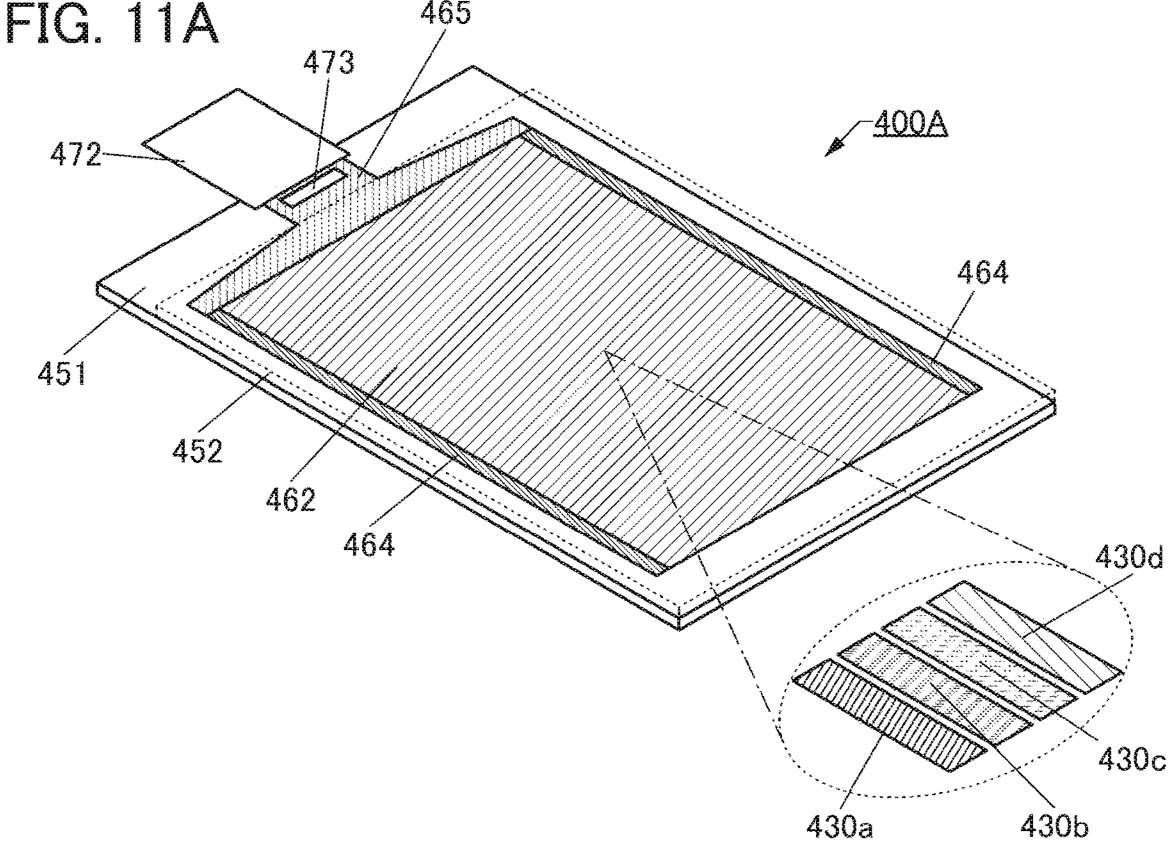
FIG. 11A to FIG. 11C are perspective views illustrating an example of a display apparatus.
Figure 11B:
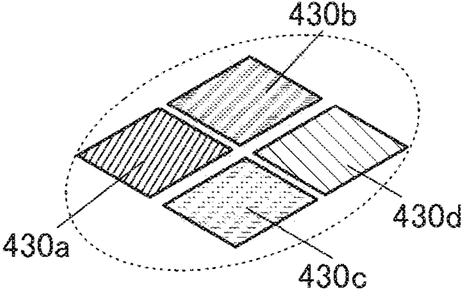
Figure 11C:
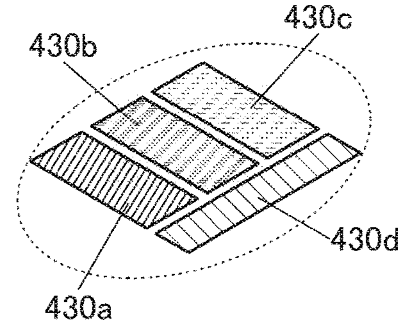
Figures 12A, 12B:
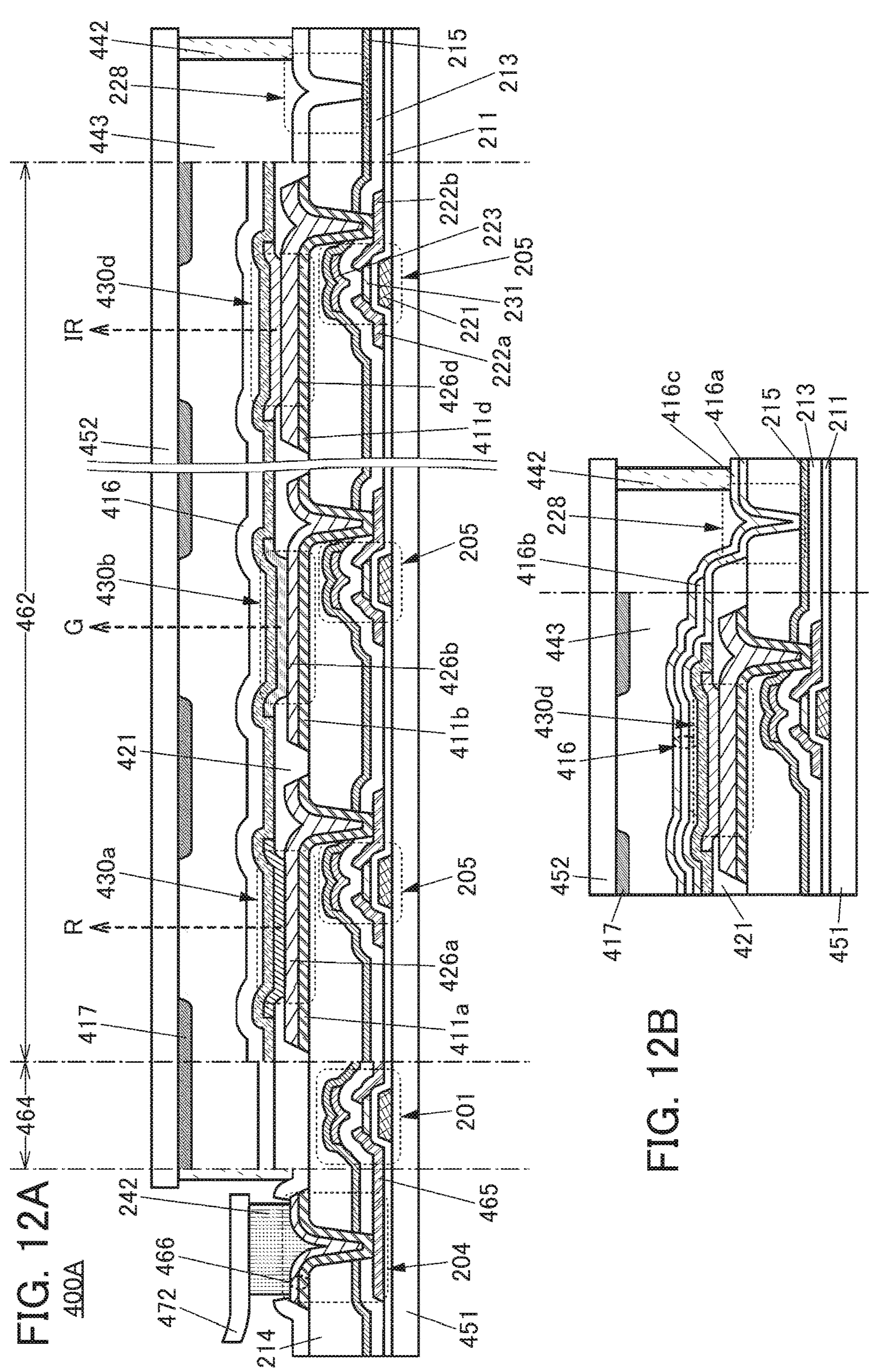
FIG. 12A and FIG. 12B are cross-sectional views illustrating an example of a display apparatus.

FIG. 11 is a perspective view of a display apparatus 400A, and FIG. 12A is a cross-sectional view of the display apparatus 400A.

The display apparatus 400A has a structure where a substrate 452 and a substrate 451 are bonded to each other. In FIG. 11, the substrate 452 is denoted by a dashed line. Here, the display apparatus described in this embodiment can be used for the display portion 100 illustrated in FIG. 1A to FIG. 1C; the substrate 451 corresponds to the substrate 101 of the display portion 100 and the substrate 452 corresponds to the substrate 102 of the display portion 100.

The display apparatus 400A includes a display portion 462, a circuit 464, a wiring 465, and the like. FIG. 11 illustrates an example where an IC 473 and an FPC 472 are mounted on the display apparatus 400A. Thus, the structure illustrated in FIG. 11 can be regarded as a display module including the display apparatus 400A, the IC (integrated circuit), and the FPC.

As the circuit 464, a scan line driver circuit can be used, for example.

The wiring 465 has a function of supplying a signal and power to the display portion 462 and the circuit 464. The signal and power are input to the wiring 465 from the outside through the FPC 472 or input to the wiring 465 from the IC 473.

FIG. 11 illustrates an example where the IC 473 is provided over the substrate 451 by a COG (Chip On Glass) method, a COF (Chip on Film) method, or the like. An IC including a scan line driver circuit or a signal line driver circuit can be used as the IC 473, for example. Note that the display apparatus 400A and the display module are not necessarily provided with an IC. The IC may be mounted on the FPC by a COF method or the like.

An enlarged view of the pixel formed in the display portion 462 is shown on the right side of FIG. 11A. The pixel formed in the display portion 462 includes light-emitting elements 430*a*, 430*b*, 430*c*, and 430*d* whose emission colors are different from each other. Here, the light-emitting element 430*a* has a function of emitting red light, the light-emitting element 430*b* has a function of emitting green light, the light-emitting element 430*c* has a function of emitting blue light, and the light-emitting element 430*d* has a function of emitting infrared light. The light-emitting element described in Embodiment 1 can be used as the light-emitting element 430*a*, the light-emitting element 430*b*, the light-emitting element 430*c*, and the light-emitting element 430*d*.

Note that the kinds of emission colors of the light-emitting elements are not limited to the above. In the case where the pixel of the display apparatus includes three kinds of subpixels besides the subpixel for infrared light, subpixels of three colors of yellow (Y), cyan (C), and magenta (M) may be used as the three subpixels. In the case where the pixel of the display apparatus includes four subpixels besides the subpixel for infrared light, subpixels of four colors of R, G, B, and white (W) or subpixels of four colors of R, G, B, and Y may be used as the four subpixels.

As illustrated in FIG. 11A, the light-emitting element 430*a* to the light-emitting element 430*d* may be arranged in a stripe pattern where the light-emitting elements are arranged in one row. The stripe pattern allows high-density arrangement of pixel circuits, enabling a high-resolution display apparatus to be provided.

Alternatively, as illustrated in FIG. 11B, the light-emitting element 430*a* to the light-emitting element 430*d* may be arranged in a matrix of 2×2. Alternatively, as illustrated in FIG. 11B, the light-emitting element 430*a* to the light-emitting element 430*d* may be arranged such that the light-emitting elements 430*a*, 430*b*, and 430*c* are laterally arranged in a row and a laterally long light-emitting element 430*d* is placed therebelow. Alternatively, although not illustrated, any of a variety of arrangement methods such as a delta arrangement and a PenTile arrangement can be employed.

FIG. 12A illustrates an example of cross sections of part of a region including the FPC 472, part of the circuit 464, part of the display portion 462, and part of a region including an end portion of the display apparatus 400A.

The display apparatus 400A illustrated in FIG. 12A includes, between the substrate 451 and the substrate 452, a transistor 201, a transistor 205, the light-emitting element 430*a* that emits red light, the light-emitting element 430*b* that emits green light, the light-emitting element 430*c* that emits blue light (not illustrated), the light-emitting element 430*d* that emits infrared light, and the like. Although the light-emitting element 430*c* is omitted in FIG. 12A and FIG. 12B for clarity of the drawings, the light-emitting element 430*c* can be provided in a manner similar to those of the light-emitting element 430*a*, the light-emitting element 430*b*, and the light-emitting element 430*d*.

A protective layer 416 and the substrate 452 are bonded to each other with an adhesive layer 442. A solid sealing structure, a hollow sealing structure, or the like can be employed to seal the light-emitting elements. In FIG. 12A, a space 443 surrounded by the substrate 452, the adhesive layer 442, and the substrate 451 is filled with an inert gas (nitrogen, argon, or the like), that is, a hollow sealing structure is employed. The adhesive layer 442 may be provided to overlap with the light-emitting element. The space 443 surrounded by the substrate 452, the adhesive layer 442, and the substrate 451 may be filled with a resin different from that of the adhesive layer 442.

The light-emitting elements 430*a*, 430*b*, 430*c*, and 430*d* each have an optical adjustment layer between the pixel electrode and the EL layer. The light-emitting element 430*a* includes an optical adjustment layer 426*a*, the light-emitting element 430*b* includes an optical adjustment layer 426*b*, the light-emitting element 430*c* includes an optical adjustment layer 426*c* (not illustrated), and the light-emitting element 430*d* includes an optical adjustment layer 426*d*. Embodiment 1 can be referred to for the details of the light-emitting elements.

Pixel electrodes 411*a*, 411*b*, 411*c* (not illustrated), and 411*d* are each connected to a conductive layer 222*b* included in the transistor 205 through an opening provided in an insulating layer 214.

The end portions of the pixel electrode and the optical adjustment layer are covered with the insulating layer 421. The pixel electrode contains a material that reflects visible light, and the counter electrode contains a material that transmits visible light and infrared light.

Light emitted from the light-emitting element is emitted to the substrate 452 side. For the substrate 452, a material having a high transmitting property with respect to visible light and infrared light is preferably used.

The transistor 201 and the transistors 205 are formed over the substrate 451. These transistors can be formed using the same materials in the same steps.

An insulating layer 211, an insulating layer 213, an insulating layer 215, and the insulating layer 214 are provided in this order over the substrate 451. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This allows the insulating layer to function as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of an end portion of the display apparatus 400A. This can inhibit entry of impurities from the end portion of the display apparatus 400A through the organic insulating film. Alternatively, the organic insulating film may be formed such that an end portion of the organic insulating film is positioned on the inner side of the end portion of the display apparatus 400A, to prevent the organic insulating film from being exposed at the end portion of the display apparatus 400A.

An organic insulating film is suitable for the insulating layer 214 functioning as a planarization layer. Examples of material that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 12A, an opening is formed in the insulating layer 214. This can inhibit entry of impurities into the display portion 462 from the outside through the insulating layer 214 even when an organic insulating film is used as the insulating layer 214. Thus, the reliability of the display apparatus 400A can be increased.

The transistor 201 and the transistor 205 each include a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate or bottom-gate transistor structure may be employed. Alternatively, gates may be provided above and below a semiconductor layer where a channel is formed.

The structure where the semiconductor layer where a channel is formed is provided between two gates is used for the transistor 201 and the transistors 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a semiconductor having crystallinity, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment. Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, the atomic ratio of In is preferably greater than or equal to the atomic ratio of Min the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 which does not overlap with the substrate 452. In the connection portion 204, the wiring 465 is electrically connected to the FPC 472 through a conductive layer 466 and a connection layer 242. An example is illustrated where the conductive layer 466 has a stacked-layer structure of a conductive film obtained by processing the same conductive film as the pixel electrode and a conductive film obtained by processing the same conductive film as the optical adjustment layer. On the top surface of the connection portion 204, the conductive layer 466 is exposed. Thus, the connection portion 204 and the FPC 472 can be electrically connected to each other through the connection layer 242.

A light-blocking layer 417 is preferably provided on a surface of the substrate 452 on the substrate 451 side. Any of a variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outer side of the substrate 452.

With the protective layer 416 covering the light-emitting element, entry of impurities such as water into the light-emitting element can be inhibited, leading to an increase in the reliability of the light-emitting element.

In the region 228 in the vicinity of the end portion of the display apparatus 400A, the insulating layer 215 and the protective layer 416 are preferably in contact with each other through the opening in the insulating layer 214. In particular, the inorganic insulating film included in the insulating layer 215 and the inorganic insulating film included in the protective layer 416 are preferably in contact with each other. Thus, entry of impurities into the display portion 462 from the outside through an organic insulating film can be inhibited. Thus, the reliability of the display apparatus 400A can be increased.

FIG. 12B illustrates an example where the protective layer 416 has a three-layer structure. In FIG. 12B, the protective layer 416 includes an inorganic insulating layer 416*a* over the light-emitting element 430*d*, an organic insulating layer 416*b* over the inorganic insulating layer 416*a*, and an inorganic insulating layer 416*c* over the organic insulating layer 416*b*.

An end portion of the inorganic insulating layer 416*a* and an end portion of the inorganic insulating layer 416*c* extend beyond an end portion of the organic insulating layer 416*b* and are in contact with each other. The inorganic insulating layer 416*a* is in contact with the insulating layer 215 (inorganic insulating layer) through the opening in the insulating layer 214 (organic insulating layer). Thus, the light-emitting element can be surrounded by the insulating layer 215 and the protective layer 416, so that the reliability of the light-emitting element can be increased.

As described above, the protective layer 416 may have a stacked-layer structure of an organic insulating film and an inorganic insulating film. In this case, an end portion of the inorganic insulating film preferably extends beyond an end portion of the organic insulating film.

For each of the substrates 451 and 452, glass, quartz, ceramics, sapphire, a resin, a metal, an alloy, a semiconductor, or the like can be used. The substrate on the side where light from the light-emitting element is extracted is formed using a material that transmits the light. For example, when used for the display portion 100 illustrated in FIG. 1A, the substrate 452 preferably has a light-transmitting property with respect to visible light and infrared light. As another example, when used for the display portion 100 illustrated in FIG. 1B and FIG. 1C, the substrate 452 preferably has a light-transmitting property with respect to visible light and infrared light, and the substrate 451 preferably has a light-transmitting property with respect to at least infrared light. When a flexible material is used for the substrate 451 and the substrate 452, the flexibility of the display apparatus can be increased. Furthermore, a polarizing plate may be used as the substrate 451 or the substrate 452.

For each of the substrate 451 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber. Glass that is thin enough to have flexibility may be used for one or both of the substrate 451 and the substrate 452.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. Alternatively, a two-component resin may be used. An adhesive sheet or the like may be used.

As the connection layer 242, an anisotropic conductive film (ACF), an anisotropic conductive paste (ACP), or the like can be used.

Examples of materials that can be used for a gate, a source, and a drain of a transistor and conductive layers functioning as wirings and electrodes included in a display apparatus include metals such as aluminum, titanium, chromium, nickel, copper, yttrium, zirconium, molybdenum, silver, tantalum, and tungsten, and an alloy containing any of these metals as its main component. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to have a light-transmitting property. A stacked-layer film of any of the above materials can be used as a conductive layer. For example, a stacked film of indium tin oxide and an alloy of silver and magnesium is preferably used because conductivity can be increased. These can also be used, for example, for conductive layers such as a variety of wirings and electrodes included in the display apparatus, or conductive layers (conductive layers functioning as the pixel electrode and the common electrode) included in the light-emitting element.

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

[Display Apparatus 400B]

Figures 13A, 13B:
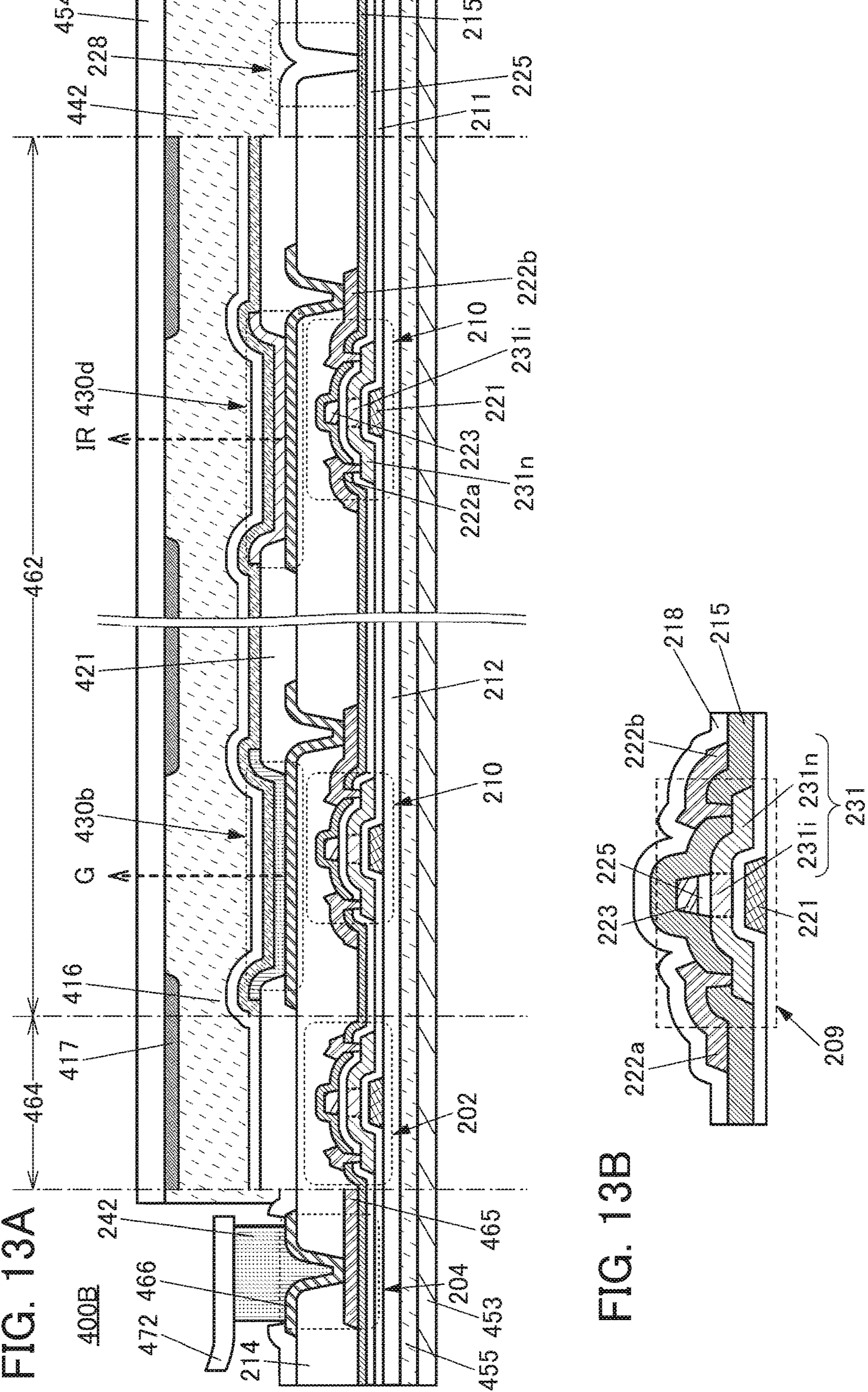
FIG. 13A is a cross-sectional view illustrating an example of a display apparatus.
FIG. 13B is a cross-sectional view illustrating a transistor example.

FIG. 13A is a cross-sectional view of a display apparatus 400B. A perspective view of the display apparatus 400B is similar to that of the display apparatus 400A (FIG. 11). FIG. 13A illustrates an example of cross sections of part of a region including the FPC 472, part of the circuit 464, and part of the display portion 462 in the display apparatus 400B. FIG. 13A specifically illustrates an example of a cross section of a region including the light-emitting element 430*b* that emits green light and the light-emitting element 430*d* that emits infrared light in the display portion 462. Note that portions similar to those of the display apparatus 400A are not described in some cases.

The display apparatus 400B illustrated in FIG. 13A includes a transistor 202, a transistor 210, the light-emitting element 430*b*, the light-emitting element 430*d*, and the like between a substrate 453 and a substrate 454. Here, the substrate 453 corresponds to the substrate 101 of the display portion 100, and the substrate 454 corresponds to the substrate 102 of the display portion 100.

The substrate 454 and the protective layer 416 are bonded to each other with the adhesive layer 442. The adhesive layer 442 is provided so as to overlap with each of the light-emitting element 430*b* and the light-emitting element 430*d*, and the display apparatus 400B employs a solid sealing structure.

The substrate 453 and the insulating layer 212 are bonded to each other with an adhesive layer 455.

In a method for fabricating the display apparatus 400B, first, a formation substrate provided with the insulating layer 212, the transistors, the light-emitting elements, and the like is bonded to the substrate 454 provided with the light-blocking layer 417 with the adhesive layer 442. Then, the substrate 453 is bonded to a surface exposed by separation of the formation substrate, whereby the components formed over the formation substrate are transferred onto the substrate 453. The substrate 453 and the substrate 454 each preferably have flexibility. This can increase the flexibility of the display apparatus 400B.

The inorganic insulating film that can be used as the insulating layer 211, the insulating layer 213, and the insulating layer 215 can be used as the insulating layer 212.

The pixel electrode is connected to the conductive layer 222*b* included in the transistor 210 through the opening provided in the insulating layer 214. The conductive layer 222*b* is connected to a low-resistance region 231*n* through an opening provided in the insulating layer 215 and an insulating layer 225. The transistor 210 has a function of controlling driving of the light-emitting element.

An end portion of the pixel electrode is covered with the insulating layer 421.

Light emitted by the light-emitting elements 430*b* and 430*d* is emitted toward the substrate 454 side. For the substrate 454, a material having a high transmitting property with respect to visible light and infrared light is preferably used.

The connection portion 204 is provided in a region of the substrate 453 which does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

The transistor 202 and the transistor 210 each include the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the low-resistance regions 231*n*, the conductive layer 222*b* connected to the other of the low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the low-resistance regions 231*n* through openings provided in the insulating layer 215. One of the conductive layer 222*a* and the conductive layer 222*b* functions as a source, and the other functions as a drain.

FIG. 13A illustrates an example where the insulating layer 225 covers the top surface and the side surface of the semiconductor layer. The conductive layer 222*a* and the conductive layer 222*b* are connected to the low-resistance regions 231*n* through openings provided in the insulating layer 225 and the insulating layer 215.

In a transistor 209 illustrated in FIG. 13B, the insulating layer 225 overlaps with the channel formation region 231*i* of the semiconductor layer 231 and does not overlap with the low-resistance regions 231*n*. The structure illustrated in FIG. 13B can be fabricated by processing the insulating layer 225 using the conductive layer 223 as a mask, for example. In FIG. 13B, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer 218 covering the transistor may be provided.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 3

In this embodiment, a structure example of a display apparatus that is different from the above will be described.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figures 14A, 14B:
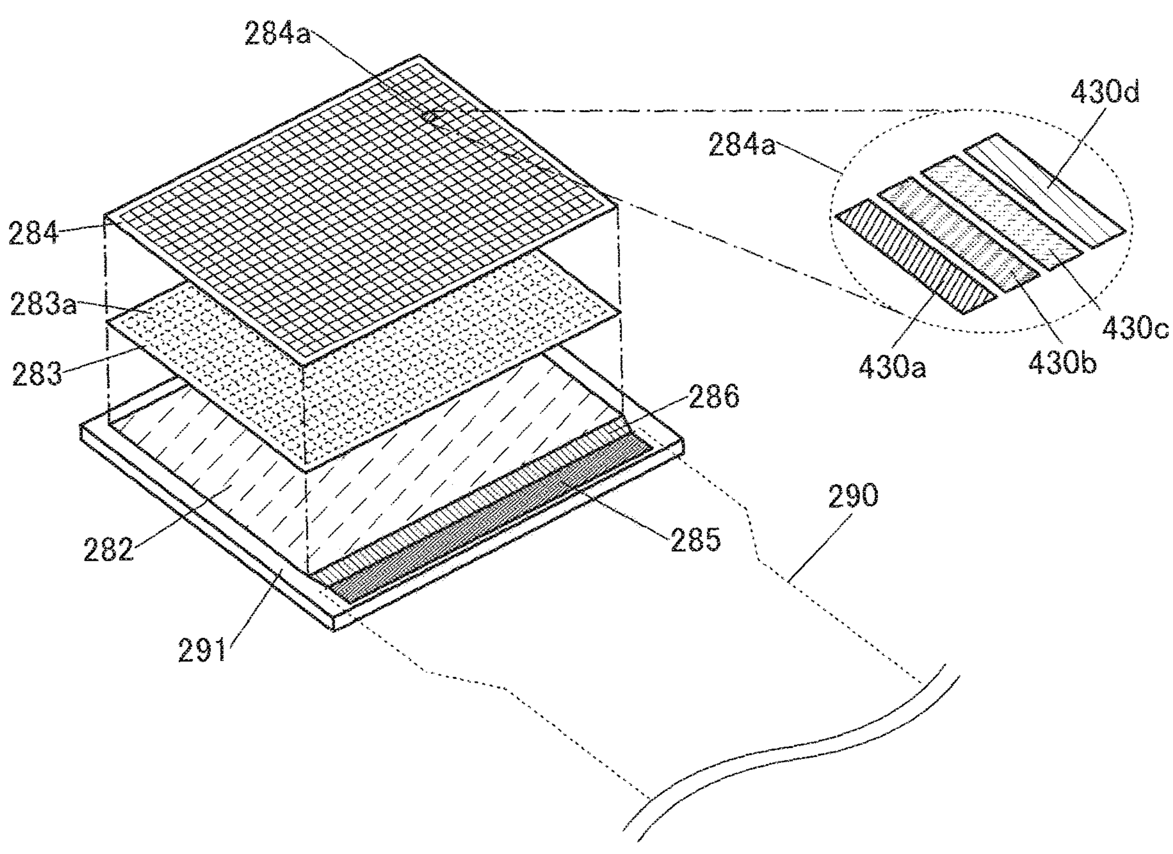
FIG. 14A and FIG. 14B are perspective views illustrating an example of a display module.

FIG. 14A is a perspective view of a display module 280. The display module 280 includes a display apparatus 400C and an FPC 290. Note that the display apparatus included in the display module 280 is not limited to the display apparatus 400C and may be a display apparatus 400D or a display apparatus 400E described later.

The display module 280 includes a substrate 291 and a substrate 292. The display module 280 includes a display portion 281. The display portion 281 is a region of the display module 280 where an image is displayed and is a region where light emitted from pixels provided in a pixel portion 284 described later can be perceived.

FIG. 14B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 14B. The pixel 284*a* includes the light-emitting elements 430*a*, 430*b*, 430*c*, and 430*d* whose emission colors are different from each other. The plurality of light-emitting elements may be arranged in a stripe arrangement as illustrated in FIG. 14B. With the stripe arrangement that enables high-density arrangement of pixel circuits, a high-resolution display apparatus can be provided. Alternatively, the plurality of light-emitting elements may be arranged as illustrated in FIG. 11B and FIG. 11C. Alternatively, a variety of arrangement methods such as a delta arrangement and a PenTile arrangement can be employed.

The pixel circuit portion 283 includes a plurality of pixel circuits 283*a* arranged periodically.

One pixel circuit 283*a* is a circuit that controls light emission of three light-emitting elements included in one pixel 284*a*. One pixel circuit 283*a* may be provided with three circuits for controlling light emission of the respective light-emitting elements. For example, the pixel circuit 283*a* for one light-emitting element can include at least one selection transistor, one current control transistor (driving transistor), and a capacitor. In this case, a gate signal is input to a gate of the selection transistor and a source signal is input to one of a source and a drain thereof. With such a structure, an active-matrix display apparatus is achieved.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, power supply potential, or the like to the circuit portion 282 from the outside. In addition, an IC may be mounted on the FPC 290.

The display module 280 can have a structure where one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be higher than or equal to 40% and lower than 100%, preferably higher than or equal to 50% and lower than or equal to 95%, and further preferably higher than or equal to 60% and lower than or equal to 95%. Furthermore, the pixels 284*a* can be arranged extremely densely and thus the display portion 281 can have extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

The display module 280 has an extremely high resolution, and thus can be suitably used for a device for VR such as a head-mounted display or a glasses-type device for AR. For example, even in the case of a structure where the display portion of the display module 280 is perceived through a lens, pixels of the extremely-high-resolution display portion 281 included in the display module 280 are prevented from being perceived when the display portion is enlarged by the lens, so that display providing a high sense of immersion can be performed. Without limitation to the above, the display module 280 can also be suitably used for an electronic device having a relatively small display portion. For example, the display module 280 can be suitably used for a display portion of a wearable electronic device such as a wrist watch.

[Display Apparatus 400C]

Figure 15:
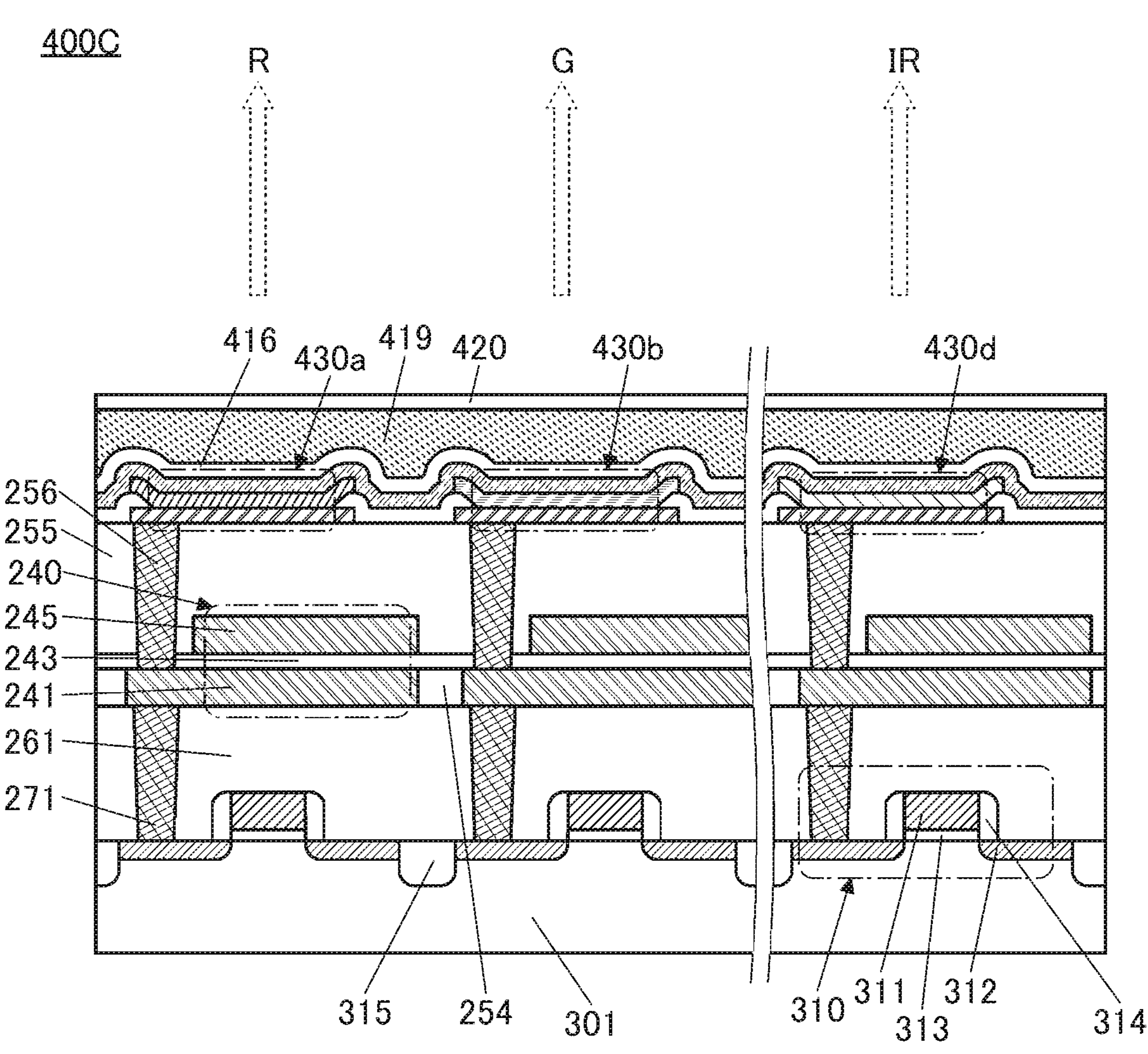
FIG. 15 is a cross-sectional view illustrating an example of a display apparatus.

The display apparatus 400C illustrated in FIG. 15 includes a substrate 301, the light-emitting elements 430*a*, 430*b*, 430*c* (not illustrated), and 430*d*, a capacitor 240, and a transistor 310. Although, the light-emitting element 430*c* is omitted in FIG. 15 to FIG. 17 for clarity of the drawings, the light-emitting element 430*c* can be provided in a manner similar to those of the light-emitting element 430*a*, the light-emitting element 430*b*, and the light-emitting element 430*d*.

The substrate 301 corresponds to the substrate 291 in FIG. 14A and FIG. 14B. A stacked-layer structure including the substrate 301 and components up to an insulating layer 255 corresponds to the substrate in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover a side surface of the conductive layer 311 and functions as an insulating layer.

In addition, an element isolation layer 315 is provided between two adjacent transistors 310 to be embedded in the substrate 301.

Furthermore, an insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of a source and a drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240, and the light-emitting elements 430*a*, 430*b*, 430*c* (not illustrated), 430*d*, and the like are provided over the insulating layer 255. The protective layer 416 is provided over the light-emitting elements 430*a*, 430*b*, 430*c* (not illustrated), and 430*d*, and a substrate 420 is bonded to the top surface of the protective layer 416 with a resin layer 419. The substrate 420 corresponds to the substrate 292 in FIG. 14A.

The pixel electrode of the light-emitting element is electrically connected to one of the source and the drain of the transistor 310 through a plug 256 embedded in the insulating layer 255, the conductive layer 241 embedded in the insulating layer 254, and the plug 271 embedded in the insulating layer 261.

[Display Apparatus 400D]

Figure 16:
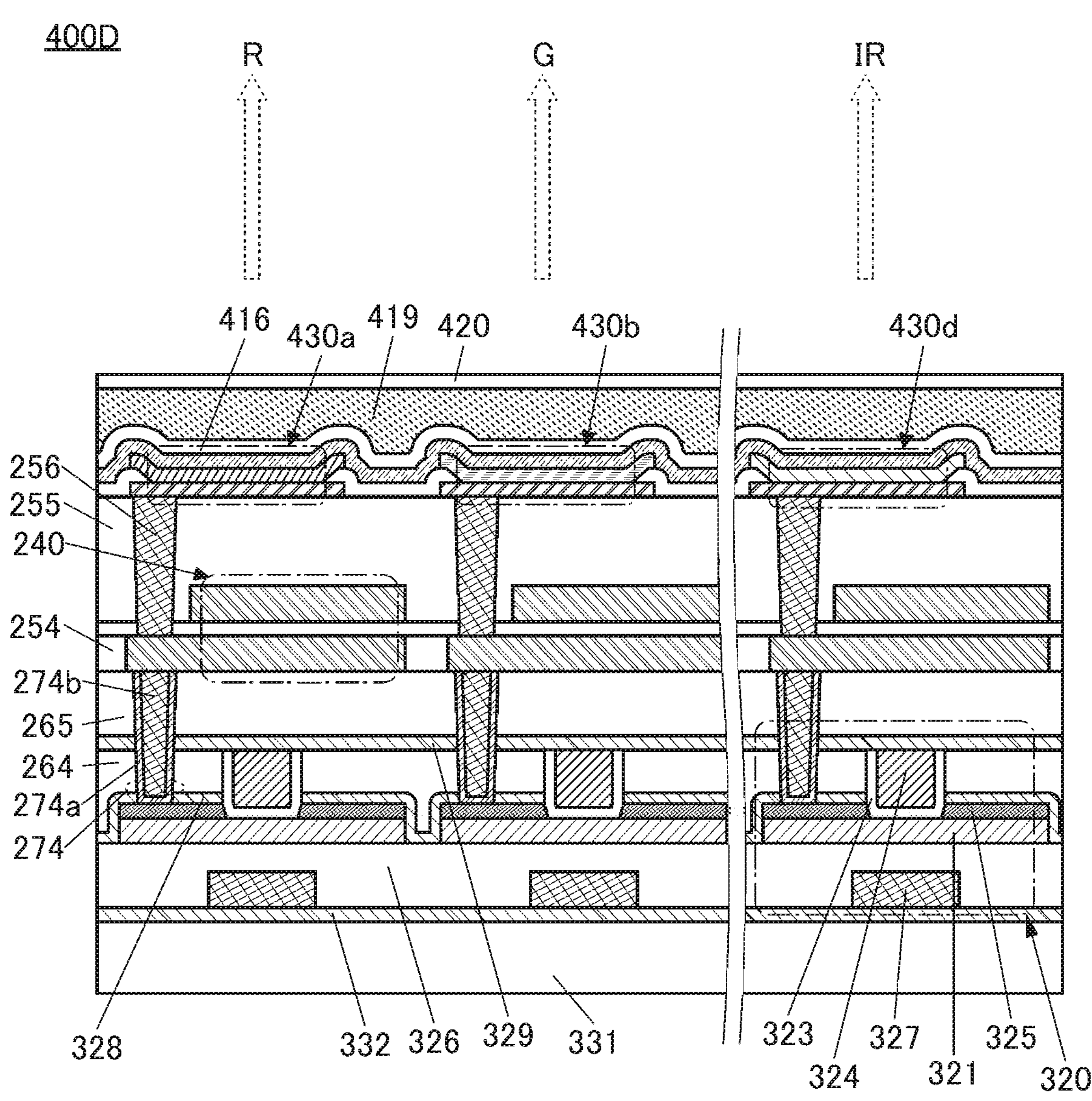
FIG. 16 is a cross-sectional view illustrating an example of a display apparatus.

The display apparatus 400D illustrated in FIG. 16 differs from the display apparatus 400C mainly in a structure of a transistor. Note that portions similar to those of the display apparatus 400C are not described in some cases.

A transistor 320 is a transistor in which a metal oxide (also referred to as an oxide semiconductor) is used in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 illustrated in FIG. 14A and FIG. 14B. The stacked-layer structure including the substrate 331 and components up to the insulating layer 255 corresponds to the substrate in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. For at least part of the insulating layer 326 that is in contact with the semiconductor layer 321, an oxide insulating film such as a silicon oxide film is preferably used. In addition, the top surface of the insulating layer 326 is preferably planarized.

The semiconductor layer 321 is provided over the insulating layer 326. The semiconductor layer 321 preferably includes a film of a metal oxide exhibiting semiconductor characteristics (also referred to as an oxide semiconductor). The material that can be suitably used for the semiconductor layer 321 is described in detail later.

The pair of conductive layers 325 is provided over and in contact with the semiconductor layer 321, and functions as a source electrode and a drain electrode.

An insulating layer 328 is provided to cover top surfaces and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 or the like to the semiconductor layer 321 and release of oxygen from the semiconductor layer 321. As the insulating layer 328, an insulating film similar to the insulating layer 332 can be used.

An opening portion reaching the semiconductor layer 321 is provided in the insulating layer 328 and the insulating layer 264. The insulating layer 323 that is in contact with side surfaces of the insulating layer 264, the insulating layer 328, and the conductive layer 325 and the top surface of the semiconductor layer 321, and the conductive layer 324 are embedded in the opening. The conductive layer 324 functions as a second gate electrode and part of the insulating layer 323 functions as a second gate insulating layer.

The top surface of the conductive layer 324, the top surface of the insulating layer 323, and the top surface of the insulating layer 264 are subjected to planarization treatment so that they are substantially level with each other, and an insulating layer 329 and an insulating layer 265 are provided to cover these layers.

The insulating layer 264 and the insulating layer 265 function as interlayer insulating layers. The insulating layer 329 functions as a barrier layer that prevents diffusion of impurities such as water and hydrogen from the insulating layer 265 or the like to the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer **274*a* that covers a side surface of an opening portion formed in the insulating layer 265, the insulating layer 329, the insulating layer 264, and the insulating layer 328 and part of the top surface of the conductive layer 325, and a conductive layer 274*b* in contact with the top surface of the conductive layer 274*a*. In this case, a conductive material in which hydrogen and oxygen are unlikely to be diffused is preferably used for the conductive layer 274*a***.

A structure including the insulating layer 254 and components up to the substrate 420 in the display apparatus 400D is similar to that of the display apparatus 400C.

[Display Apparatus 400E]

Figure 17:
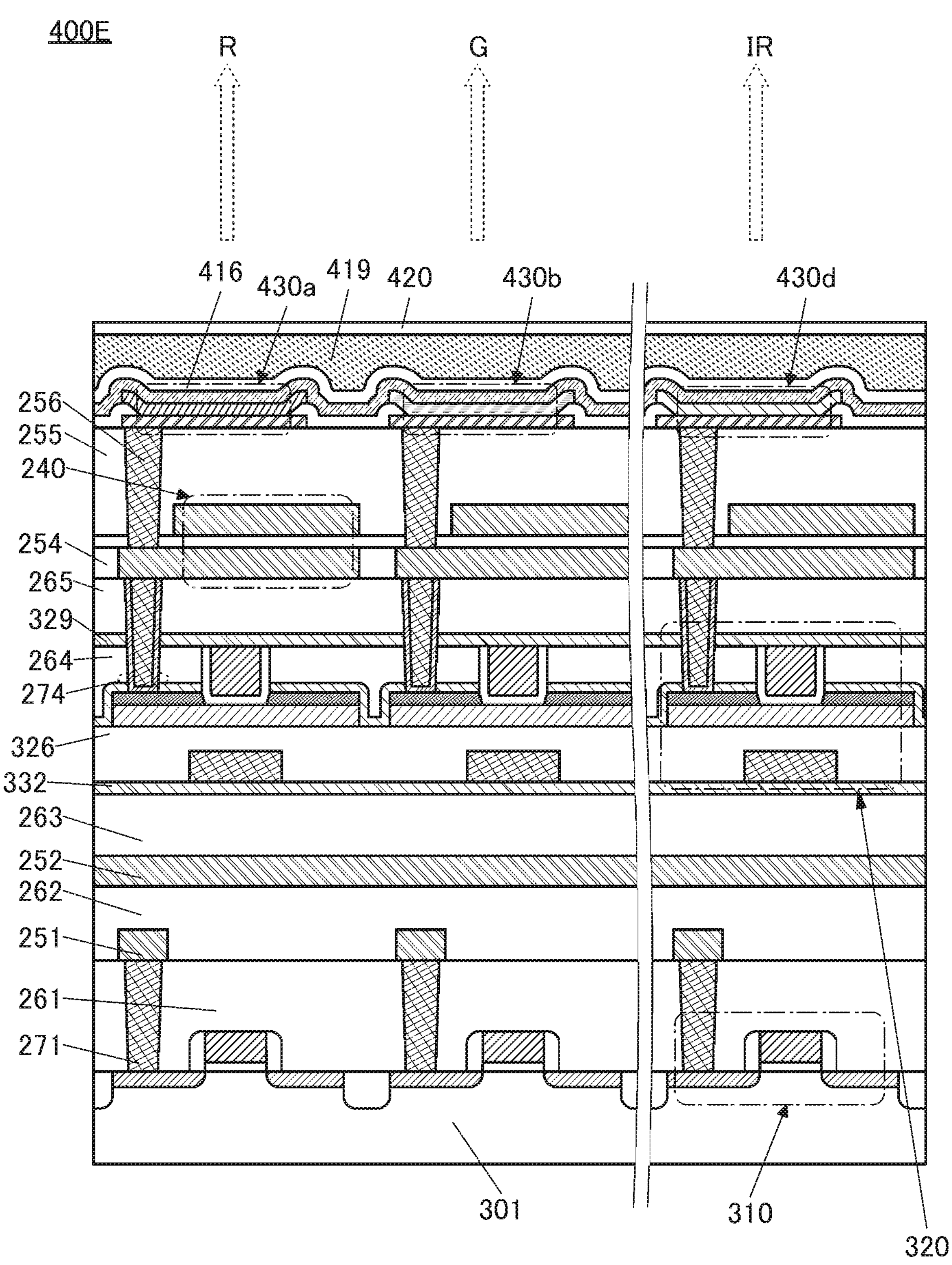
FIG. 17 is a cross-sectional view illustrating an example of a display apparatus.

The display apparatus 400E illustrated in FIG. 17 has a structure where the transistor 310 whose channel is formed in the substrate 301 and the transistor 320 including a metal oxide in the semiconductor layer where the channel is formed are stacked. Note that portions similar to those of the display apparatuses 400C and 400D are not described in some cases.

The insulating layer 261 is provided to cover the transistor 310 and a conductive layer 251 is provided over the insulating layer 261. In addition, an insulating layer 262 is provided to cover the conductive layer 251 and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in a pixel circuit. The transistor 310 can also be used as a transistor included in a pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit or the like can be formed directly under the light-emitting element; thus, the display apparatus can be downsized as compared with the case where the driver circuit is provided around a display region.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 4

In this embodiment, light-emitting elements (also referred to as light-emitting devices) that can be used in a display apparatus of one embodiment of the present invention will be described.

<Structure Example of Light-Emitting Element>

Figure 18A:
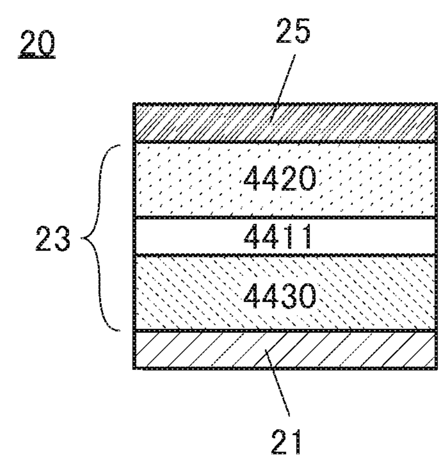
FIG. 18A to FIG. 18D are diagrams illustrating structure examples of a light-emitting element.

As illustrated in FIG. 18A, the light-emitting element includes an EL layer 23 between a pair of electrodes (a lower electrode 21 and an upper electrode 25). The EL layer 23 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can serve as a single light-emitting unit, and the structure in FIG. 18A is referred to as a single structure in this specification.

Figure 18B:
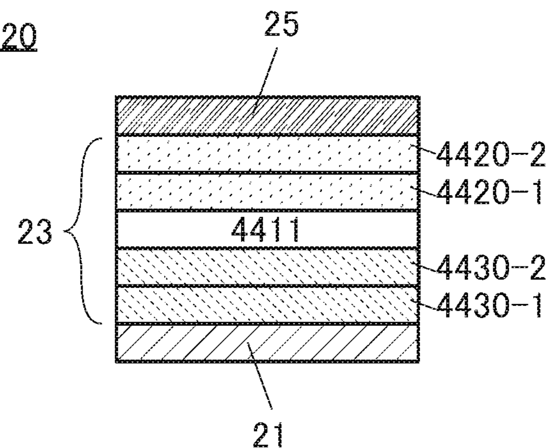

FIG. 18B illustrates a variation example of the EL layer 23 included in the light-emitting element 20 illustrated in FIG. 18A. Specifically, the light-emitting element 20 illustrated in FIG. 18B includes a layer 4430-1 over the lower electrode 21, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 25 over the layer 4420-2. For example, when the lower electrode 21 functions as an anode and the upper electrode 25 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 21 functions as a cathode and the upper electrode 25 functions as an anode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layer structure, carriers can be efficiently injected to the light-emitting layer 4411, and the efficiency of the recombination of carriers in the light-emitting layer 4411 can be enhanced.

Figure 18C:
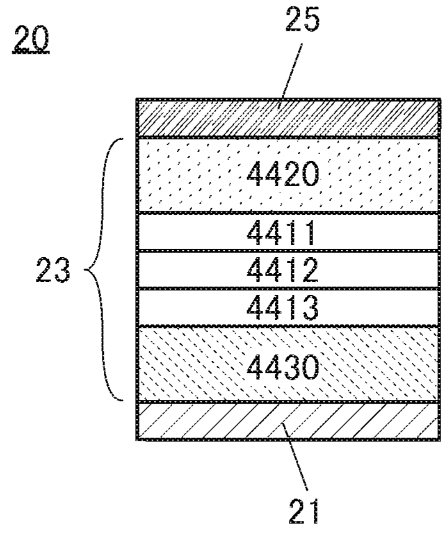

Note that the structure where a plurality of light-emitting layers (light-emitting layers 4411, 4412, and 4413) are provided between the layer 4420 and the layer 4430 as illustrated in FIG. 18C is a variation of the single structure.

Figure 18D:
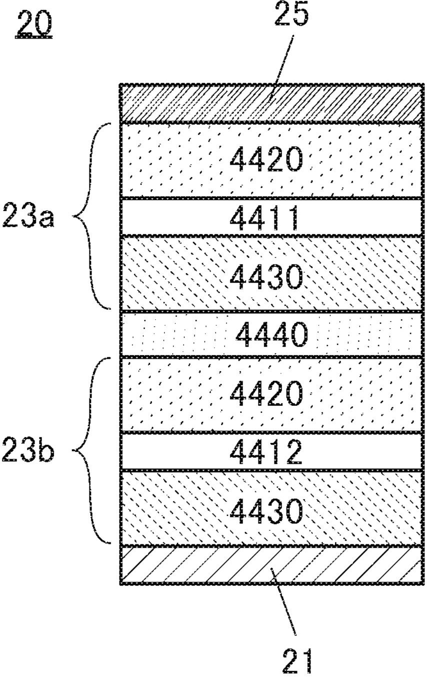

The structure where a plurality of light-emitting units (an EL layer 23*a* and an EL layer 23*b*) are connected in series with an intermediate layer (charge-generation layer) 4440 therebetween as illustrated in FIG. 18D is referred to as a tandem structure in this specification. In this specification and the like, the structure illustrated in FIG. 18D is referred to as a tandem structure; however, without being limited to this, a tandem structure may be referred to as a stack structure, for example. Note that the tandem structure enables a light-emitting element capable of high luminance light emission.

In FIG. 18C and FIG. 18D, the layer 4420 and the layer 4430 may each have a stacked-layer structure of two or more layers as illustrated in FIG. 18B.

Moreover, in this specification and the like, a structure where light-emitting layers in light-emitting elements of different colors (here, blue (B), green (G), red (R), and infrared light (IR)) are separately formed or separately patterned is sometimes referred to as an SBS (Side By Side) structure.

The emission color of the light-emitting element can be red, green, blue, cyan, magenta, yellow, white, infrared light, or the like depending on the material that constitutes the EL layer 23. Furthermore, the color purity can be further increased when the light-emitting element has a microcavity structure.

In this specification and the like, a light-emitting device capable of emitting white light is sometimes referred to as a white-light-emitting device. Note that a white light-emitting device that is combined with coloring layers (e.g., color filters) can be a light-emitting device of full-color display.

Structures of light-emitting devices can be classified roughly into a single structure and a tandem structure. A device with a single structure includes one light-emitting unit between a pair of electrodes, and the light-emitting unit preferably includes one or more light-emitting layers. To obtain white light emission, two or more light-emitting layers are selected such that their emission colors are complementary. For example, when the emission color of a first light-emitting layer and the emission color of a second light-emitting layer are complementary colors, the light-emitting device can be configured to emit white light as a whole. The same applies to a light-emitting device including three or more light-emitting layers.

A light-emitting device having a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to that in the case of a single structure. In the device with a tandem structure, it is preferable that an intermediate layer such as a charge-generation layer be provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

The light-emitting layer of the white-light-emitting device may have a structure containing two or more selected from light-emitting substances that emit light of red (R), green (G), blue (B), yellow (Y), orange (O), and the like. Alternatively, the light-emitting layer may contain two or more light-emitting substances that emit light containing two or more of spectral components of R, G, and B.

Here, a specific structure example of the light-emitting element is described.

The light-emitting element includes at least the light-emitting layer. The light-emitting element may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron- and hole-transport properties), or the like.

Either a low molecular compound or a high molecular compound can be used for the light-emitting device, and an inorganic compound may also be included. Each of the layers included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer.

The hole-injection layer is a layer that injects holes from an anode to the hole-transport layer, and a layer containing a material with a high hole-injection property. Examples of the material with a high hole-injection property include an aromatic amine compound and a composite material containing a hole-transport material and an acceptor material (electron-accepting material).

The hole-transport layer is a layer that transports holes, which are injected from the anode by the hole-injection layer, to the light-emitting layer. The hole-transport layer is a layer containing a hole-transport material. As the hole-transport material, a substance having a hole mobility greater than or equal to $10^{-6}$ $cm^2/Vs$ is preferable. Note that other substances can also be used as long as they have a property of transporting more holes than electrons. As the hole-transport material, materials having a high hole-transport property, such as a Tc-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by the electron-injection layer, to the light-emitting layer. The electron-transport layer is a layer containing an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a Tc-electron deficient heteroaromatic compound such as a nitrogen-containing heteroaromatic compound.

The electron-injection layer is a layer that injects electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using, for example, an alkali metal, an alkaline earth metal, or a compound thereof, such as lithium, cesium, lithium fluoride (LiF), cesium fluoride (CsF), calcium fluoride ($CaF_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate.

Alternatively, the electron-injection layer may be formed using a material having an electron-transport property. For example, a compound having an unshared electron pair and an electron deficient heteroaromatic ring can be used as the material having an electron-transport property. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 5

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

A crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film formed at room temperature. Thus, it is suggested that the IGZO film formed at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at or around 2θ of 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like is included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure where a clear grain boundary is observed is what is called a polycrystal structure. It is highly probable that the grain boundary becomes a recombination center and captures carriers and thus decreases the on-state current or field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has a small amount of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In]

in the second region and [Ga] lower than [Ga] in the second region. Moreover, the second region has [Ga] higher than [Ga] in the first region and [In] lower than [In] in the first region.

Specifically, the first region is a region including indium oxide, indium zinc oxide, or the like as its main component. The second region is a region including gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure where metal elements are unevenly distributed.

The CAC-OS can be formed by a sputtering method under a condition where intentional heating is not performed on a substrate, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure where the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region has a higher insulating property than the first region. In other words, when the second regions are distributed in a metal oxide, a leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

A transistor using the CAC-OS has high reliability. Thus, the CAC-OS is most suitable for a variety of semiconductor devices such as display apparatuses.

An oxide semiconductor can have any of various structures that show different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the oxide semiconductor is used for a transistor will be described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$ and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. A transistor whose channel formation region is formed in an oxide semiconductor having a high density of trap states has unstable electrical characteristics in some cases.

In order to obtain stable electrical characteristics of a transistor, it is effective to reduce the impurity concentration in the oxide semiconductor. In order to reduce the impurity concentration in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

The influence of impurities in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ $atoms/cm^3$, preferably lower than or equal to $2\times10^{17}$ $atoms/cm^3$.

When the oxide semiconductor contains an alkali metal or an alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ $atoms/cm^3$, preferably lower than or equal to $2\times10^{16}$ $atoms/cm^3$.

When the oxide semiconductor contains nitrogen, the oxide semiconductor easily becomes n-type because of generation of electrons serving as carriers and an increase in carrier concentration. A transistor including, as a semiconductor, an oxide semiconductor containing nitrogen tends to have normally-on characteristics. When nitrogen is contained in the oxide semiconductor, a trap state is sometimes formed. This might make the electrical characteristics of the transistor unstable. Thus, the nitrogen concentration in the oxide semiconductor, which is obtained by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor including an oxide semiconductor containing hydrogen tends to have normally-on characteristics. For this reason, hydrogen in the oxide semiconductor is preferably reduced as much as possible. Specifically, the hydrogen concentration in the oxide semiconductor, which is obtained by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, stable electrical characteristics can be given.

At least part of this embodiment can be implemented in combination with the other embodiments described in this specification as appropriate.

Embodiment 6

In this embodiment, examples of a package and a sensor module each including an image sensor chip will be described. The package and the sensor module each including an image sensor chip can be used for the sensor portion 104 illustrated in FIG. 1A to FIG. 1C.

Here, the image sensor chip includes a pixel portion in which a plurality of light-receiving elements are arranged in a matrix, a driver circuit controlling the pixel portion, and the like. A photodiode in which a photoelectric conversion layer is formed in a silicon substrate can be used as the light-receiving element, for example.

The photoelectric conversion layer is provided over the pixel portion, in other words, in a direction where incident light enters. When a wavelength cut filter is used for the photoelectric conversion layer, an image corresponding to the wavelength region of the wavelength cut filter can be obtained. Thus, when a filter that blocks light with a wavelength shorter than or equal to that of visible light is used for the photoelectric conversion layer, the light-receiving element can function as an infrared sensor. When a filter that blocks light with a wavelength shorter than or equal to that of near infrared light is used for the photoelectric conversion layer, the light-receiving element can function as a far-infrared sensor.

In addition, the wavelength cut filters of the photoelectric conversion layers may be assigned to different pixels. For example, a filter that blocks light with a wavelength shorter than or equal to that of visible light and a color filter can be used for the photoelectric conversion layer. When color filters of R (red), G (green), B (blue), Y (yellow), C (cyan), M (magenta), and the like are assigned to different pixels, a color image can be obtained while a function of an infrared sensor is achieved.

The photodiode can also be formed using a compound semiconductor. The use of the compound semiconductor, which can change the bandgap depending on the combination of constituent elements and the atomic ratio of the elements, enables formation of a photodiode having sensitivity to infrared light. For example, to form a photodiode having sensitivity to light from visible light to mid-infrared light, InGaAs or the like may be used for the photoelectric conversion layer.

FIG. 19A1 is an external perspective view of the top surface side of a package including an image sensor chip. The package includes a package substrate 610 to which an image sensor chip 650 is fixed, a cover glass 620, an adhesive 630 for bonding them, and the like.

FIG. 19A2 is an external perspective view of the bottom surface side of the package. A BGA (Ball grid array) in which solder balls are used as bumps 640 on the bottom surface of the package is employed. Note that, other than the BGA, an LGA (Land grid array), a PGA (Pin Grid Array), or the like may be employed.

FIG. 19A3 is a perspective view of the package, in which parts of the cover glass 620 and the adhesive 630 are not shown. Electrode pads 660 are formed over the package substrate 610, and the electrode pads 660 and the bumps 640 are electrically connected to each other via through-holes. The electrode pads 660 are electrically connected to the image sensor chip 650 through wires 670.

FIG. 19B1 is an external perspective view of the top surface side of a sensor module including an image sensor chip in a package with a built-in lens. The sensor module includes a package substrate 611 to which an image sensor chip 651 is fixed, a lens cover 621, a lens 635, and the like. Furthermore, an IC chip 690 having functions of a driver circuit, a signal conversion circuit, and the like of the light-receiving element is provided between the package substrate 611 and the image sensor chip 651; thus, the structure as an SiP (System in package) is included.

FIG. 19B2 is an external perspective view of the bottom surface side of the sensor module. A QFN (Quad flat no-lead package) structure where lands 641 for mounting are provided on the bottom surface and side surfaces of the package substrate 611 is employed. Note that this structure is only an example, and a QFP (Quad flat package) or the above-mentioned BGA may also be provided.

FIG. 19B3 is a perspective view of the module, in which parts of the lens cover 621 and the lens 635 are not shown. The lands 641 are electrically connected to electrode pads 661, and the electrode pads 661 are electrically connected to the image sensor chip 651 or the IC chip 690 through wires 671.

The image sensor chip included in a package having the above-described form can be easily mounted on a printed circuit board or the like, and the image sensor chip can be incorporated in a variety of semiconductor devices and electronic devices.

This embodiment can be combined with the description of the other embodiments as appropriate.

Embodiment 7

In this embodiment, electronic devices in which the display apparatus of one embodiment of the present invention can be used will be described with reference to FIG. 20 to FIG. 23.

The electronic devices in this embodiment each include the display apparatus of one embodiment of the present invention. The resolution, definition, and size of the display apparatus of one embodiment of the present invention are easily increased. Thus, the display apparatus of one embodiment of the present invention can be used for display portions of a variety of electronic devices.

In addition, the display apparatus of one embodiment of the present invention can be manufactured at low cost, which leads to a reduction in manufacturing cost of an electronic device.

Examples of electronic devices include a digital camera, a digital video camera, a digital photo frame, a mobile phone, a portable game console, a smartphone, a watch-type terminal, a tablet terminal, a portable information terminal, and an audio reproducing device in addition to electronic devices with a relatively large screen, such as a television device, a desktop or laptop personal computer, a monitor of a computer or the like, digital signage, and a large game machine like a pachinko machine.

In particular, the display apparatus of one embodiment of the present invention can have a high resolution, and thus can be favorably used for an electronic device having a relatively small display portion. Examples of such an electronic device include a watch-type or bracelet-type information terminal device (wearable device); and a wearable device worn on a head, such as a device for VR such as a head mounted display and a glasses-type device for AR. Examples of wearable devices include a device for substitutional reality (SR) and a device for mixed reality (MR).

The definition of the display apparatus of one embodiment of the present invention is preferably as high as HD (number of pixels: 1280×720), FHD (number of pixels: 1920×1080), WQHID (number of pixels: 2560×1440), WQXGA (number of pixels: 2560×1600), 4K2K (number of pixels: 3840×2160), or 8K4K (number of pixels: 7680×4320). In particular, the resolution of 4K2K, 8K4K, or higher is preferable. Furthermore, the pixel density (resolution) of the display apparatus of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display apparatus with a high definition and a high resolution, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, the electronic device can display an image, information, and the like on a display portion. When the electronic device includes the antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 20A:
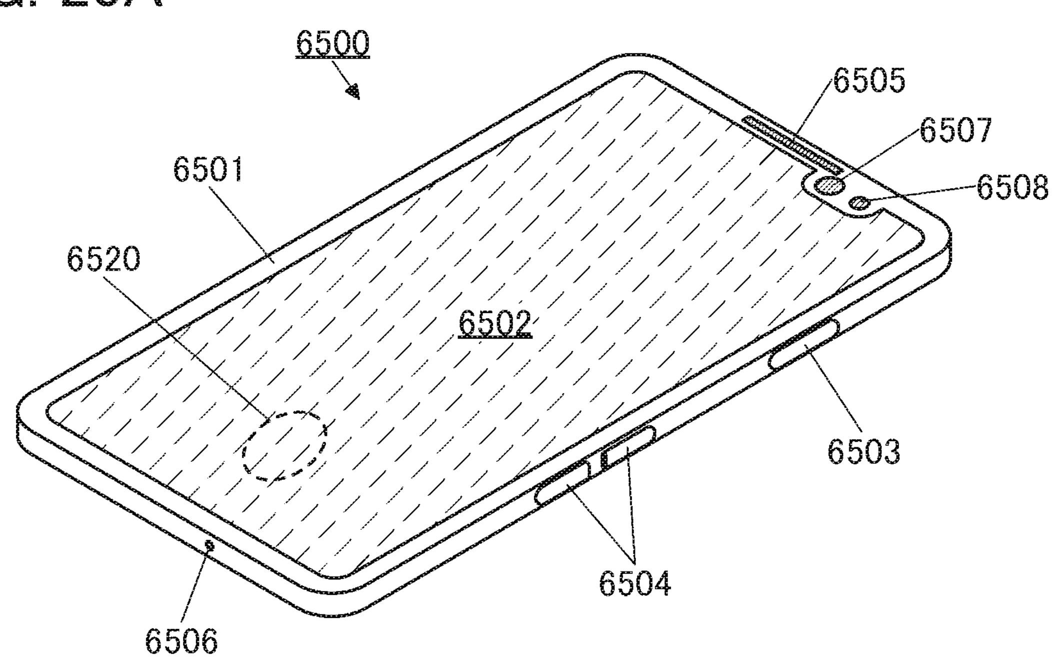
FIG. 20A and FIG. 20B are diagrams illustrating an example of an electronic device.

An electronic device 6500 illustrated in FIG. 20A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, a sensor portion 6520, and the like. The display portion 6502 has a touch panel function.

Figure 1C:
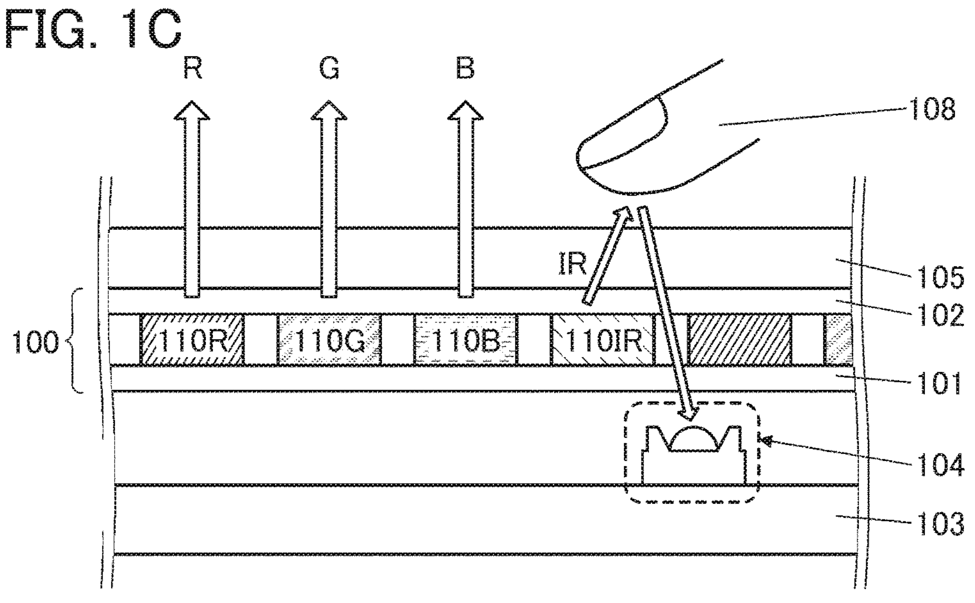

The display portion 6502 corresponds to the display portion 100 illustrated in FIG. 1A to FIG. 1C, and can be formed using, for example, the display apparatus 400A illustrated in FIG. 12A and FIG. 12B or the display apparatus 400B illustrated in FIG. 13A and FIG. 13B. The sensor portion 6520 corresponds to the sensor portion 104 illustrated in FIG. 1B and FIG. 1C, and can be formed using, for example, a sensor module or a package including the image sensor chip illustrated in FIG. 19A1 to FIG. 19B3. Note that the sensor portion 6520 is not necessarily provided. In that case, the camera 6507 preferably functions as the sensor portion 104 illustrated in FIG. 1A. This enables the electronic device 6500 to function as the display apparatus illustrated in FIG. 1A.

Figure 20B:
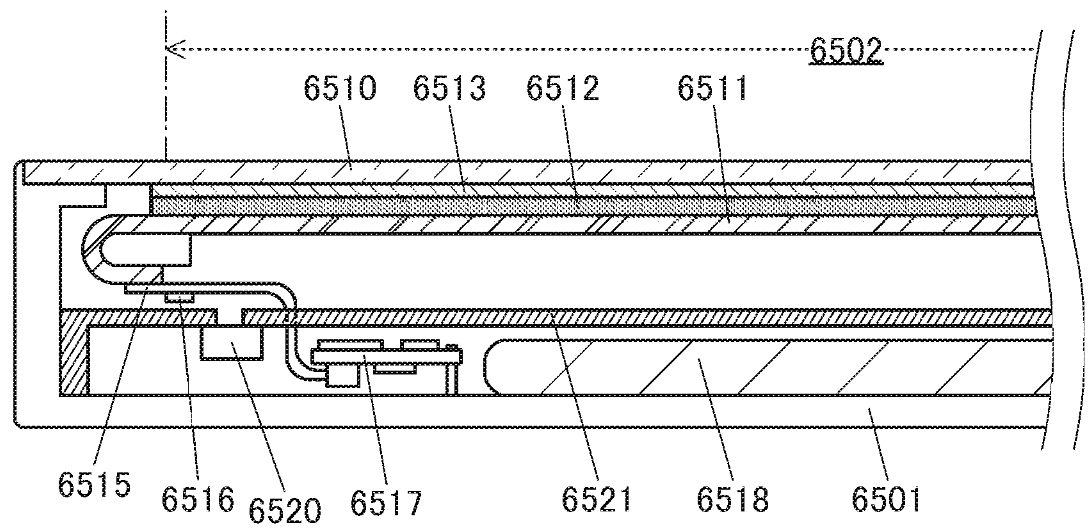

FIG. 20B is a schematic cross-sectional view including an end portion of the housing 6501 on the microphone 6506 side.

A protective member 6510 having a light-transmitting property is provided on the display surface side of the housing 6501. Note that the protective member 6510 corresponds to the protective member 105 illustrated in FIG. 1A to FIG. 1C, and the housing 6501 corresponds to the housing 103 illustrated in FIG. 1A to FIG. 1C.

A display panel 6511, an optical member 6512, a touch sensor panel 6513, a printed circuit board 6517, a battery 6518, a sensor portion 6520, a housing 6521, and the like are provided in a space surrounded by the housing 6501 and the protective member 6510. Here, the display panel 6511, the optical member 6512, and the touch sensor panel 6513 are placed separately from the printed circuit board 6517, the battery 6518, and the sensor portion 6520 with the housing 6521 therebetween. Note that the housing 6521 may be fixed to the housing 6501, or the housing 6521 may be unified with the housing 6501.

The display panel 6511, the optical member 6512, and the touch sensor panel 6513 are fixed to the protective member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517. Note that the FPC 6515 is connected to a terminal of the printed circuit board 6517 through an opening provided in the housing 6521. Similarly, the sensor portion 6520 is also connected to the terminal of the printed circuit board 6517 with an FPC (not illustrated).

A flexible display (a display having flexibility) of one embodiment of the present invention can be used as the display panel 6511. Thus, an extremely lightweight electronic device can be achieved. Since the display panel 6511 is extremely thin, the battery 6518 with high capacity can be mounted while an increase in thickness of the electronic device is suppressed. Moreover, part of the display panel 6511 is folded back so that a connection portion with the FPC 6515 is provided on the back side of the pixel portion, whereby an electronic device with a narrow bezel can be achieved.

The sensor portion 6520 is preferably provided to be fixed to the housing 6521. In this case, the position of the light-receiving portion of the sensor portion 6520 is fixed, enabling more accurate sensing. Note that the sensor portion 6520 may be fixed to the housing 6501 without provision of the housing 6521.

In the housing 6521, an opening is preferably formed to expose the light-receiving portion of the sensor portion 6520. In the case where a light-blocking member (e.g., the FPC 6515) is placed to overlap with the light-receiving portion of the sensor portion 6520, an opening is preferably provided in a region of the light-blocking member overlapping with the light-receiving portion. In this manner, infrared light entering from above the protective member 6510 needs to be received by the sensor portion 6520.

Figures 21A, 21B, 21C, 21D:
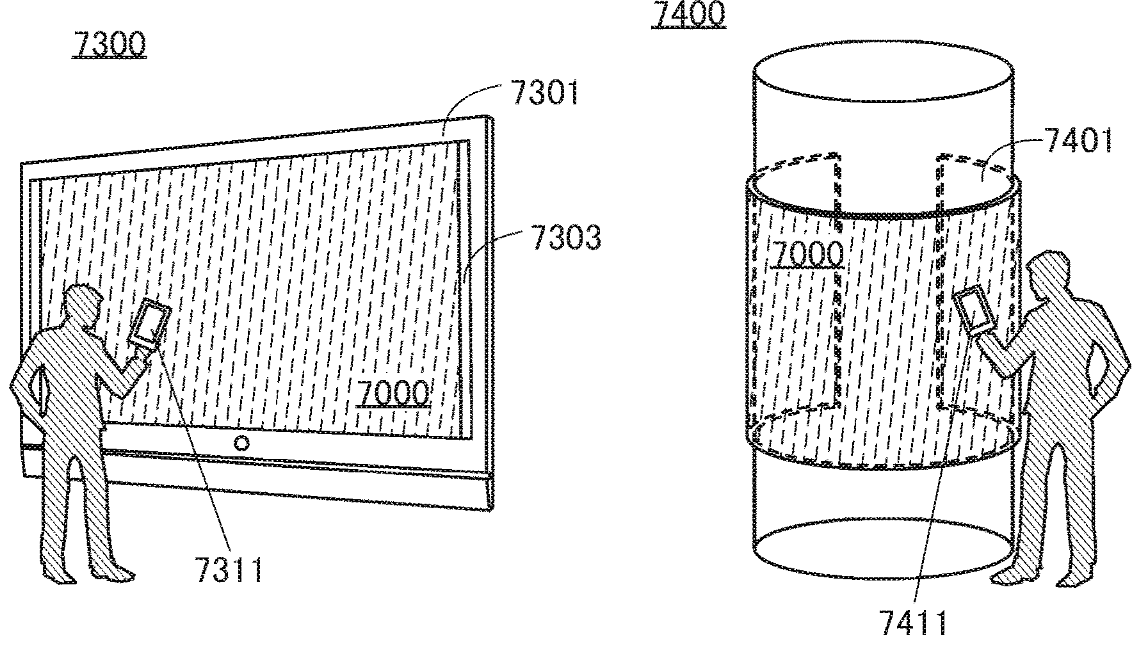
FIG. 21A to FIG. 21D are diagrams illustrating examples of an electronic device.

FIG. 21A illustrates an example of a television device. In a television device 7100, a display portion 7000 is incorporated in a housing 7101. Here, a structure where the housing 7101 is supported by a stand 7103 is illustrated.

The display apparatus of one embodiment of the present invention can be used for the display portion 7000.

Operation of the television device 7100 illustrated in FIG. 21A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure where a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 21B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

FIG. 21C and FIG. 21D illustrate examples of digital signage.

Digital signage 7300 illustrated in FIG. 21C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 21D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 21C and FIG. 21D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 21C and FIG. 21D, the digital signage 7300 or the digital signage 7400 is preferably capable of working with an information terminal 7311 or an information terminal 7411 such as a user's smartphone through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 22A:
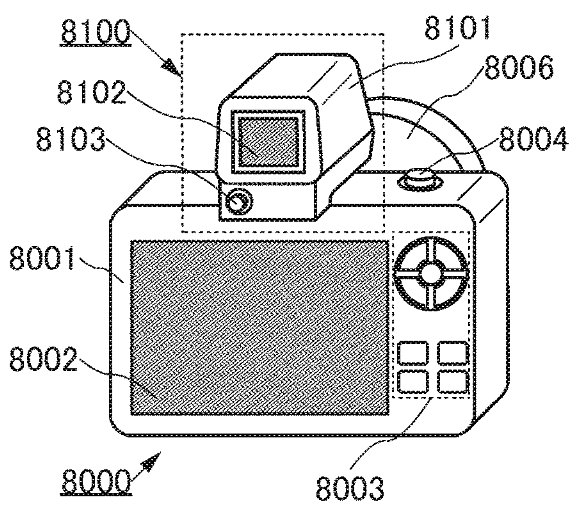
FIG. 22A to FIG. 22F are diagrams illustrating examples of an electronic device.

FIG. 22A is a diagram illustrating appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. The finder 8100 can display a video received from the camera 8000 and the like on the display portion 8102.

The button 8103 functions as a power supply button or the like.

The display apparatus of one embodiment of the present invention can be used for the display portion 8002 of the camera 8000 and the display portion 8102 of the finder 8100. Note that a finder may be incorporated in the camera 8000.

Figure 22B:
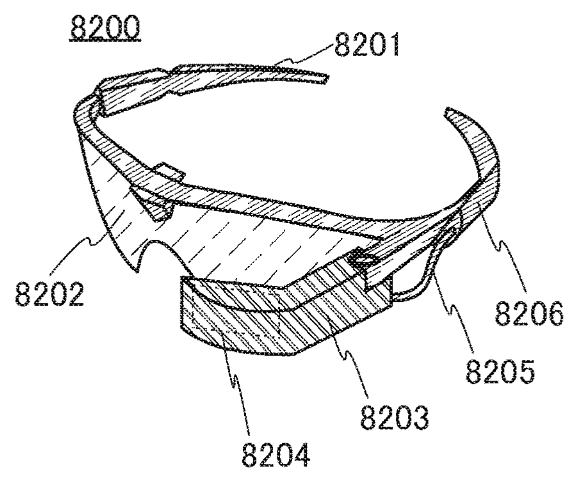

FIG. 22B is a diagram illustrating appearance of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with use of current flowing through the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

The display apparatus of one embodiment of the present invention can be used for the display portion 8204.

Figure 22C:
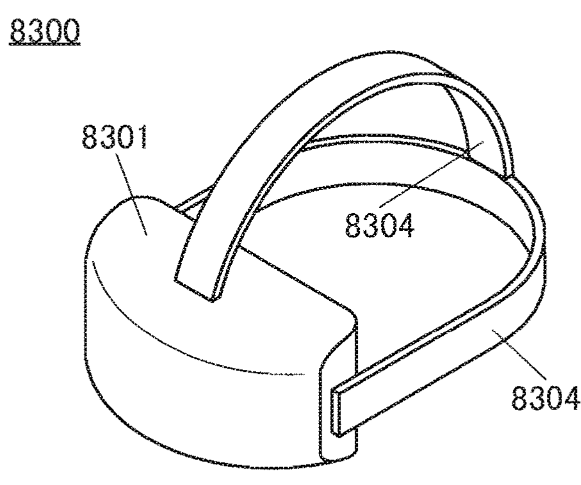
Figure 22D:
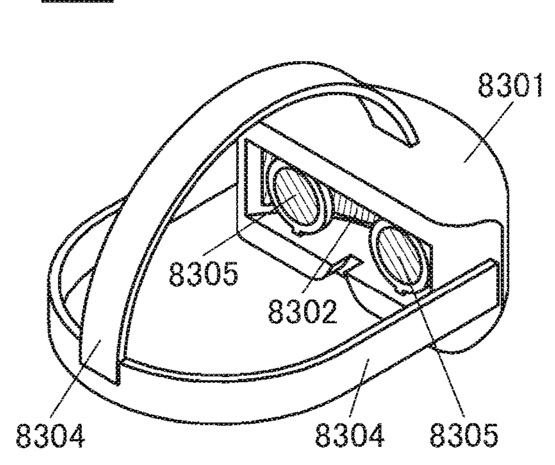
Figure 22E:
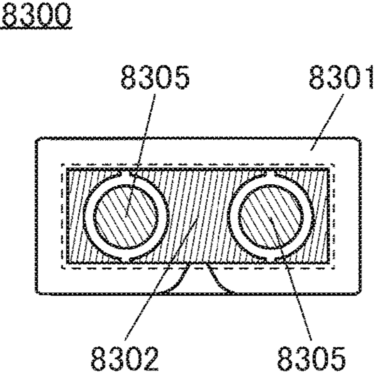

FIG. 22C to FIG. 22E are external views of a head-mounted display 8300. The head-mounted display 8300 includes a housing 8301, a display portion 8302, a fixing band 8304, and a pair of lenses 8305.

A user can see display on the display portion 8302 through the lenses 8305. Note that the display portion 8302 is preferably curved and placed because the user can feel a high sense of presence. Another image displayed in another region of the display portion 8302 is viewed through the lenses 8305, so that three-dimensional display using parallax or the like can be performed. Note that the number of display portions 8302 provided is not limited to one; two display portions 8302 may be provided so that one display portion is provided for one eye of the user.

The display apparatus of one embodiment of the present invention can be used for the display portion 8302. The display apparatus of one embodiment of the present invention achieves an extremely high resolution. For example, a pixel is not easily seen by the user even when the user sees display that is magnified by the use of the lenses 8305 as illustrated in FIG. 22E. In other words, a video with a strong sense of reality can be seen by the user with use of the display portion 8302.

Figure 22F:
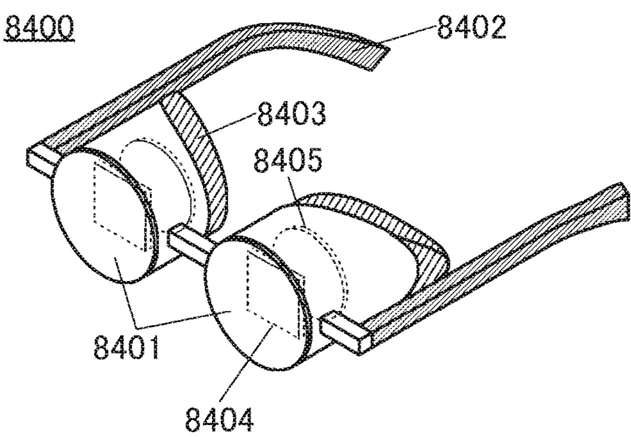

FIG. 22F is an external view of a goggles-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy images and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable for easy cleaning or replacement.

Electronic devices illustrated in FIG. 23A to FIG. 23F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 23A to FIG. 23F have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display apparatus of one embodiment of the present invention can be used for the display portion 9001.

The details of the electronic devices illustrated in FIG. 23A to FIG. 23F are described below.

FIG. 23A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 23A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed at the position where the information 9051 is displayed.

FIG. 23B is a perspective view illustrating a portable information terminal 9102. The portable information terminal 9102 has a function of displaying information on three or more surfaces of the display portion 9001. Here, information 9052, information 9053, and information 9054 are displayed on different surfaces. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

FIG. 23C is a perspective view illustrating a watch-type portable information terminal 9200. The portable information terminal 9200 can be used as a smartwatch (registered trademark), for example. The display portion 9001 is provided with its display surface curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIG. 23D to FIG. 23F are perspective views illustrating a foldable portable information terminal 9201. FIG. 23D is a perspective view of an opened state of the portable information terminal 9201, FIG. 23F is a perspective view of a folded state thereof, and FIG. 23E is a perspective view of a state in the middle of change from one of FIG. 23D and FIG. 23F to the other. The portable information terminal 9201 is highly portable in the folded state and is highly browsable in the unfolded state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

REFERENCE NUMERALS

20: light-emitting element, 21: lower electrode, 23: EL layer, 23*a*: EL layer, 23*b*: EL layer, 25: upper electrode, 100: display portion, 100A: display portion, 100B: display portion, 100C: display portion, 100D: display portion, 100E: display portion, 100F: display portion, 100G: display portion, 101: substrate, 102: substrate, 103: housing, 104: sensor portion, 105: protective member, 108: finger, 109: face, 110: light-emitting element, 110B: light-emitting element, 110G: light-emitting element, 110IR: light-emitting element, 110R: light-emitting element, 111B: pixel electrode, 111C: connection electrode, 111G: pixel electrode, 111IR: pixel electrode, 111R: pixel electrode, 112B: EL layer, 112Bf: EL film, 112G: EL layer, 112Gf: EL film, 112IR: EL layer, 112IRf: EL film, 112R: EL layer, 112Rf: EL film, 113: common electrode, 114: EL layer, 115B: optical adjustment layer, 115G: optical adjustment layer, 115IR: optical adjustment layer, 115R: optical adjustment layer, 121: protective layer, 122: gap, 130: connection portion, 131: insulating layer, 143*a*: resist mask, 143*b*: resist mask, 143*d*: resist mask, 143*e*: resist mask, 144*a*: sacrificial film, 144*b*: sacrificial film, 144*d*: sacrificial film, 145*a*: sacrificial layer, 145*b*: sacrificial layer, 145*c*: sacrificial layer, 145*d*: sacrificial layer, 146*a*: protective film, 146*b*: protective film, 146*d*: protective film, 147*a*: protective layer, 147*b*: protective layer, 147*d*: protective layer, 201: transistor, 202: transistor, 204: connection portion, 205: transistor, 209: transistor, 210: transistor, 211: insulating layer, 212: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 228: region, 231: semiconductor layer, 231*i*: channel formation region, 231*n*: low-resistance region, 240: capacitor, 241: conductive layer, 242: connection layer, 243: insulating layer, 245: conductive layer, 251: conductive layer, 252: conductive layer, 254: insulating layer, 255: insulating layer, 256: plug, 261: insulating layer, 262: insulating layer, 263: insulating layer, 264: insulating layer, 265: insulating layer, 271: plug, 274: plug, 274*a*: conductive layer, 274*b*: conductive layer, 280: display module, 281: display portion, 282: circuit portion, 283: pixel circuit portion, 283*a*: pixel circuit, 284: pixel portion, 284*a*: pixel, 285: terminal portion, 286: wiring portion, 290: FPC, 291: substrate, 292: substrate, 301: substrate, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 400A: display apparatus, 400B: display apparatus, 400C: display apparatus, 400D: display apparatus, 400E: display apparatus, 411*a*: pixel electrode, 411*b*: pixel electrode, 411*c*: pixel electrode, 416: protective layer, 416*a*: inorganic insulating layer, 416*b*: organic insulating layer, 416*c*: inorganic insulating layer, 417: light-blocking layer, 419: resin layer, 420: substrate, 421: insulating layer, 426*a*: optical adjustment layer, 426*b*: optical adjustment layer, 426*c*: optical adjustment layer, 426*d*: optical adjustment layer, 430*a*: light-emitting element, 430*b*: light-emitting element, 430*c*: light-emitting element, 430*d*: light-emitting element, 442: adhesive layer, 443: space, 451: substrate, 452: substrate, 453: substrate, 454: substrate, 455: adhesive layer, 462: display portion, 464: circuit, 465: wiring, 466: conductive layer, 472: FPC, 473: IC, 610: package substrate, 611: package substrate, 620: cover glass, 621: lens cover, 630: adhesive, 635: lens, 640: bump, 641: land, 650: image sensor chip, 651: image sensor chip, 660: electrode pad, 661: electrode pad, 670: wire, 671: wire, 690: IC chip, 4411: light-emitting layer, 4412: light-emitting layer, 4413: light-emitting layer, 4420: layer, 4420-1: layer, 4420-2: layer, 4430: layer, 4430-1: layer, 4430-2: layer, 6500: electronic device, 6501: housing, 6502: display portion, 6503: power button, 6504: button, 6505: speaker, 6506: microphone, 6507: camera, 6508: light source, 6510: protective member, 6511: display panel, 6512: optical member, 6513: touch sensor panel, 6515: FPC, 6516: IC, 6517: printed circuit board, 6518: battery, 6520: sensor portion, 6521: housing,

7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mount display, 8201: mounting portion, 8202: lens, 8203: main body, 8204: display portion, 8205: cable, 8206: battery, 8300: head-mount display, 8301: housing, 8302: display portion, 8304: fixing band, 8305: lens, 8400: head-mount display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display apparatus comprising:

a display portion comprising a first light-emitting element and a second light-emitting element; and a first sensor portion comprising a first light-receiving element, a second sensor portion comprising a second light-receiving element, wherein the first light-emitting element comprises a first electroluminescence (EL) layer, wherein the second light-emitting element comprises a second EL layer, wherein the first light-emitting element is configured to emit infrared light, wherein each of the first light-receiving element and the second light-receiving element is configured to detect infrared light, wherein the first light-receiving element is outside the display portion and on a rear surface side of the display portion, and wherein the second light-receiving element overlaps with the display portion and is on the rear surface side of the display portion.

2. The display apparatus according to claim 1, wherein the second light-emitting element is configured to emit light of red, green, or blue.

3. The display apparatus according to claim 1, wherein each of the first EL layer and the second EL layer comprises an organic film.

4. The display apparatus according to claim 1, wherein the distance between the first EL layer and the second EL layer is less than or equal to 3 μm.

5. The display apparatus according to claim 1, wherein the first EL layer and the second EL layer are formed by a photolithography method so that the distance between the first EL layer and the second EL layer is less than or equal to 3 μm.

6. A display apparatus comprising:

a display portion comprising a first light-emitting element and a second light-emitting element;

a sensor portion comprising a light-receiving element; and a protective member and a housing, wherein the first light-emitting element comprises a first electroluminescence (EL) layer, wherein the second light-emitting element comprises a second EL layer, wherein the first light-emitting element is configured to emit infrared light, wherein the light-receiving element is configured to detect infrared light, wherein the display portion and the sensor portion are placed in a region surrounded by the protective member and the housing, wherein the display portion and the sensor portion are placed over the housing, wherein the display portion comprises a first substrate and a second substrate, wherein the first substrate is placed between the housing and each of the first light-emitting element and the second light-emitting element, wherein the second substrate is placed between the protective member and each of the first light-emitting element and the second light-emitting element, and wherein the second substrate and the protective member each have a light-transmitting property.

7. A display apparatus comprising:

a display portion comprising a first light-emitting element and a second light-emitting element;

a sensor portion comprising a light-receiving element; and a protective member and a housing, wherein the first light-emitting element comprises a first electroluminescence (EL) layer, wherein the second light-emitting element comprises a second EL layer, wherein the first light-emitting element is configured to emit infrared light, wherein the light-receiving element is configured to detect infrared light, wherein the display portion and the sensor portion are placed in a region surrounded by the protective member and the housing, wherein the sensor portion is placed over the housing, and wherein the display portion is placed over the sensor portion.

* * * * *